US012707963B2

(12) United States Patent
Chou et al.

(10) Patent No.: US 12,707,963 B2
(45) Date of Patent: Aug. 11, 2026

(54) SEMICONDUCTOR DEVICES INCLUDING BACKSIDE CAPACITORS AND METHODS OF MANUFACTURE

(71) Applicant: Taiwan Semiconductor Manufacturing Co., Ltd., Hsinchu (TW)

(72) Inventors: Chih-Chao Chou, Hsinchu (TW); Yi-Hsun Chiu, Zhubei City (TW); Shang-wen Chang, Jhubei City (TW); Ching-Wei Tsai, Hsinchu (TW); Chih-Hao Wang, Baoshan Township (TW); Min Cao, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 1022 days.

(21) Appl. No.: 17/683,944

(22) Filed: Mar. 1, 2022

(65) Prior Publication Data

US 2023/0013764 A1 Jan. 19, 2023

Related U.S. Application Data

(60) Provisional application No. 63/222,767, filed on Jul. 16, 2021.

(51) Int. Cl.
*H10W 20/20* (2026.01)
*H10D 30/67* (2025.01)
(Continued)

(52) U.S. Cl.
CPC ...... *H10W 20/496* (2026.01); *H10D 30/6713* (2025.01); *H10D 30/6757* (2025.01);
(Continued)

(58) Field of Classification Search
CPC ............ H01L 23/5223; H01L 23/5226; H01L 23/5283; H01L 23/5286; H01L 21/76897;
(Continued)

(56) References Cited

U.S. PATENT DOCUMENTS

| | | | |
|---|---|---|---|
| 9,991,171 B1 | 6/2018 | Zhou | |
| 2004/0101663 A1* | 5/2004 | Agarwala | ......... H01L 23/53295 428/209 |

(Continued)

FOREIGN PATENT DOCUMENTS

| | | |
|---|---|---|
| TW | 202115849 A | 4/2021 |
| WO | 2021014258 A1 | 1/2021 |

*Primary Examiner* — Samuel Park
(74) *Attorney, Agent, or Firm* — Slater Matsil LLP

(57) ABSTRACT

Semiconductor devices including backside capacitors and methods of forming the same are disclosed. In an embodiment, a semiconductor device includes a first transistor structure; a front-side interconnect structure on a front-side of the first transistor structure, the front-side interconnect structure including a front-side conductive line; a backside interconnect structure on a backside of the first transistor structure, the backside interconnect structure including a backside conductive line, the backside conductive line having a line width greater than a line width of the front-side conductive line; and a first capacitor structure coupled to the backside interconnect structure.

20 Claims, 58 Drawing Sheets

(51) Int. Cl.
*H10D 62/10* (2025.01)
*H10D 84/01* (2025.01)
*H10D 84/03* (2025.01)
*H10W 20/40* (2026.01)
*H10W 20/41* (2026.01)
*H10W 20/42* (2026.01)

(52) U.S. Cl.
CPC ....... *H10D 62/118* (2025.01); *H10D 84/0128* (2025.01); *H10D 84/013* (2025.01); *H10D 84/0149* (2025.01); *H10D 84/038* (2025.01); *H10W 20/42* (2026.01); *H10W 20/435* (2026.01)

(58) Field of Classification Search
CPC ............ H01L 23/5383; H01L 23/5386; H10D 30/6713; H10D 30/6757; H10D 62/118; H10D 84/0128; H10D 84/013; H10D 84/0149; H10D 84/038; H10D 30/797; H10D 30/014; H10D 30/0198; H10D 30/43; H10D 30/6735; H10D 62/822; H10D 1/692; H10D 62/121; H10D 64/017; H10D 64/251; H10D 84/811; H10D 88/101; H10D 84/0167; H10D 84/0186; H10D 84/0193; B82Y 10/00; H10W 20/496; H10W 20/42; H10W 20/435; H10W 20/069; H10W 20/0696; H10W 20/427; H10W 20/481; H10W 70/611; H10W 70/65; H10W 70/685
See application file for complete search history.

(56) References Cited

U.S. PATENT DOCUMENTS

| | | | | |
|---|---|---|---|---|
| 2008/0179495 | A1* | 7/2008 | Shimizu ................ | H10F 39/813 257/E27.15 |
| 2013/0313412 | A1* | 11/2013 | Kurokawa ............. | H04N 23/73 250/208.2 |
| 2014/0339549 | A1* | 11/2014 | Yamazaki .............. | H10D 86/60 257/43 |
| 2015/0035103 | A1 | 2/2015 | Inoue | |
| 2015/0060968 | A1* | 3/2015 | Sa ........................ | H10F 39/199 257/292 |
| 2017/0084649 | A1* | 3/2017 | Ohmaru ............... | H04N 25/771 |
| 2017/0345854 | A1* | 11/2017 | Kwon .................. | H10F 39/802 |
| 2018/0315701 | A1* | 11/2018 | Zhang .................. | H01L 23/528 |
| 2020/0035560 | A1* | 1/2020 | Block .................. | H10D 84/038 |
| 2020/0294998 | A1 | 9/2020 | Lilak et al. | |
| 2020/0411636 | A1 | 12/2020 | Kao et al. | |
| 2022/0321794 | A1* | 10/2022 | Yoneda .................. | H04N 25/77 |
| 2022/0359646 | A1 | 11/2022 | Kao et al. | |

* cited by examiner

SEMICONDUCTOR DEVICES INCLUDING BACKSIDE CAPACITORS AND METHODS OF MANUFACTURE

CROSS-REFERENCE TO RELATED APPLICATIONS

This application claims the benefit of U.S. Provisional Application No. 63/222,767, filed on Jul. 16, 2021, which application is hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
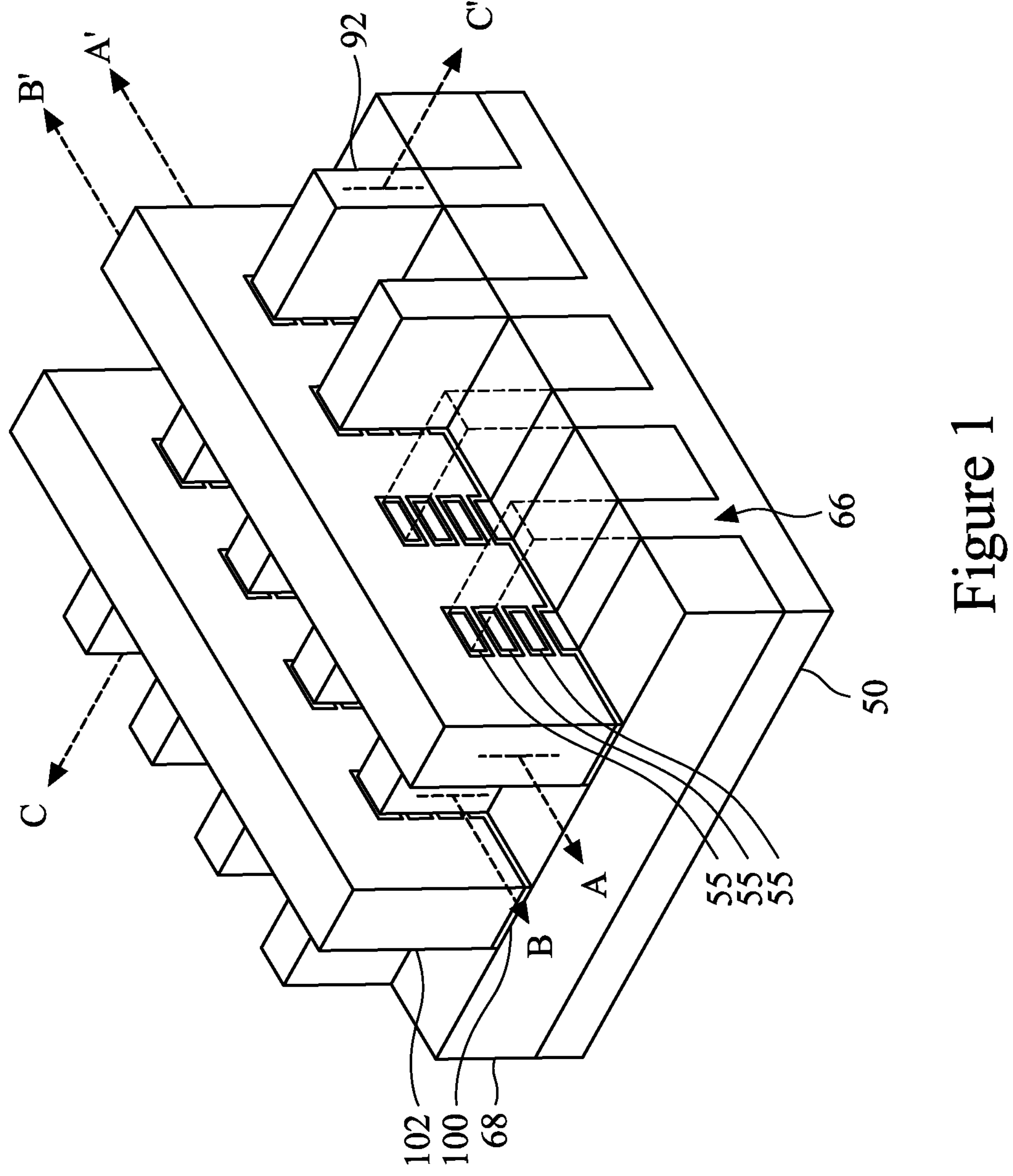
FIG. 1 illustrates an example of a nanostructure field-effect transistor (nano-FET) in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as “beneath,” “below,” “lower,” “above,” “upper” and the like, may be used herein for ease of description to describe one element or feature’s relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments provide methods of bonding capacitors to backsides of transistor structures, and semiconductor devices formed by the same. A front-side interconnect structure (also referred to as a back end of line (BEOL) interconnect structure) and a backside interconnect structure (also referred to as a buried power network (BPN)) may be formed on opposite sides of a transistor structure. A capacitor may be formed on a carrier substrate. The capacitor may then be bonded to the backside interconnect structure by a process such as hybrid bonding. Bonding the capacitor to the backside interconnect structure frees up area in the front-side interconnect structure, which may otherwise be used to form capacitors, and allows for capacitors having higher capacitance to be formed. Thus, large capacitors may be formed without an area penalty, and device performance may be improved.

Embodiments are described below in a particular context, namely, a die comprising nanostructure field effect transistors (nano-FETs). Various embodiments may be applied, however, to dies comprising other types of transistors (e.g., fin field effect transistors (FinFETs), planar transistors, or the like) in lieu of or in combination with the nano-FETs.

FIG. 1 illustrates an example of nano-FETs (e.g., nanowire FETs, nanosheet FETs (Nano-FETs), or the like) in a three-dimensional view, in accordance with some embodiments. The nano-FETs comprise nanostructures 55 (e.g., nanosheets, nanowires, or the like) over fins 66 on a substrate 50 (e.g., a semiconductor substrate). The nanostructures 55 act as channel regions for the nano-FETs. The nanostructures 55 may include materials suitable for forming channel regions in p-type transistors, n-type transistors, or the like. Isolation regions 68 are disposed between adjacent fins 66, which may protrude above and from between neighboring isolation regions 68. Although the isolation regions 68 are described and illustrated as being separate from the substrate 50, as used herein, the term “substrate” may refer to the semiconductor substrate alone or a combination of the semiconductor substrate and the isolation regions. Additionally, although bottom portions of the fins 66 are illustrated as being single, continuous materials with the substrate 50, the bottom portions of the fins 66 and/or the substrate 50 may comprise a single material or a plurality of materials. In this context, the fins 66 refer to the portion extending between the neighboring isolation regions 68.

Gate dielectric layers 100 are over top surfaces and sidewalls of the fins 66 and along top surfaces, sidewalls, and bottom surfaces of the nanostructures 55. Gate electrodes 102 are over the gate dielectric layers 100. Epitaxial source/drain regions 92 are disposed on the fins 66 on opposing sides of the gate dielectric layers 100 and the gate electrodes 102.

FIG. 1 further illustrates reference cross-sections that are used in later figures. Cross-section A-A' is along a longitudinal axis of a gate electrode 102 and in a direction, for example, perpendicular to the direction of current flow between epitaxial source/drain regions 92 of a nano-FET. Cross-section B-B' is parallel to cross-section A-A' and extends through the epitaxial source/drain regions 92 of the nano-FET. Cross-section C-C' is perpendicular to cross-section A-A' and is parallel to a longitudinal axis of a fin 66 of the nano-FET and in a direction of, for example, a current flow between the epitaxial source/drain regions 92 of the nano-FET. Subsequent figures refer to these reference cross-sections for clarity.

Some embodiments discussed herein are discussed in the context of nano-FETs formed using a gate-last process. In other embodiments, a gate-first process may be used. Also, some embodiments contemplate aspects which may be used in planar devices, such as planar FETs, or in fin field-effect transistors (FinFETs).

FIGS. 2 through 33 are cross-sectional views of intermediate stages in the manufacturing of nano-FETs, in accordance with some embodiments. FIGS. 2 through 5, 6A, 7A, 8A, 9A, 10A, 11A, 12A, 13A, 14A, 15A, 16A, 17A, 18A, 19A, 20A, 21A, 22A, 23A, 24A, and 25A illustrate reference cross-section A-A' illustrated in FIG. 1. FIGS. 6B, 7B, 8B, 9B, 10B, 11B, 12B, 12D, 13B, 14B, 15B, 16B, 17B, 18B, 19B, 20B, 21B, 22B, 23B, 24B, and 25B illustrate reference cross-section B-B' illustrated in FIG. 1. FIGS. 6C, 7C, 8C, 9C, 10C, 11C, 11D, 12C, 12E, 13C, 14C, 15C, 16C, 17C, 18C, 19C, 20C, 21C, 22C, 23C, 24C, 25C, 26, 27, 28, 29, 30A, 30B, 30C, 30D, 31, 32, and 33 illustrate reference cross-section C-C' illustrated in FIG. 1.

Figure 2:
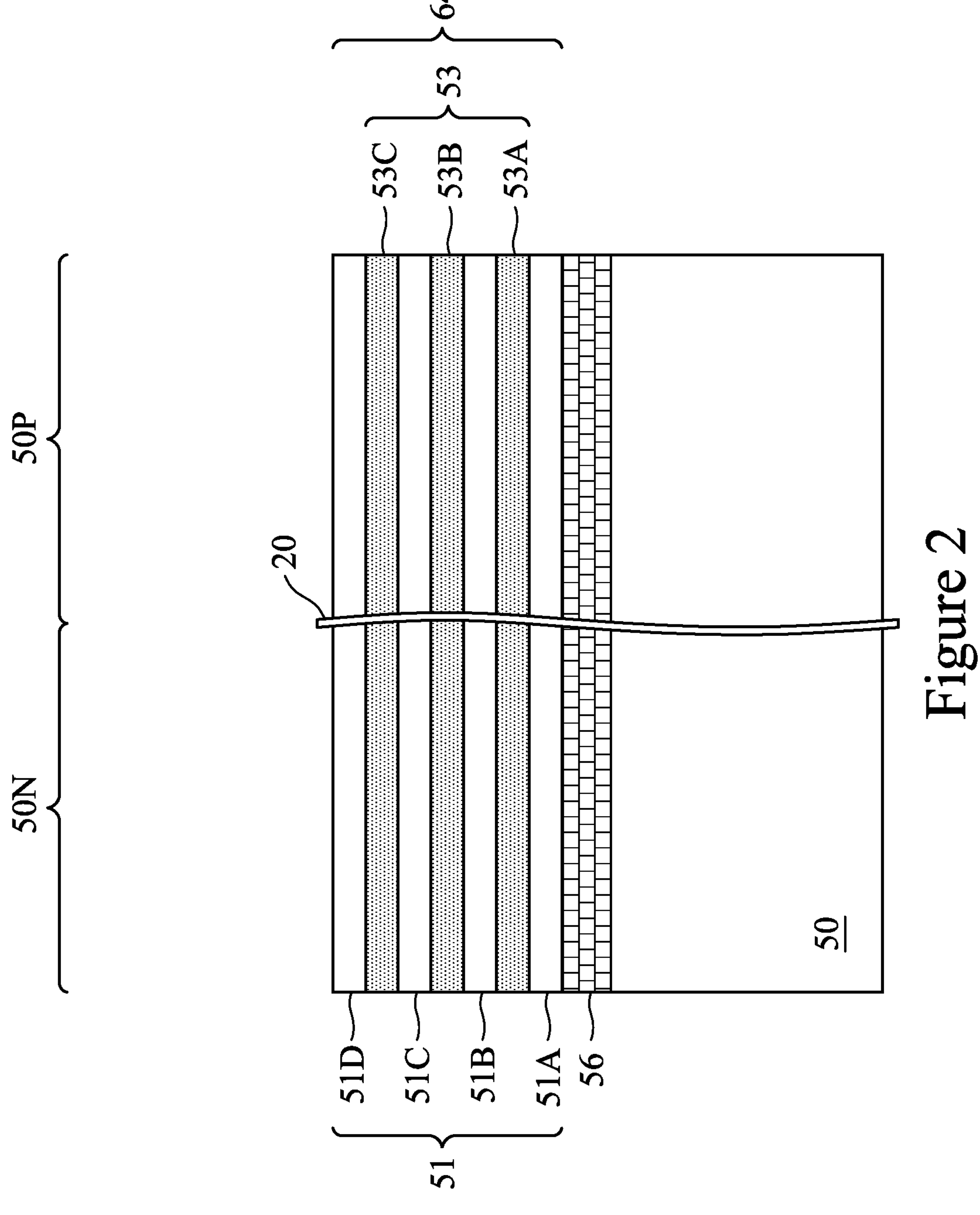
FIGS. 2, 3, 4, 5, 6A, 6B, 6C, 7A, 7B, 7C, 8A, 8B, 8C, 9A, 9B, 9C, 10A, 10B, 10C, 11A, 11B, 11C, 11D, 12A, 12B, 12C, 12D, 12E, 13A, 13B, 13C, 14A, 14B, 14C, 15A, 15B, 15C, 16A, 16B, 16C, 17A, 17B, 17C, 18A, 18B, 18C, 19A, 19B, 19C, 20A, 20B, 20C, 21A, 21B, 21C, 22A, 22B, 22C, 23A, 23B, 23C, 24A, 24B, 24C, 25A, 25B, 25C, 26, 27, 28, 29, 30A, 30B, 30C, 30D, 31, 32, and 33 are cross-sectional views of intermediate stages in the manufacturing of nano-FETs, in accordance with some embodiments.

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

The substrate 50 has an n-type region 50N and a p-type region 50P. The n-type region 50N can be for forming n-type devices, such as NMOS transistors, e.g., n-type nano-FETs. The p-type region 50P can be for forming p-type devices, such as PMOS transistors, e.g., p-type nano-FETs. The n-type region 50N may be physically separated from the p-type region 50P (as illustrated by divider 20), and any number of device features (e.g., other active devices, doped regions, isolation structures, or the like) may be disposed between the n-type region 50N and the p-type region 50P. Although one n-type region 50N and one p-type region 50P are illustrated, any number of n-type regions 50N and p-type regions 50P may be provided.

An etch stop layer 56 may be formed over the substrate 50. The etch stop layer 56 may be formed of a material having a high etch selectivity to the material of the substrate 50. The etch stop layer 56 may be included to protect overlying structures from subsequent processes used to remove the substrate 50 (discussed below with respect to FIGS. 24A through 24C. In some embodiments, the etch stop layer 56 may be formed of silicon germanium or the like. In some embodiments, the etch stop layer 56 may be formed of a dielectric material, such as phosphosilicate glass (PSG), borosilicate glass (BSG), boron-doped phosphosilicate glass (BPSG), undoped silicate glass (USG), silicon nitride, silicon oxide, silicon oxynitride, or the like. The etch stop layer 56 may be epitaxially grown using a process such as chemical vapor deposition (CVD), atomic layer deposition (ALD), vapor phase epitaxy (VPE), molecular beam epitaxy (MBE), or the like.

Further in FIG. 2, a multi-layer stack 64 is formed over the etch stop layer 56. The multi-layer stack 64 includes alternating layers of first semiconductor layers 51A-D (collectively referred to as first semiconductor layers 51) and second semiconductor layers 53A-C (collectively referred to as second semiconductor layers 53). For purposes of illustration and as discussed in greater detail below, the second semiconductor layers 53 will be removed and the first semiconductor layers 51 will be patterned to form channel regions of nano-FETs in the n-type region 50N and the p-type region 50P. In such embodiments, the channel regions in both the n-type region 50N and the p-type region 50P may have a same material composition (e.g., silicon, or the another semiconductor material) and may be formed simultaneously. FIG. 34 illustrates a structure resulting from such embodiments where the channel regions in both the p-type region 50P and the n-type region 50N comprise silicon, for example.

In some embodiments the second semiconductor layers 53 may be removed and the first semiconductor layers 51 may be patterned to form channel regions of nano-FETs in the n-type region 50N, and the first semiconductor layers 51 may be removed and the second semiconductor layers 53 may be patterned to form channel regions of nano-FETs in the p-type region 50P. In some embodiments the first semiconductor layers 51 may be removed and the second semiconductor layers 53 may be patterned to form channel regions of nano-FETs in the n-type region 50N, and the second semiconductor layers 53 may be removed and the first semiconductor layers 51 may be patterned to form channel regions of nano-FETs in the p-type region 50P. In some embodiments, the first semiconductor layers 51 may be removed and the second semiconductor layers 53 may be patterned to form channel regions of nano-FETs in both the n-type region 50N and the p-type region 50P.

The multi-layer stack 64 is illustrated as including four layers of the first semiconductor layers 51 and three layers of the second semiconductor layers 53 for illustrative purposes. In some embodiments, the multi-layer stack 64 may include any number of the first semiconductor layers 51 and the second semiconductor layers 53. Each of the layers of the multi-layer stack 64 may be epitaxially grown using a process such as CVD, ALD, VPE, MBE, or the like. In some embodiments, the first semiconductor layers 51 may be formed of a first semiconductor material, such as silicon, silicon carbide, or the like, and the second semiconductor layers 53 may be formed of a second semiconductor material, such as silicon germanium or the like. The multi-layer stack 64 is illustrated as having a bottommost first semiconductor layer 51 formed of the first semiconductor material for illustrative purposes. In some embodiments, the multi-layer stack 64 may be formed having a bottommost second semiconductor layer 53 formed of the second semiconductor material.

The first semiconductor materials and the second semiconductor materials may be materials having a high etch selectivity to one another. As such, the second semiconductor layers 53 of the second semiconductor material may be removed without significantly removing the first semiconductor layers 51 of the first semiconductor material. This allows the first semiconductor layers 51 to be patterned to form channel regions of nano-FETs. Similarly, in embodiments in which the first semiconductor layers 51 are removed and the second semiconductor layers 53 are patterned to form channel regions, the first semiconductor layers 51 of the first semiconductor material may be removed without significantly removing the second semiconductor layers 53 of the second semiconductor material. This allows the second semiconductor layers 53 to be patterned to form channel regions of nano-FETs.

Figure 3:
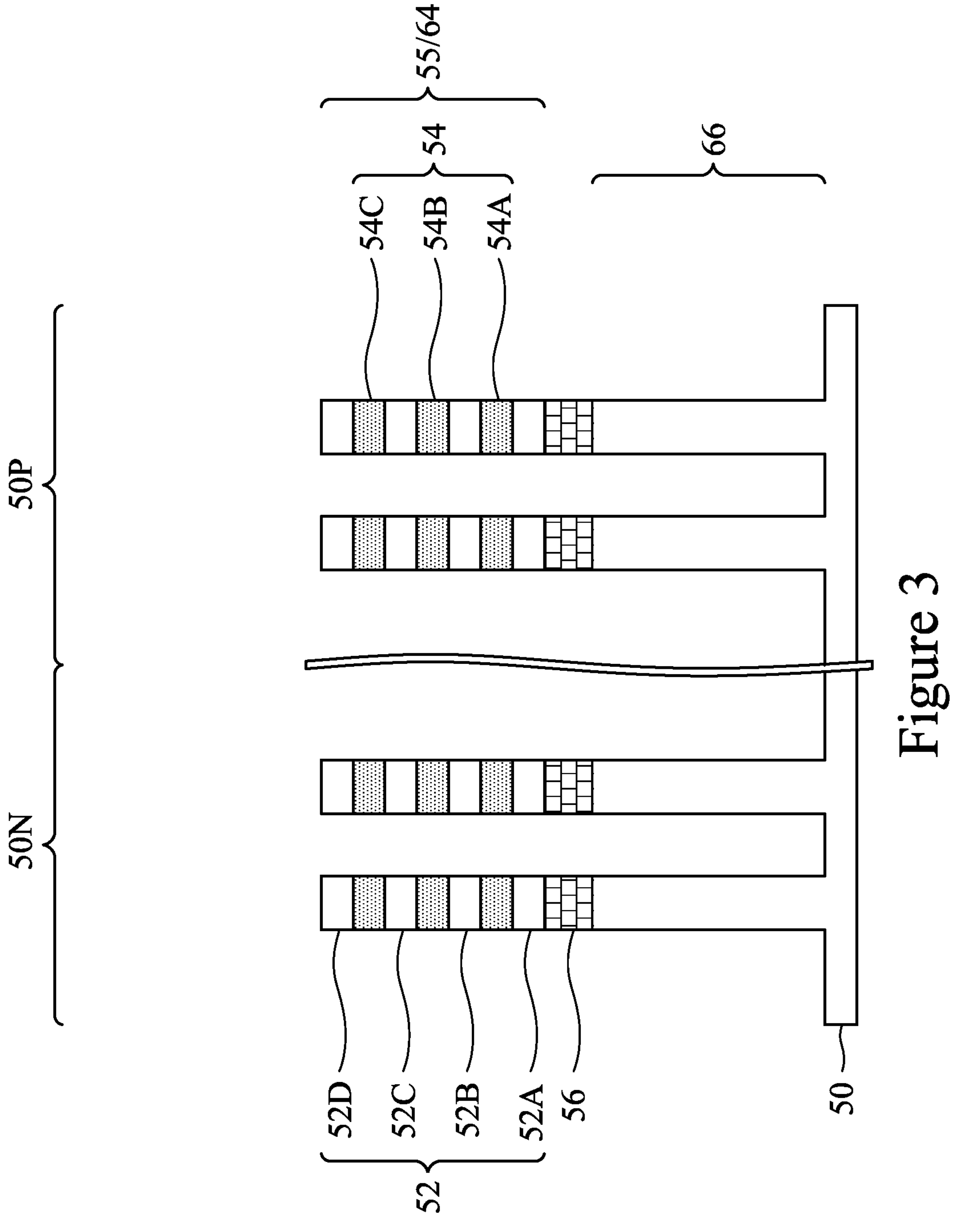

In FIG. 3, fins 66 are formed in and/or on the substrate 50 and nanostructures 55 are formed in the multi-layer stack 64. In some embodiments, the nanostructures 55 and the fins 66 may be formed in the multi-layer stack 64 and the substrate 50, respectively, by etching trenches in the multi-layer stack 64, the etch stop layer 56, and the substrate 50. The etching may be any acceptable etch process, such as a reactive ion etching (RIE), neutral beam etching (NBE), the like, or a combination thereof. The etching may be anisotropic. Forming the nanostructures 55 by etching the multi-layer stack 64 may define first nanostructures 52A-D (collectively referred to as first nanostructures 52) from the first semiconductor layers 51 and define second nanostructures 54A-C (collectively referred to as second nanostructures 54) from the second semiconductor layers 53. The first nanostructures 52 and the second nanostructures 54 may be collectively referred to as the nanostructures 55.

The fins 66 and the nanostructures 55 may be patterned by any suitable method. For example, the fins 66 and the nanostructures 55 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins 66 and the nanostructures 55.

FIG. 3 illustrates the fins 66 in the n-type region 50N and the p-type region 50P as having substantially equal widths for illustrative purposes. In some embodiments, widths of the fins 66 in the n-type region 50N may be greater than or less than widths of the fins 66 in the p-type region 50P. Further, while each of the fins 66 and the nanostructures 55 are illustrated as having consistent widths throughout, in some embodiments, the fins 66 and/or the nanostructures 55 may have tapered sidewalls. As such, a width of each of the fins 66 and/or the nanostructures 55 may continuously increase in a direction towards the substrate 50. In such embodiments, each of the nanostructures 55 in a vertical stack may have a different width and may be trapezoidal in shape.

Figure 4:
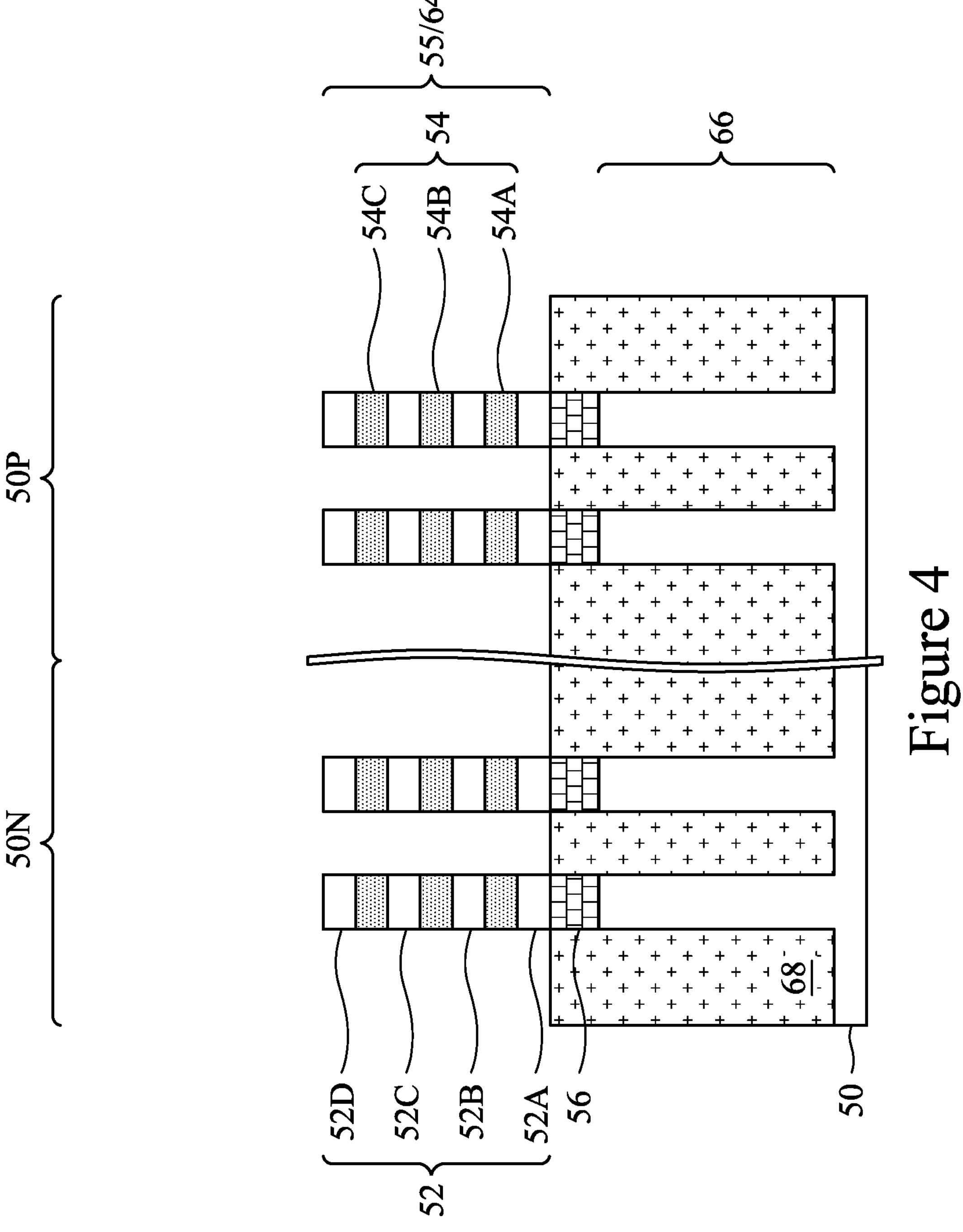

In FIG. 4, shallow trench isolation (STI) regions 68 are formed adjacent the fins 66. The STI regions 68 may be formed by depositing an insulation material over the substrate 50, the fins 66, the etch stop layer 56, and nanostructures 55, and between adjacent ones of the fins 66. The insulation material may be an oxide (such as silicon oxide), a nitride, the like, or a combination thereof, and may be formed by high-density plasma CVD (HDP-CVD), flowable CVD (FCVD), the like, or a combination thereof. Other insulation materials formed by any acceptable process may be used. In the illustrated embodiment, the insulation material is silicon oxide formed by an FCVD process. An anneal process may be performed once the insulation material is formed. In some embodiments, the insulation material is formed such that excess insulation material covers the nanostructures 55. Although the insulation material is illustrated as a single layer, some embodiments may utilize multiple layers. For example, in some embodiments a liner (not separately illustrated) may be formed along surfaces of the substrate 50, the fins 66, the etch stop layer 56, and the nanostructures 55. Thereafter, a fill material, such as those discussed above, may be formed over the liner.

A removal process is then applied to the insulation material to remove excess insulation material over the nanostructures 55. In some embodiments, a planarization process such as a chemical mechanical polish (CMP), an etch-back process, combinations thereof, or the like may be utilized. The planarization process exposes the nanostructures 55, such that top surfaces of the nanostructures 55 and the insulation material are level after the planarization process is complete.

The insulation material is then recessed to form the STI regions 68. The insulation material is recessed such that the nanostructures 55 in the n-type region 50N and the p-type region 50P protrude from between neighboring ones of the STI regions 68. Top surfaces of the STI regions 68 may have flat surfaces as illustrated, convex surfaces, concave surfaces (such as dishing), or a combination thereof. The top surfaces of the STI regions 68 may be formed flat, convex, and/or concave by an appropriate etch. The STI regions 68 may be recessed using an acceptable etching process, such as one that is selective to the material of the insulation material (e.g., etches the material of the insulation material at a faster rate than the material of the nanostructures 55). For example, an oxide removal using dilute hydrofluoric (dHF) acid may be used. As illustrated in FIG. 4, top surfaces of the STI regions 68 may be level with top surfaces of the etch stop layer 56. However, in some embodiments, the top surfaces of the STI regions 68 may be disposed above or below the top surfaces of the etch stop layer 56.

The process described above with respect to FIGS. 2 through 4 is just one example of how the fins 66 and the nanostructures 55 may be formed. In some embodiments, the fins 66 and/or the nanostructures 55 may be formed using a mask and epitaxial growth processes. For example, a dielectric layer may be formed over a top surface of the substrate 50, and trenches may be etched through the dielectric layer to expose the underlying substrate 50. Epitaxial structures may be epitaxially grown in the trenches, and the dielectric layer may be recessed such that the epitaxial structures protrude from the dielectric layer to form the fins 66, the etch stop layer 56, and/or the nanostructures 55. The epitaxial structures may comprise alternating layers of the semiconductor materials discussed above, such as the first semiconductor materials and the second semiconductor materials. In some embodiments where epitaxial structures are epitaxially grown, the epitaxially grown materials may be in situ doped during growth, which may obviate prior and/or subsequent implantations. In some embodiments, in situ and implantation doping may be used together.

Additionally, the first semiconductor layers 51 (and resulting first nanostructures 52) and the second semiconductor layers 53 (and resulting second nanostructures 54) are illustrated and discussed herein as comprising the same materials in the p-type region 50P and the n-type region 50N for illustrative purposes only. As such, in some embodiments one or both of the first semiconductor layers 51 and the second semiconductor layers 53 may be different materials or formed in a different order in the p-type region 50P and the n-type region 50N.

Further in FIG. 4, appropriate wells (not separately illustrated) may be formed in the fins 66, the nanostructures 55, and/or the STI regions 68. In embodiments with different well types, different implant steps for the n-type region 50N and the p-type region 50P may be achieved using a photoresist or other masks (not separately illustrated). For example, a photoresist may be formed over the fins 66 and the STI regions 68 in the n-type region 50N and the p-type region 50P. The photoresist is patterned to expose the p-type region 50P. The photoresist may be formed by using a spin-on technique and may be patterned using acceptable photolithography techniques. Once the photoresist is patterned, an n-type impurity implant is performed in the p-type region 50P, and the photoresist may act as a mask to prevent n-type impurities from being implanted into the n-type region 50N. The n-type impurities may be phosphorus, arsenic, antimony, or the like implanted in the region to a concentration in a range from about $10^{13}$ atoms/$cm^3$ to about $10^{14}$ atoms/$cm^3$. After the implant, the photoresist is removed, such as by an acceptable ashing process.

Following or prior to the implanting of the p-type region 50P, a photoresist or other masks (not separately illustrated) is formed over the fins 66, the nanostructures 55, and the STI regions 68 in the p-type region 50P and the n-type region 50N. The photoresist is patterned to expose the n-type region 50N. The photoresist may be formed by using a spin-on technique and may be patterned using acceptable photolithography techniques. Once the photoresist is patterned, a p-type impurity implant may be performed in the n-type region 50N, and the photoresist may act as a mask to prevent p-type impurities from being implanted into the p-type region 50P. The p-type impurities may be boron, boron fluoride, indium, or the like implanted in the region to a concentration in a range from about $10^{13}$ atoms/$cm^3$ to about $10^{14}$ atoms/$cm^3$. After the implant, the photoresist may be removed, such as by an acceptable ashing process.

After the implants of the n-type region 50N and the p-type region 50P, an anneal may be performed to repair implant damage and to activate the p-type and/or n-type impurities that were implanted. In some embodiments, the grown materials of epitaxial fins may be in situ doped during growth, which may obviate the implantations. In some embodiments, in situ and implantation doping may be used together.

Figure 5:
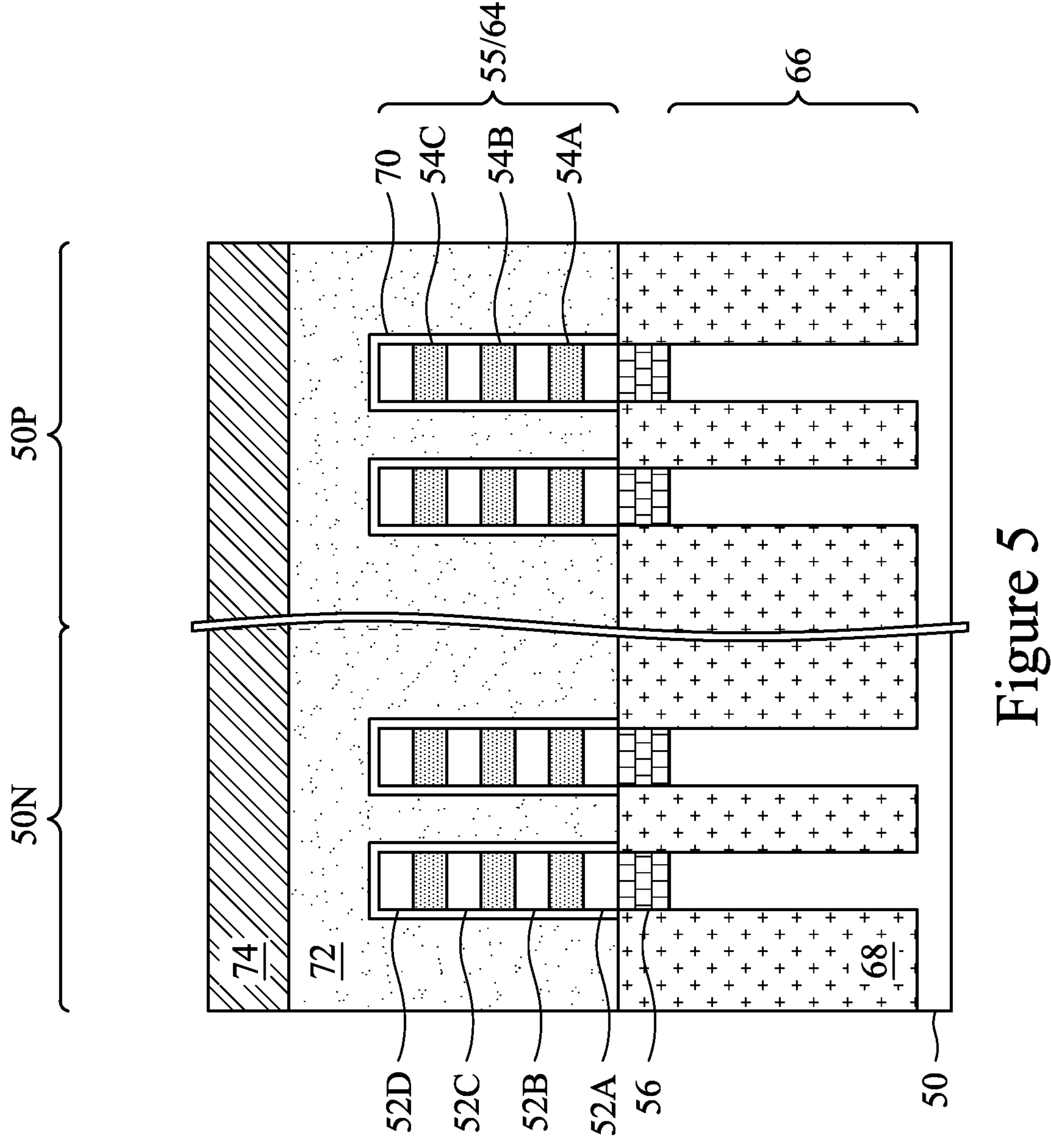

In FIG. 5, a dummy dielectric layer 70 is formed on the fins 66 and/or the nanostructures 55. The dummy dielectric layer 70 may be, for example, silicon oxide, silicon nitride, a combination thereof, or the like. The dummy dielectric layer 70 may be deposited or thermally grown according to acceptable techniques.

A dummy gate layer 72 is formed over the dummy dielectric layer 70, and a mask layer 74 is formed over the dummy gate layer 72. The dummy gate layer 72 may be deposited over the dummy dielectric layer 70 and then planarized, such as by a CMP. The dummy gate layer 72 may be a conductive or non-conductive material and may be selected from a group including amorphous silicon, polycrystalline-silicon (polysilicon), poly-crystalline silicon-germanium (poly-SiGe), metallic nitrides, metallic silicides, metallic oxides, and metals. The dummy gate layer 72 may be deposited by physical vapor deposition (PVD), CVD, sputter deposition, or other techniques for depositing the selected material. The dummy gate layer 72 may be made of other materials that have a high etching selectivity from the etching of the STI regions 68.

The mask layer 74 may be deposited over the dummy gate layer 72. The mask layer 74 may include, for example, silicon nitride, silicon oxynitride, or the like. In the illustrated embodiment, a single dummy gate layer 72 and a single mask layer 74 are formed across the n-type region 50N and the p-type region 50P. It is noted that the dummy dielectric layer 70 is shown covering only the fins 66 and the nanostructures 55 for illustrative purposes only. In some embodiments, the dummy dielectric layer 70 may be deposited such that the dummy dielectric layer 70 covers the STI regions 68. As such, the dummy dielectric layer 70 may extend between the dummy gate layer 72 and the STI regions 68.

Figure 6B:
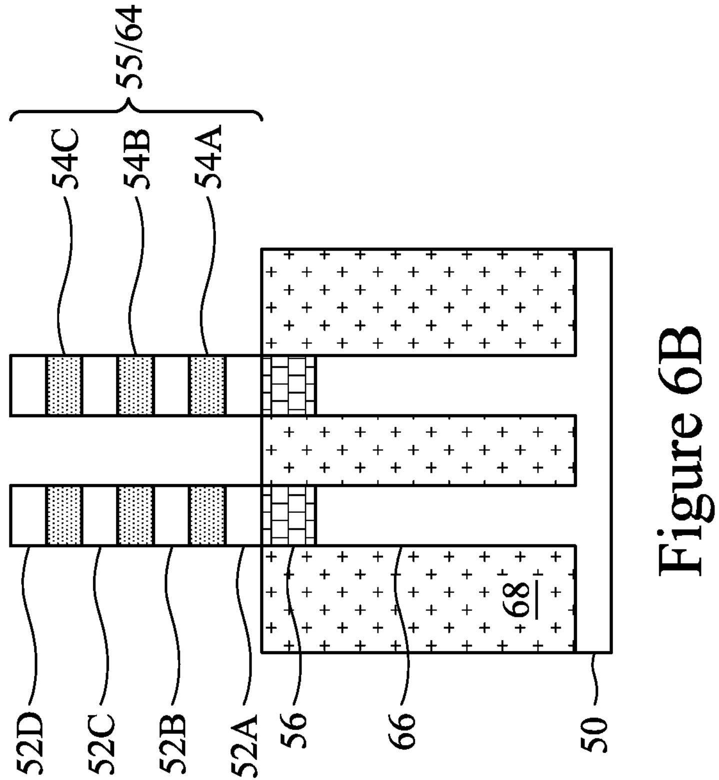
Figure 6A:
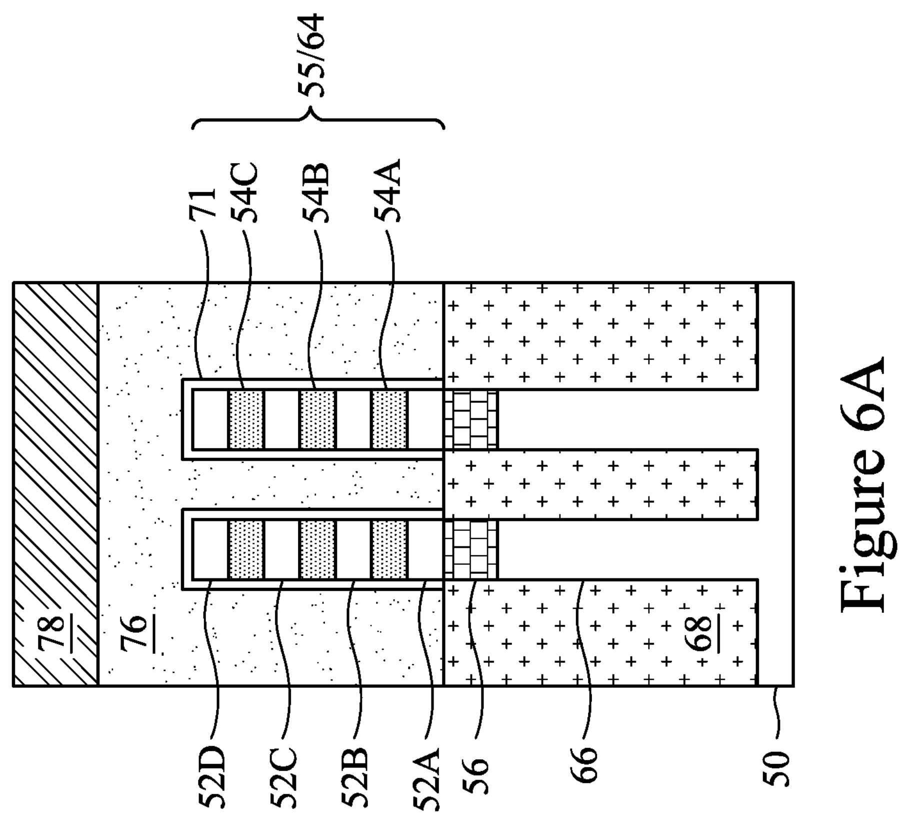
Figure 6C:
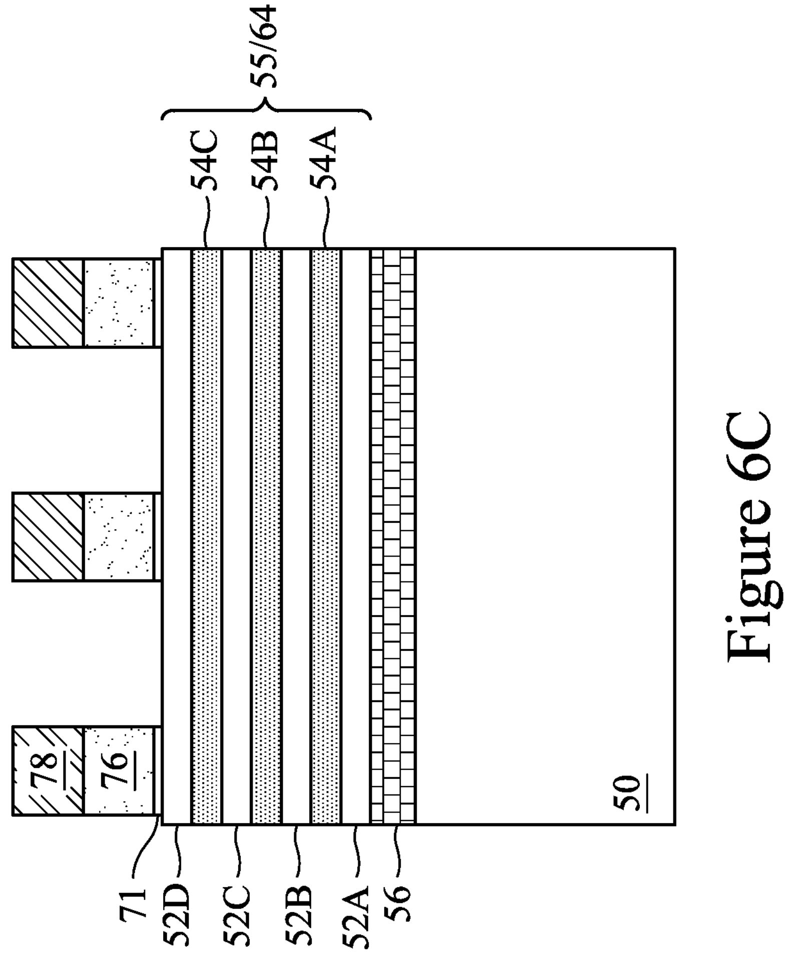

FIGS. 6A through 33 illustrate various additional steps in the manufacturing of embodiment devices. FIGS. 6A through 33 illustrate features in either the n-type region 50N or the p-type region 50P. In FIGS. 6A through 6C, the mask layer 74 (see FIG. 5) may be patterned using acceptable photolithography and etching techniques to form masks 78. The pattern of the masks 78 then may be transferred to the dummy gate layer 72 and to the dummy dielectric layer 70 to form dummy gates 76 and dummy gate dielectrics 71, respectively. The dummy gates 76 cover respective channel regions of the nanostructures 55. The pattern of the masks 78 may be used to physically separate each of the dummy gates 76 from adjacent dummy gates 76. The dummy gates 76 may have a lengthwise direction perpendicular to the lengthwise direction of respective fins 66.

Figure 7B:
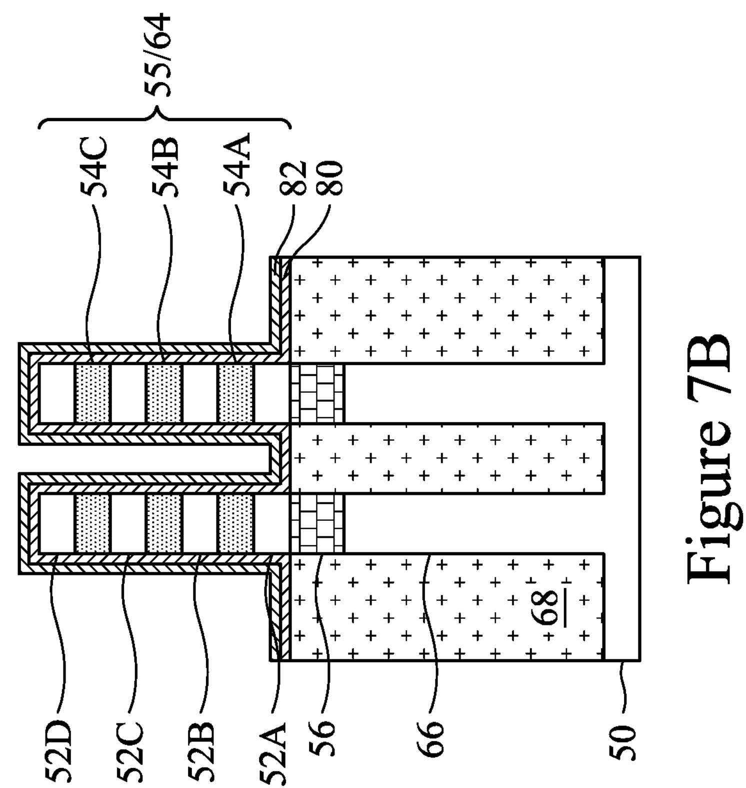
Figure 7A:
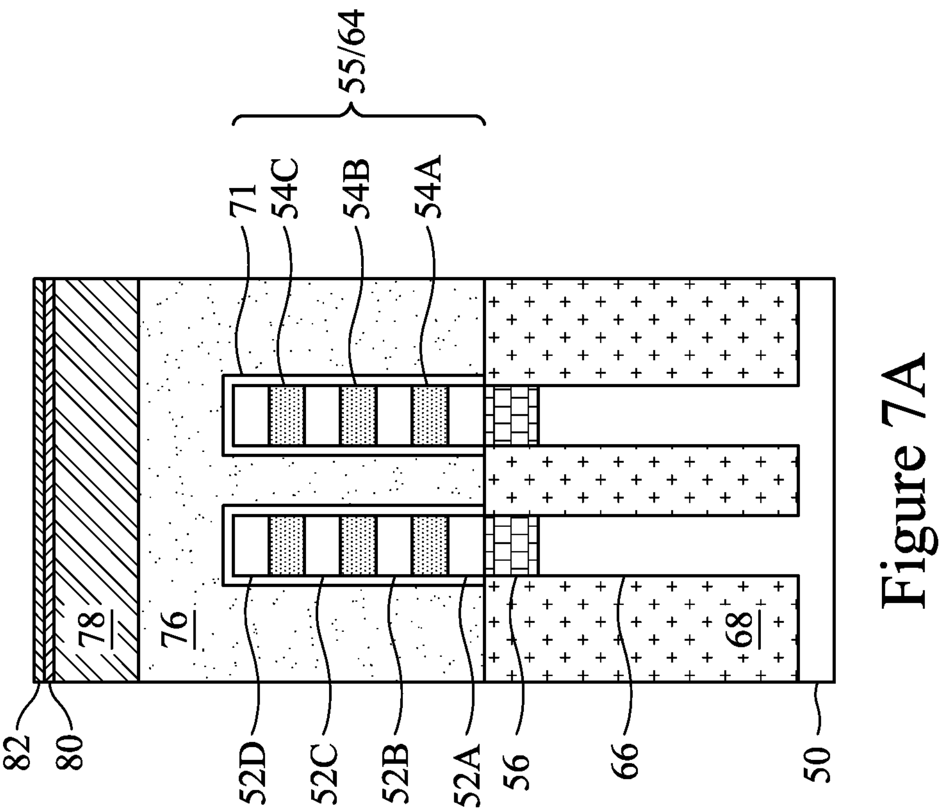
Figure 7C:
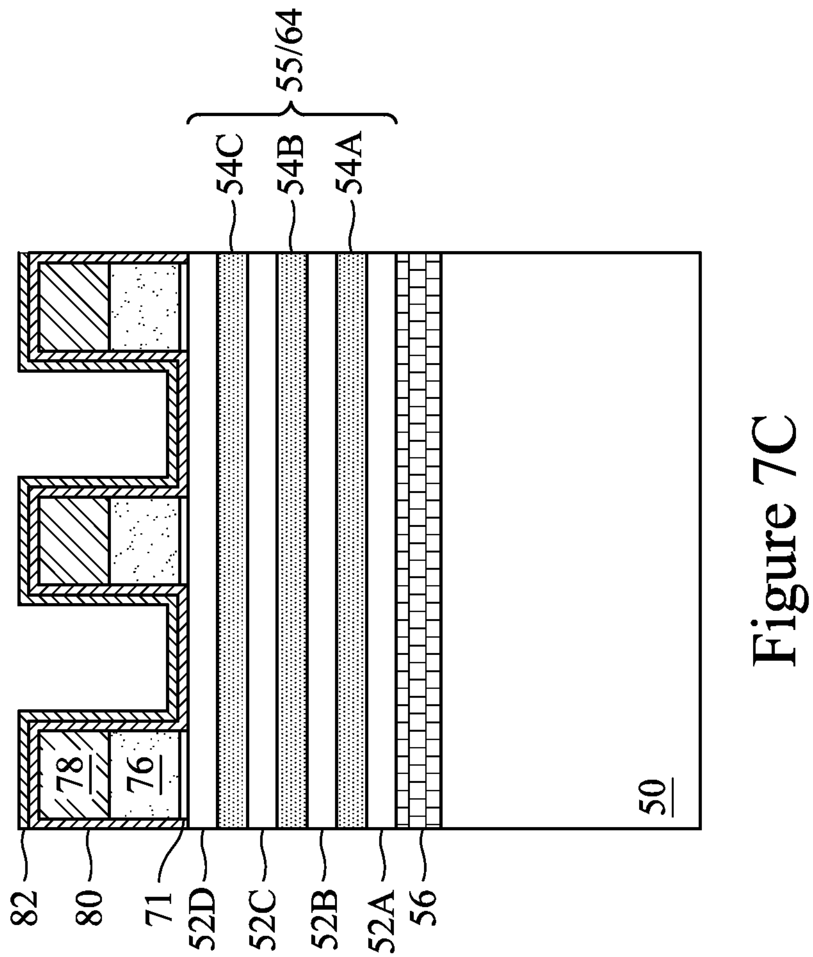

In FIGS. 7A through 7C, a first spacer layer 80 and a second spacer layer 82 are formed over the structures illustrated in FIGS. 6A through 6C, respectively. The first spacer layer 80 and the second spacer layer 82 will be subsequently patterned to act as spacers for forming self-aligned source/drain regions. In FIGS. 7A through 7C, the first spacer layer 80 is formed on top surfaces of the STI regions 68; top surfaces and sidewalls of the nanostructures 55 and the masks 78; and sidewalls of the dummy gates 76 and the dummy gate dielectrics 71. The second spacer layer 82 is deposited over the first spacer layer 80. The first spacer layer 80 may be formed of silicon oxide, silicon nitride, silicon oxynitride, or the like, using techniques such as thermal oxidation or deposited by CVD, ALD, or the like. The second spacer layer 82 may be formed of a material having a different etch rate than the material of the first spacer layer 80, such as silicon oxide, silicon nitride, silicon oxynitride, or the like, and may be deposited by CVD, ALD, or the like.

After the first spacer layer 80 is formed and prior to forming the second spacer layer 82, implants for lightly doped source/drain (LDD) regions (not separately illustrated) may be performed. In embodiments with different device types, similar to the implants discussed above in FIG. 4, a mask, such as a photoresist, may be formed over the n-type region 50N, while exposing the p-type region 50P, and appropriate type (e.g., p-type) impurities may be implanted into the exposed fins 66 and the nanostructures 55 in the p-type region 50P. The mask may then be removed. Subsequently, a mask, such as a photoresist, may be formed over the p-type region 50P while exposing the n-type region 50N, and appropriate type impurities (e.g., n-type) may be implanted into the exposed fins 66 and the nanostructures 55 in the n-type region 50N. The mask may then be removed. The n-type impurities may be the any of the n-type impurities previously discussed, and the p-type impurities may be the any of the p-type impurities previously discussed. The lightly doped source/drain regions may have a concentration of impurities in a range from about $1\times10^{15}$ atoms/cm$^3$ to about $1\times10^{19}$ atoms/cm$^3$. An anneal may be used to repair implant damage and to activate the implanted impurities.

Figure 8B:
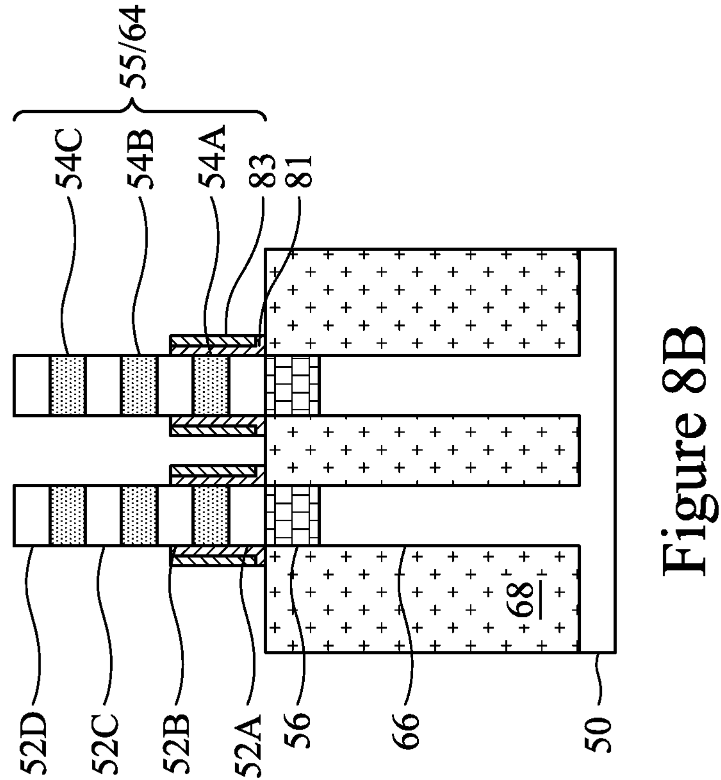
Figure 8A:
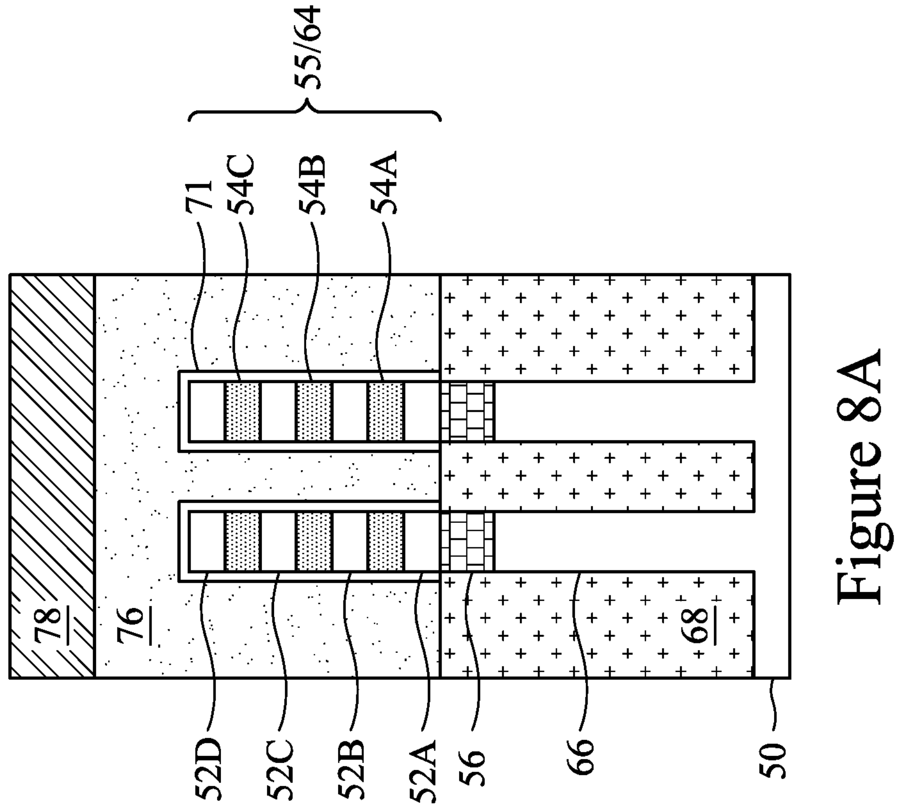
Figure 8C:
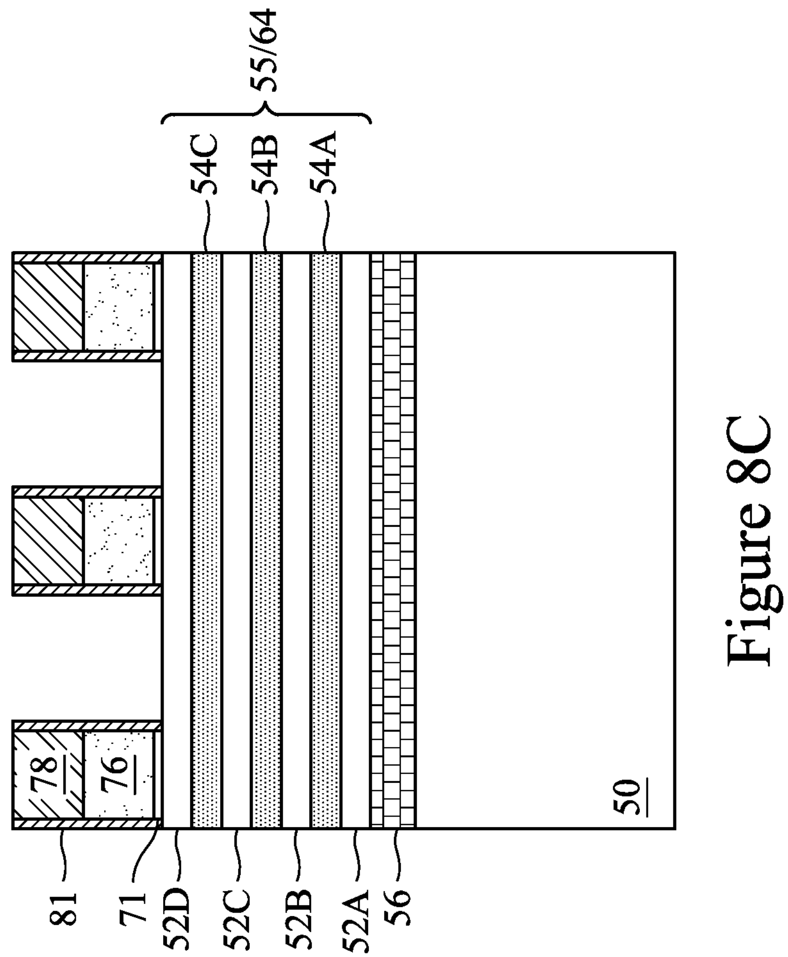

In FIGS. 8A through 8C, the first spacer layer 80 and the second spacer layer 82 are etched to form first spacers 81 and second spacers 83. As will be discussed in greater detail below, the first spacers 81 and the second spacers 83 act to self-align subsequently formed source/drain regions, as well as to protect sidewalls of the fins 66 and/or nanostructure 55 during subsequent processing. The first spacer layer 80 and the second spacer layer 82 may be etched using a suitable etching process, such as an isotropic etching process (e.g., a wet etching process), an anisotropic etching process (e.g., a dry etching process), or the like. In some embodiments, the material of the second spacer layer 82 has a different etch rate than the material of the first spacer layer 80, such that the first spacer layer 80 may act as an etch stop layer when patterning the second spacer layer 82 and the second spacer layer 82 may act as a mask when patterning the first spacer layer 80. For example, the second spacer layer 82 may be etched using an anisotropic etch process wherein the first spacer layer 80 acts as an etch stop layer. Remaining portions of the second spacer layer 82 form the second spacers 83 as illustrated in FIG. 8B. Thereafter, the second spacers 83 acts as a mask while etching exposed portions of the first spacer layer 80, forming the first spacers 81, as illustrated in FIGS. 8B and 8C.

As illustrated in FIG. 8B, the first spacers 81 and the second spacers 83 are disposed on sidewalls of the nanostructures 55. As illustrated in FIG. 8C, in some embodiments, the second spacer layer 82 may be removed from over the first spacer layer 80 adjacent the masks 78, the dummy gates 76, and the dummy gate dielectrics 71, and the first spacers 81 are disposed on sidewalls of the masks 78, the dummy gates 76, and the dummy gate dielectrics 71. In other embodiments, a portion of the second spacer layer 82 may remain over the first spacer layer 80 adjacent the masks 78, the dummy gates 76, and the dummy gate dielectrics 71.

It is noted that the above disclosure generally describes a process of forming spacers and LDD regions. Other processes and sequences may be used. For example, fewer or additional spacers may be utilized, different sequence of steps may be utilized (e.g., the first spacers 81 may be patterned prior to depositing the second spacer layer 82), additional spacers may be formed and removed, and/or the like. Furthermore, the n-type and p-type devices may be formed using different structures and steps.

Figure 9B:
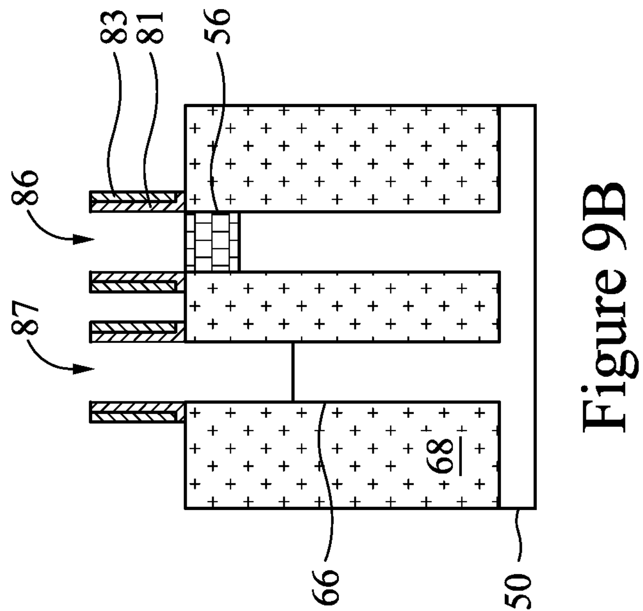
Figure 9A:
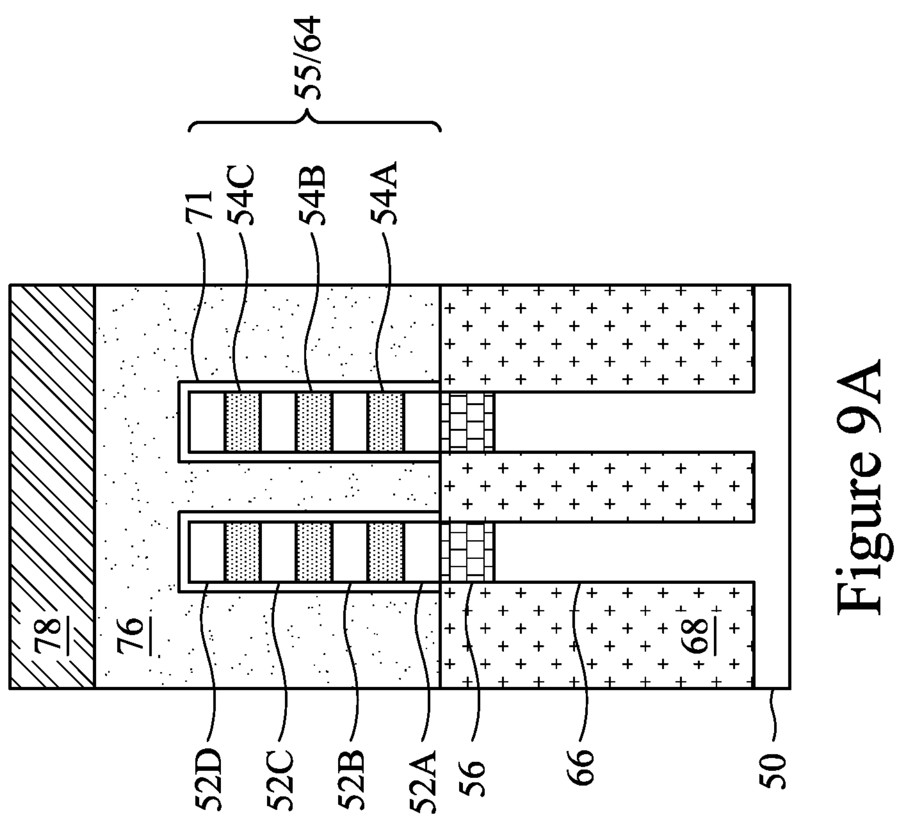
Figure 9C:
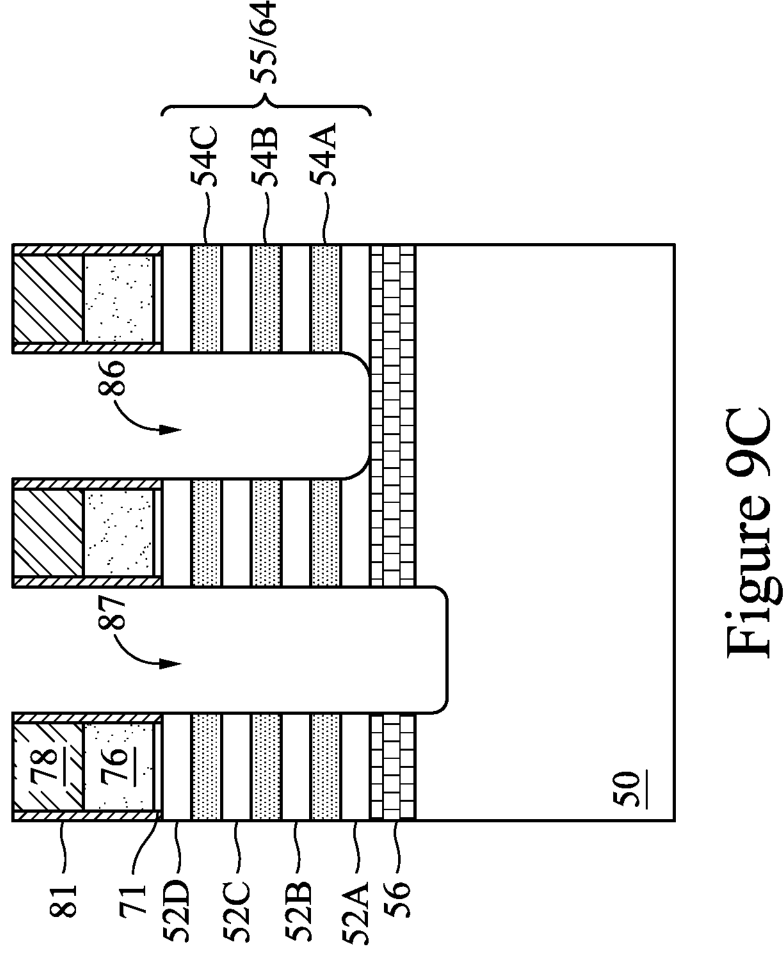

In FIGS. 9A through 9C, first recesses 86 and second recesses 87 are formed in the nanostructures 55, the etch stop layer 56, the fins 66, and the substrate 50. Epitaxial materials which may be used as sacrificial materials will be subsequently formed in the second recesses 87 and epitaxial materials which may be used as source/drain regions will be subsequently formed in the first recesses 86 and the second recesses 87. The first recesses 86 extend through the first nanostructures 52A-52D and the second nanostructures 54A-54C to the etch stop layer 56. In some embodiments, top surfaces of the STI regions 68 may be level with bottom surfaces of the first recesses 86. In some embodiments, the fins 66 may be etched such that bottom surfaces of the first recesses 86 are disposed below the top surfaces of the STI regions 68 or the like. The second recesses 87 may extend through the first nanostructures 52A-52D, the second nanostructures 54A-54C, the etch stop layer 56, and into the fins 66 and the substrate 50. Bottom surfaces of the second recesses 87 may be disposed below the bottom surfaces of the first recesses 86 and the top surfaces of the STI regions 68.

The first recesses 86 and the second recesses 87 may be formed by etching the nanostructures 55, the etch stop layer 56, the fins 66, and the substrate 50 using anisotropic etching processes, such as RIE, NBE, or the like. The first spacers 81, the second spacers 83, and the masks 78 mask portions of the nanostructures 55, the etch stop layer 56, the fins 66, and the substrate 50 during the etching processes used to form the first recesses 86 and the second recesses 87. A single etch process or multiple etch processes may be used to etch each layer of nanostructures 55, the etch stop layer 56, the fins 66, and the substrate 50. Timed etch processes may be used to stop the etching after the first recesses 86 and the second recesses 87 reach desired depths. The second recesses 87 may be etched by the same processes used to etch the first recesses 86 and an additional etch process before or after the first recesses 86 are etched. In some embodiments, regions corresponding to the first recesses 86 may be masked while the additional etch process for the second recesses 87 is performed.

Figure 10B:
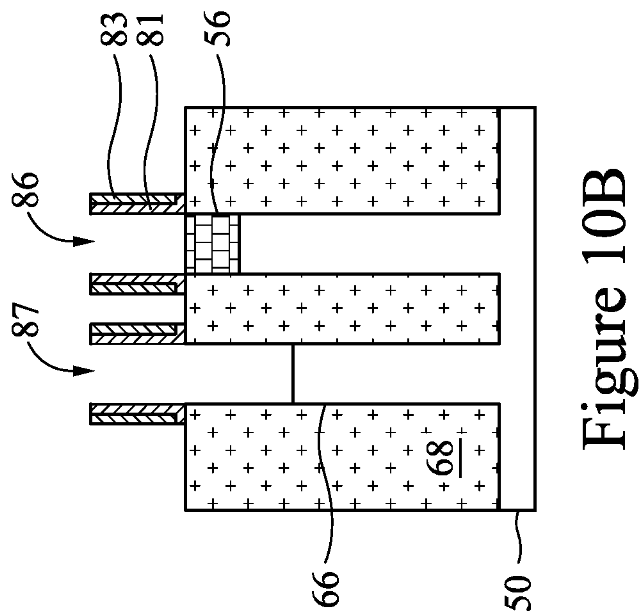
Figure 10A:
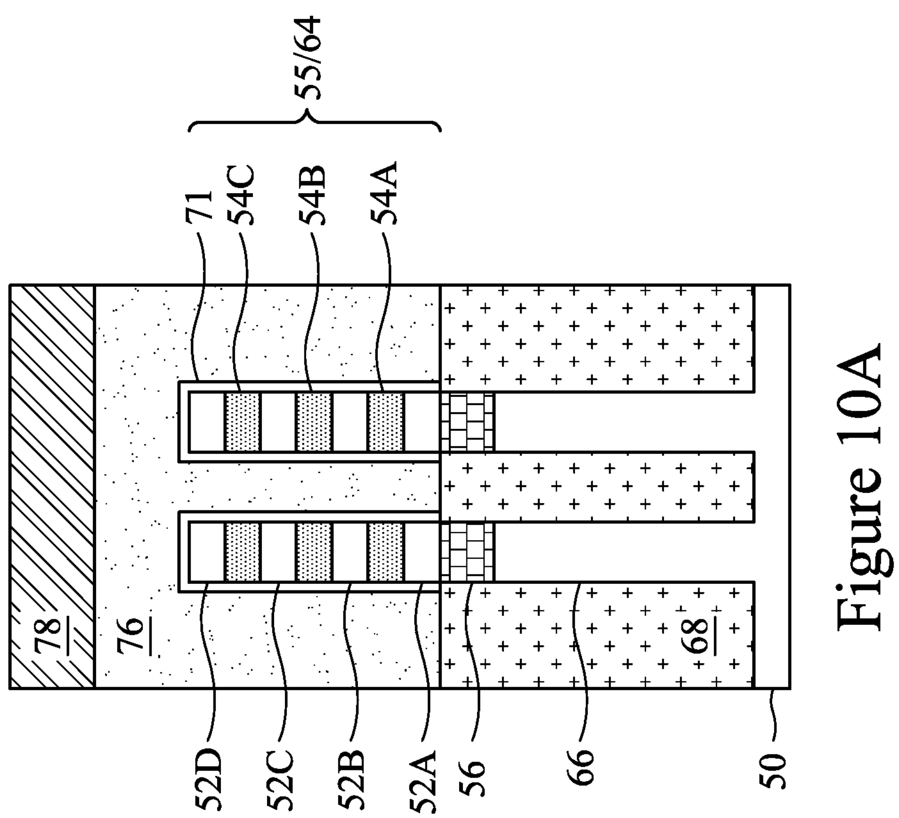
Figure 10C:
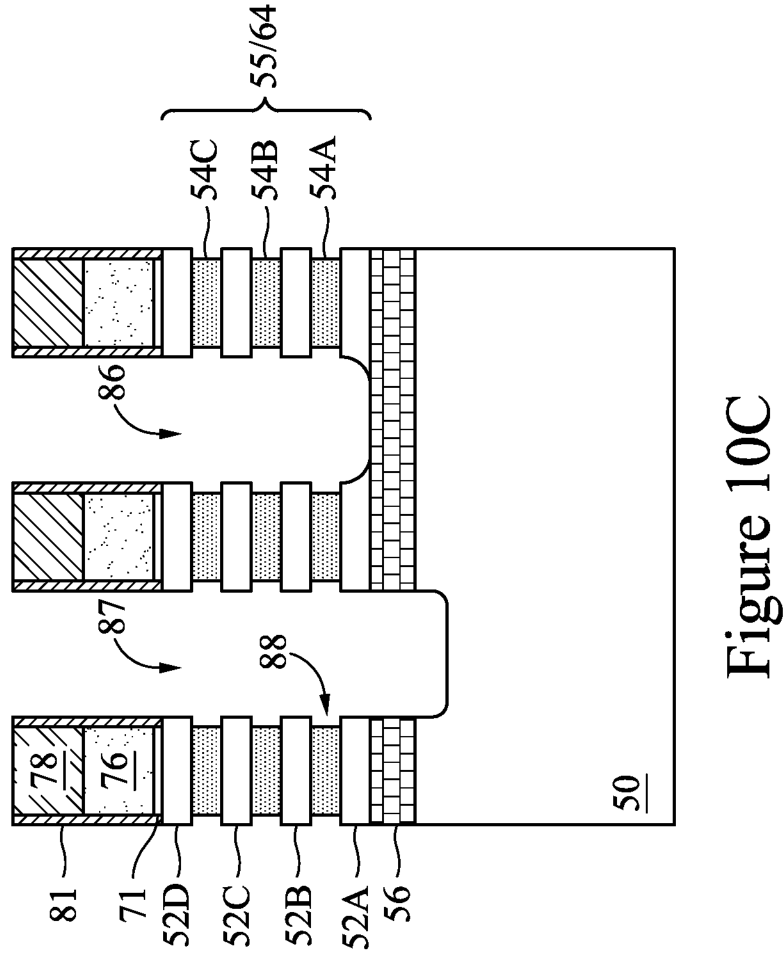

In FIGS. 10A through 10C, portions of sidewalls of the layers of the multi-layer stack 64 formed of the second semiconductor materials (e.g., the second nanostructures 54) exposed by the first recesses 86 and the second recesses 87 are etched to form sidewall recesses 88 in the n-type region 50N and the p-type region 50P. Although sidewalls of the second nanostructures 54 adjacent the sidewall recesses 88 are illustrated as being straight in FIG. 10C, the sidewalls may be concave or convex. The sidewalls may be etched using isotropic etching processes, such as wet etching or the like. In an embodiment in which the first nanostructures 52 include, e.g., Si or SiC, and the second nanostructures 54 include, e.g., SiGe, a wet or dry etch process with hydrogen fluoride, another fluorine-based etchant, or the like may be used to etch sidewalls of the second nanostructures 54 in the n-type region 50N and the p-type region 50P.

In FIGS. 11A through 11D, first inner spacers 90 are formed in the sidewall recess 88. The first inner spacers 90 may be formed by depositing an inner spacer layer (not separately illustrated) over the structures illustrated in FIGS. 10A through 10C. The first inner spacers 90 act as isolation features between subsequently formed source/drain regions and gate structures. As will be discussed in greater detail below, the source/drain regions will be formed in the first recesses 86 and the second recesses 87, while the second nanostructures 54 will be replaced with corresponding gate structures.

The inner spacer layer may be deposited by a conformal deposition process, such as CVD, ALD, or the like. The inner spacer layer may comprise a material such as silicon nitride or silicon oxynitride, although any suitable material, such as low-dielectric constant (low-k) materials having a k-value less than about 3.5, may be utilized. The inner spacer layer may then be anisotropically etched to form the first inner spacers 90. Although outer sidewalls of the first inner spacers 90 are illustrated as being flush with sidewalls of the first nanostructures 52, the outer sidewalls of the first inner spacers 90 may extend beyond or be recessed from the sidewalls of the first nanostructures 52.

Figure 11B:
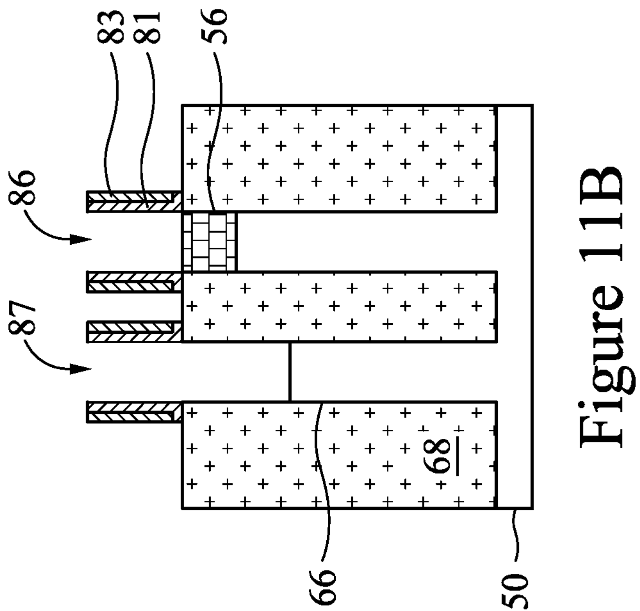
Figure 11A:
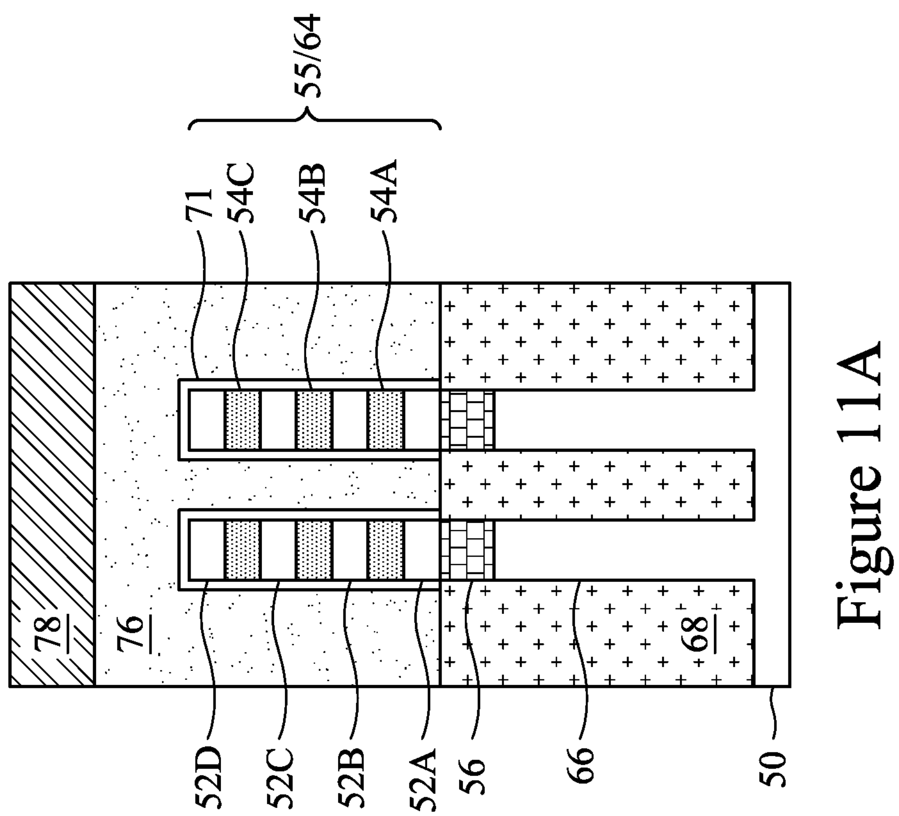
Figure 11C:
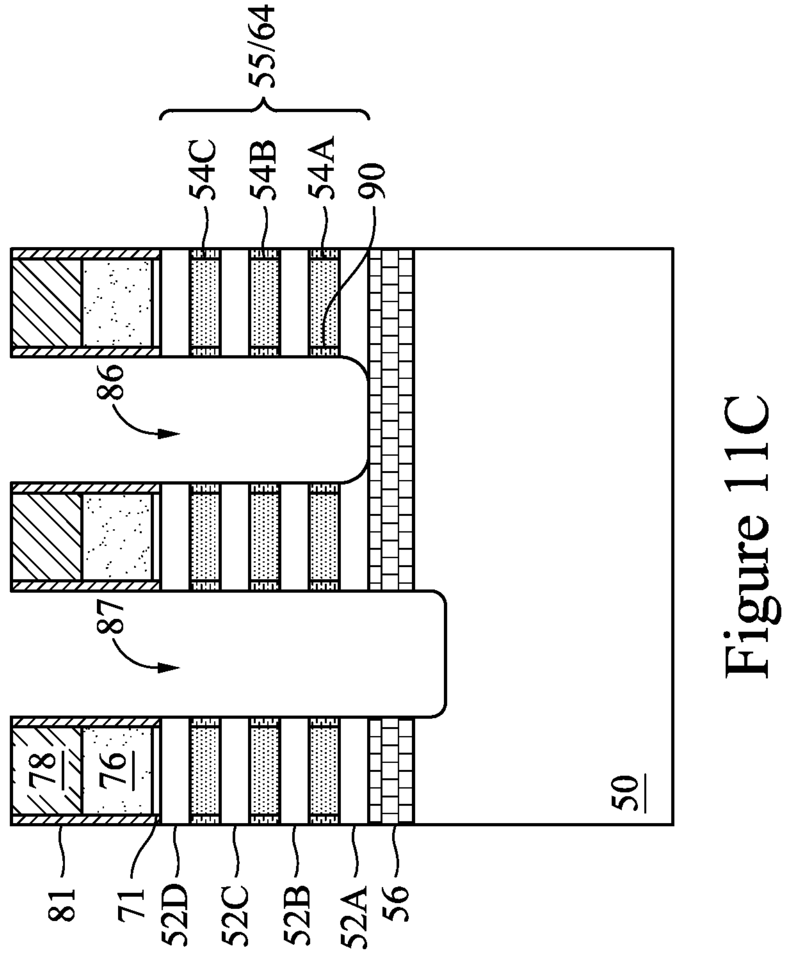
Figure 11D:
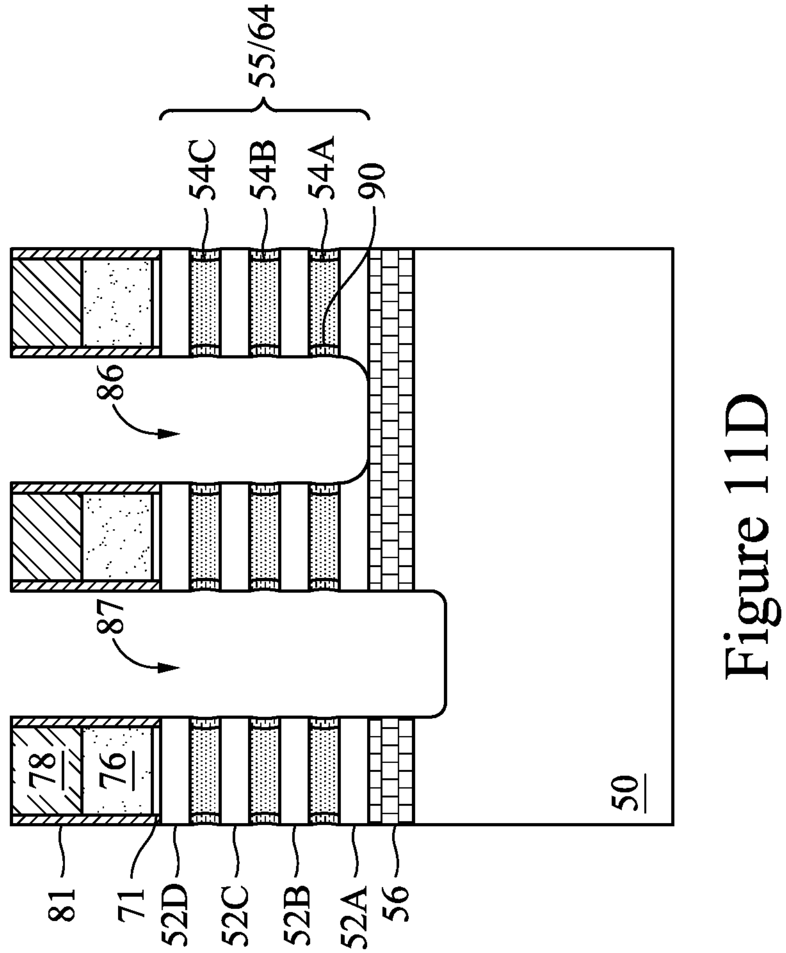

Moreover, although the outer sidewalls of the first inner spacers 90 are illustrated as being straight in FIG. 11C, the outer sidewalls of the first inner spacers 90 may be concave or convex. As an example, FIG. 11D illustrates an embodiment in which sidewalls of the second nanostructures 54 are concave, outer sidewalls of the first inner spacers 90 are concave, and the first inner spacers 90 are recessed from sidewalls of the first nanostructures 52. The inner spacer layer may be etched by an anisotropic etching process, such as RIE, NBE, or the like. The first inner spacers 90 may be used to prevent damage to subsequently formed source/drain regions (such as the epitaxial source/drain regions 92, discussed below with respect to FIGS. 12A through 12E) by subsequent etching processes, such as etching processes used to form gate structures.

In FIGS. 12A through 12E, first epitaxial materials 91 are formed in the second recesses 87 and epitaxial source/drain regions 92 are formed in the first recesses 86 and the second recesses 87. In some embodiments, the first epitaxial materials 91 in the second recesses 87 may be sacrificial materials, which are subsequently removed to form backside vias (such as the backside vias 148, discussed below with respect to FIGS. 25A through 25C). In some embodiments, the epitaxial source/drain regions 92 formed in the first recesses 86 and the second recesses 87 may exert stress on the first nanostructures 52 thereby improving performance.

Figure 12B:
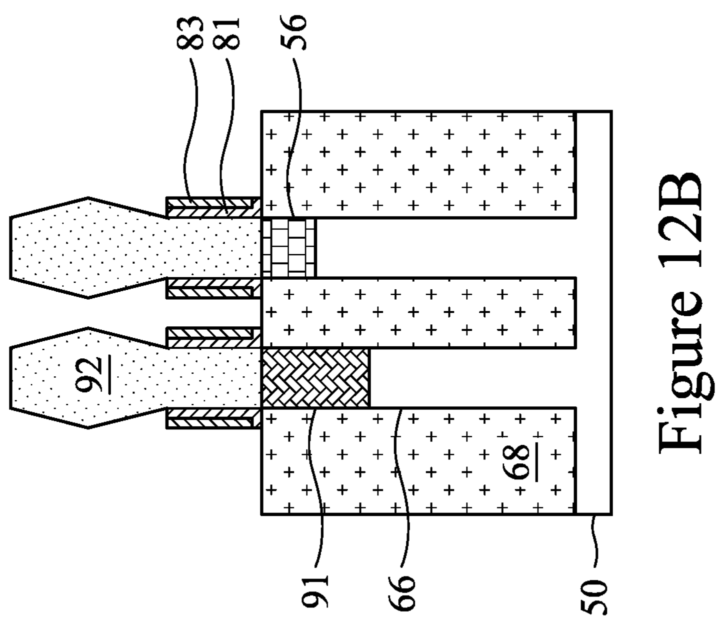
Figure 12A:
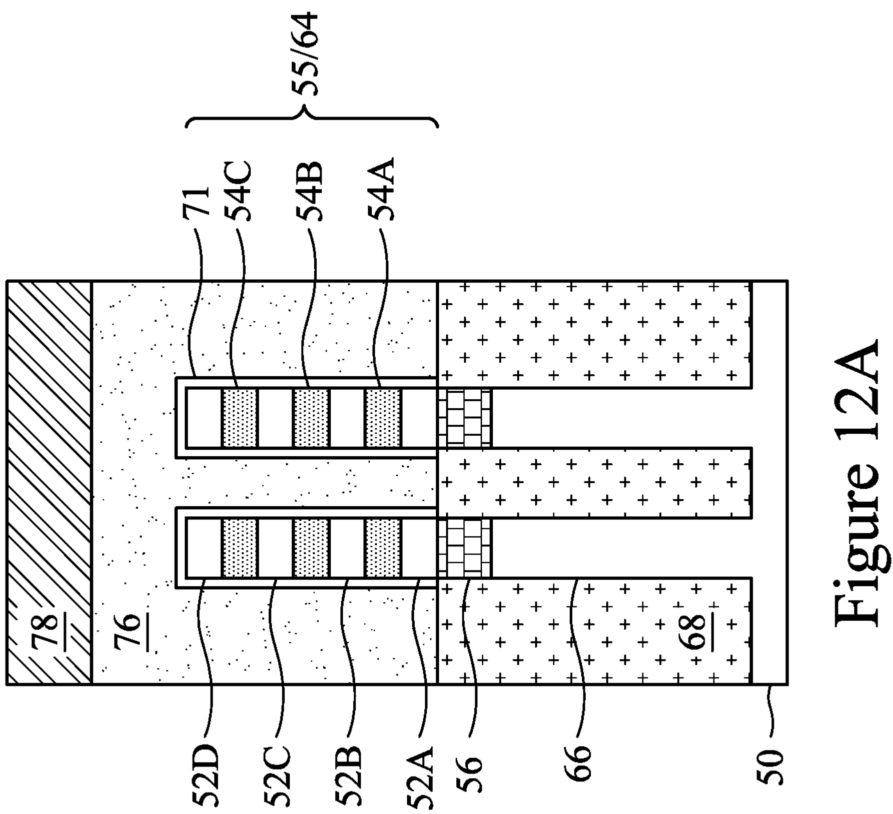
Figure 12D:
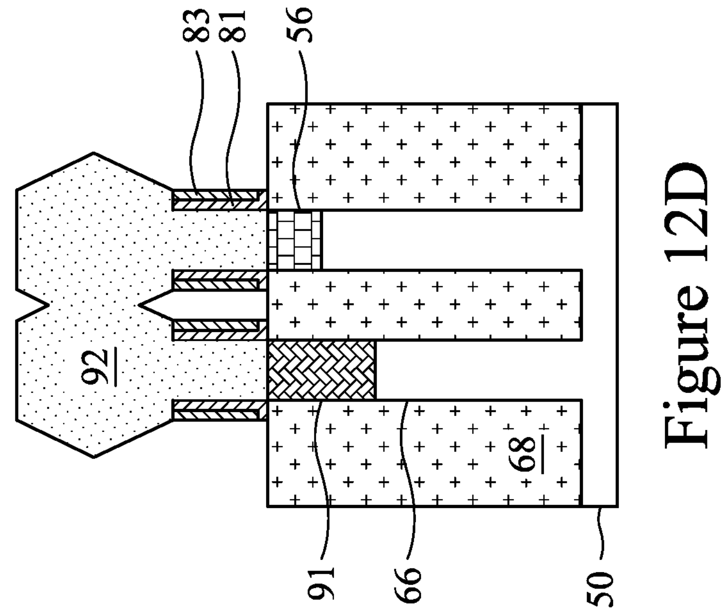
Figure 12C:
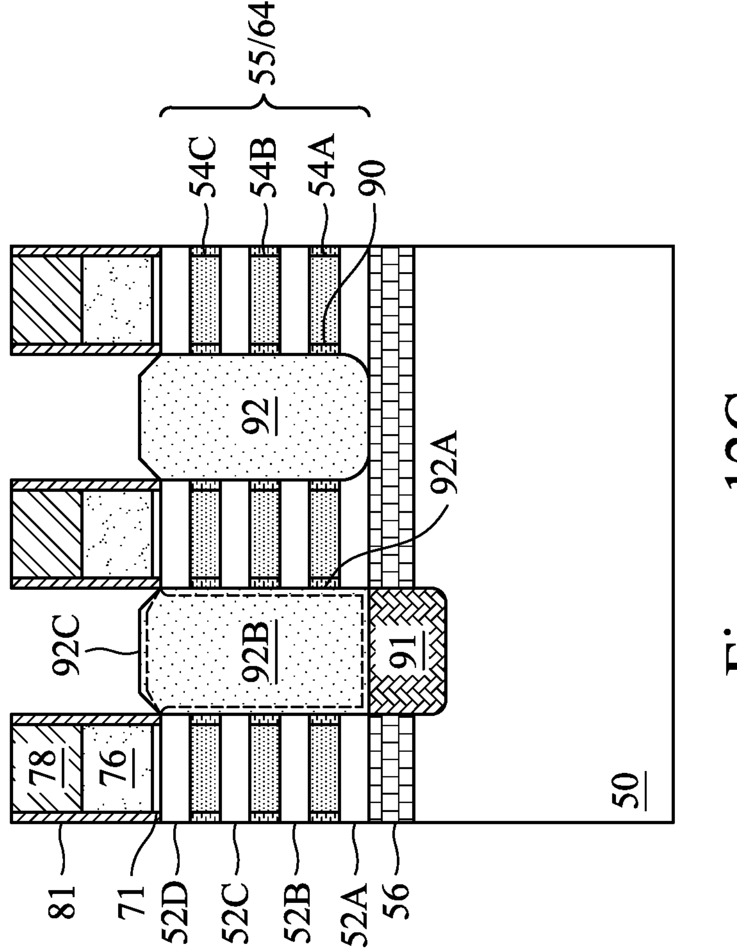

As illustrated in FIG. 12C, the epitaxial source/drain regions 92 are formed in the first recesses 86 and the second recesses 87 such that each dummy gate 76 is disposed between respective neighboring pairs of the epitaxial source/drain regions 92. In some embodiments, the first spacers 81 are used to separate the epitaxial source/drain regions 92 from the dummy gates 76 and the first inner spacers 90 are used to separate the epitaxial source/drain regions 92 from the second nanostructures 54 by an appropriate lateral distance so that the epitaxial source/drain regions 92 do not short out with subsequently formed gates of the resulting nano-FETs.

The first epitaxial materials 91 may be grown such that top surfaces of the first epitaxial materials 91 are level with bottom surfaces of the first recesses 86 (see FIGS. 11B through 11D), top surfaces of the etch stop layer 56, and top surfaces of the STI regions 68. However, in some embodiments, top surfaces of the first epitaxial materials 91 may be disposed above or below the top surfaces of the etch stop layer 56, the bottom surfaces of the first recesses 86, and the top surfaces of the STI regions 68. The first epitaxial materials 91 may be epitaxially grown in the second recesses 87 using a process such as CVD, ALD, VPE, MBE, or the like. The first epitaxial materials 91 may include any acceptable materials, such as silicon germanium or the like. The first epitaxial materials 91 may be formed of materials having high etch selectivity to materials of the etch stop layer 56, the epitaxial source/drain regions 92, and dielectric layers (such as the STI regions 68 and the dielectric layers 144, discussed below with respect to FIGS. 24A through 24C). As such, the first epitaxial materials 91 may be removed and replaced with backside vias without significantly removing the he etch stop layer 56, the epitaxial source/drain regions 92, and dielectric layers.

The epitaxial source/drain regions 92 in the n-type region 50N, e.g., the NMOS region, may be formed by masking the p-type region 50P, e.g., the PMOS region. Then, the epitaxial source/drain regions 92 are epitaxially grown in the first recesses 86 and the second recesses 87 in the n-type region 50N. The epitaxial source/drain regions 92 may include any acceptable material appropriate for n-type nano-FETs. For example, if the first nanostructures 52 are silicon, the epitaxial source/drain regions 92 may include materials exerting a tensile strain on the first nanostructures 52, such as silicon, silicon carbide, phosphorous doped silicon carbide, silicon phosphide, or the like. The epitaxial source/drain regions 92 may have surfaces raised from respective upper surfaces of the nanostructures 55 and may have facets.

The epitaxial source/drain regions 92 in the p-type region 50P, e.g., the PMOS region, may be formed by masking the n-type region 50N, e.g., the NMOS region. Then, the epitaxial source/drain regions 92 are epitaxially grown in the first recesses 86 and the second recesses 87 in the p-type region 50P. The epitaxial source/drain regions 92 may include any acceptable material appropriate for p-type nano-FETs. For example, if the first nanostructures 52 are silicon, the epitaxial source/drain regions 92 may comprise materials exerting a compressive strain on the first nanostructures 52, such as silicon-germanium, boron doped silicon-germanium, germanium, germanium tin, or the like. The epitaxial source/drain regions 92 may also have surfaces raised from respective surfaces of the nanostructures 55 and may have facets.

The epitaxial source/drain regions 92, the first nanostructures 52, the second nanostructures 54, the fins 66 and/or the substrate 50 may be implanted with dopants to form source/drain regions, similar to the process previously discussed for forming lightly-doped source/drain regions, followed by an anneal. The source/drain regions may have an impurity concentration of between about $1\times10^{19}$ atoms/$cm^3$ and about $1\times10^{21}$ atoms/$cm^3$. The n-type and/or p-type impurities for source/drain regions may be any of the impurities previously discussed. In some embodiments, the epitaxial source/drain regions 97 may be in situ doped during growth.

As a result of the epitaxy processes used to form the epitaxial source/drain regions 92 in the n-type region 50N and the p-type region 50P, upper surfaces of the epitaxial source/drain regions 92 have facets which expand laterally outward beyond sidewalls of the nanostructures 55. In some embodiments, these facets cause adjacent epitaxial source/drain regions 92 of a same nano-FET to merge, as illustrated by FIG. 12D. In other embodiments, adjacent epitaxial source/drain regions 92 remain separated after the epitaxy process is completed as illustrated by FIG. 12B. In the embodiments illustrated in FIGS. 12B and 12D, the first spacers 81 may be formed extending to top surfaces of the STI regions 68, thereby blocking the epitaxial growth. In some embodiments, the first spacers 81 may cover portions of the sidewalls of the nanostructures 55 further blocking the epitaxial growth. In some embodiments, the spacer etch used to form the first spacers 81 may be adjusted to remove the spacer material and allow the epitaxially grown region to extend to the surface of the STI region 68.

The epitaxial source/drain regions 92 may comprise one or more semiconductor material layers. For example, the epitaxial source/drain regions 92 may comprise a first semiconductor material layer 92A, a second semiconductor material layer 92B, and a third semiconductor material layer 92C. Any number of semiconductor material layers may be used for the epitaxial source/drain regions 92. Each of the first semiconductor material layer 92A, the second semiconductor material layer 92B, and the third semiconductor material layer 92C may be formed of different semiconductor materials and may be doped to different dopant concentrations. In some embodiments, the first semiconductor material layer 92A may have a dopant concentration less than the second semiconductor material layer 92B and greater than the third semiconductor material layer 92C. In embodiments in which the epitaxial source/drain regions 92 comprise three semiconductor material layers, the first semiconductor material layer 92A may be deposited, the second semiconductor material layer 92B may be deposited over the first semiconductor material layer 92A, and the third semiconductor material layer 92C may be deposited over the second semiconductor material layer 92B.

Figure 12E:
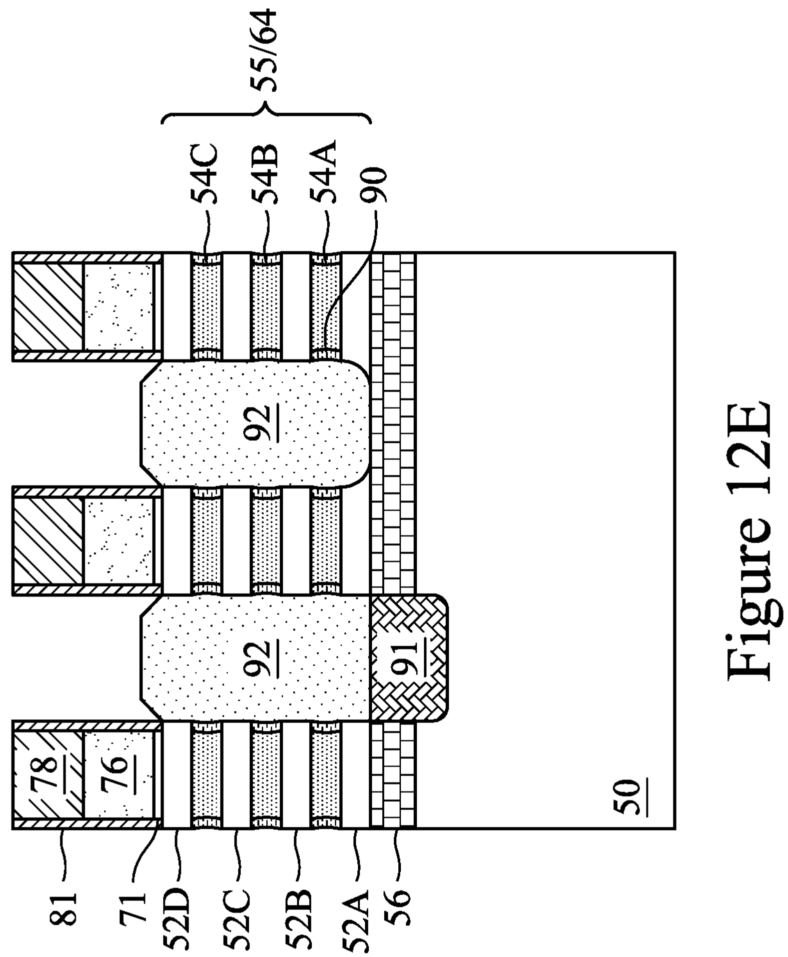

FIG. 12E illustrates an embodiment in which sidewalls of the second nanostructures 54 are concave, outer sidewalls of the first inner spacers 90 are concave, and the first inner spacers 90 are recessed from sidewalls of the first nanostructures 52. As illustrated in FIG. 12E, the epitaxial source/drain regions 92 may be formed in contact with the first inner spacers 90 and may extend past sidewalls of the first nanostructures 52.

Figure 13B:
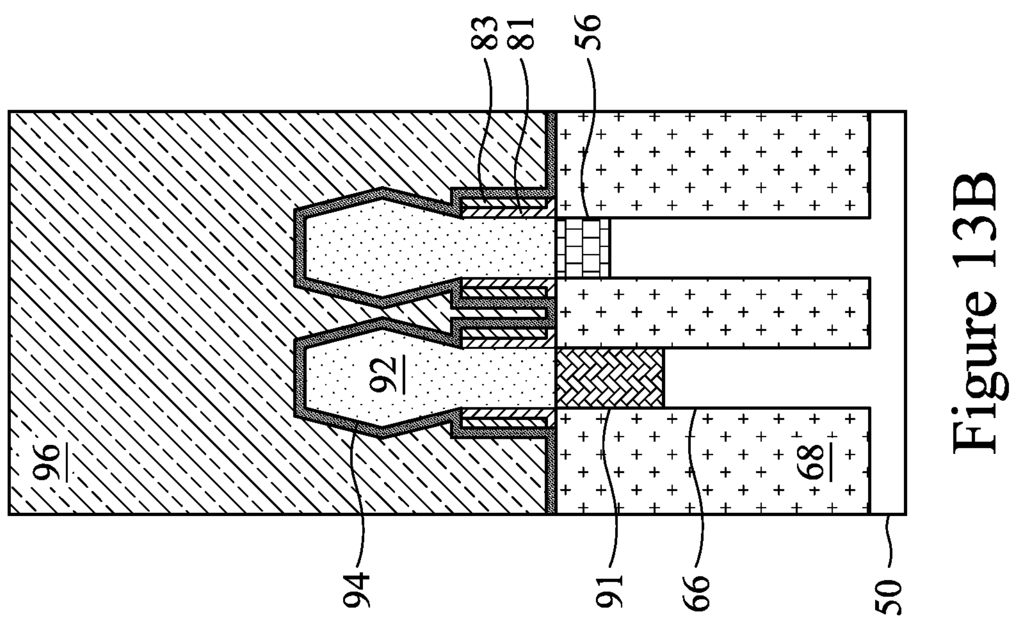
Figure 13A:
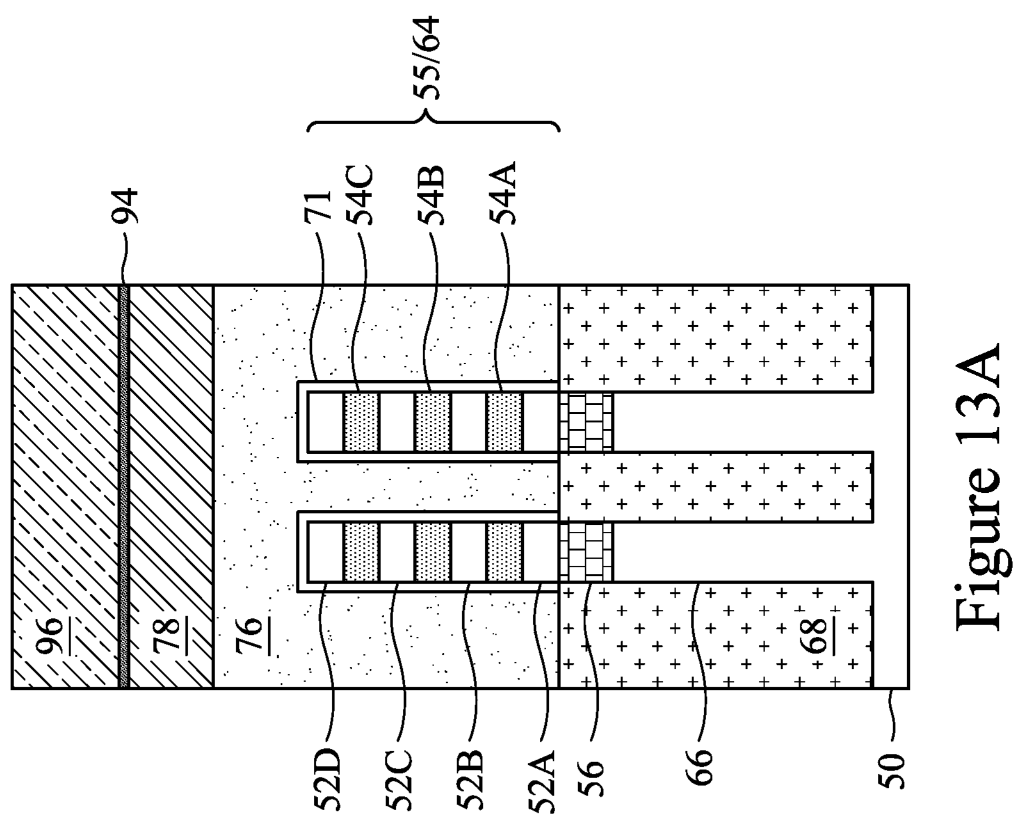
Figure 13C:
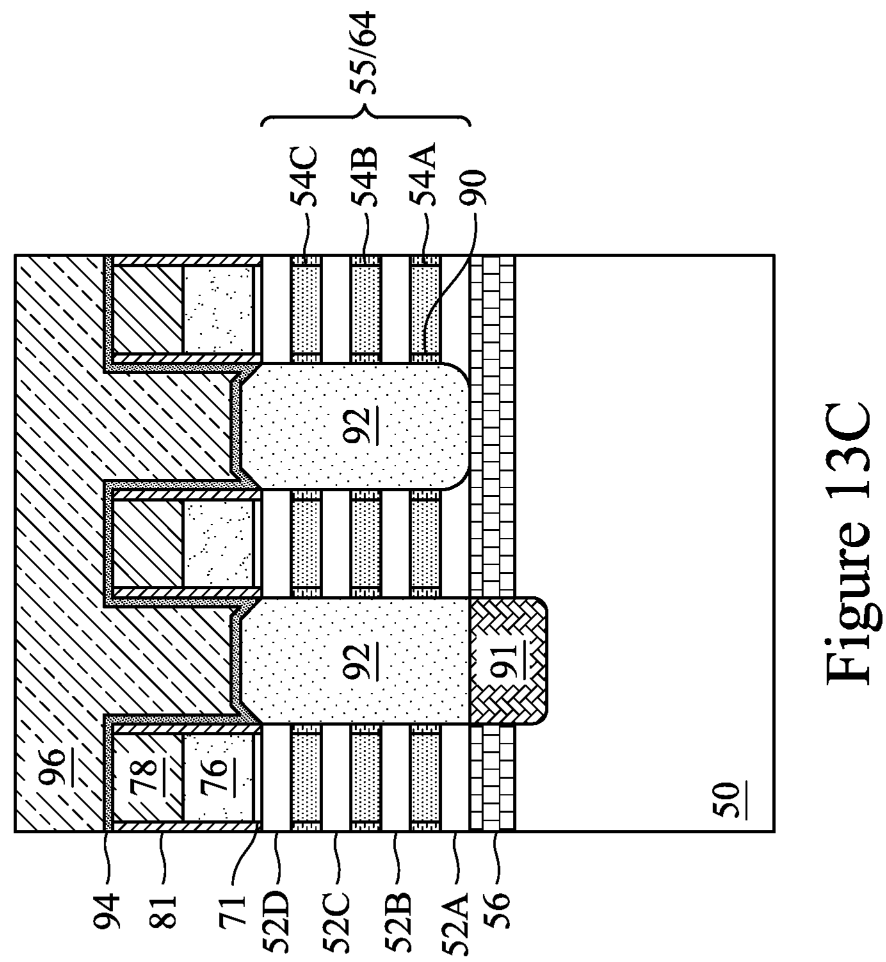

In FIGS. 13A through 13C, a first interlayer dielectric (ILD) 96 is deposited over the structure illustrated in FIGS. 12A through 12C, respectively. The first ILD 96 may be formed of a dielectric material, and may be deposited by any suitable method, such as CVD, plasma-enhanced CVD (PECVD), or FCVD. Dielectric materials may include phosphosilicate glass (PSG), borosilicate glass (BSG), boron-doped phosphosilicate glass (BPSG), undoped silicate glass (USG), or the like. Other insulation materials formed by any acceptable process may be used. In some embodiments, a contact etch stop layer (CESL) 94 is disposed between the first ILD 96 and the epitaxial source/drain regions 92, the masks 78, the first spacers 81, the second spacers 83, and the STI regions 68. The CESL 94 may comprise a dielectric material, such as, silicon nitride, silicon oxide, silicon oxynitride, or the like, having a different etch rate than the material of the overlying first ILD 96.

Figure 14B:
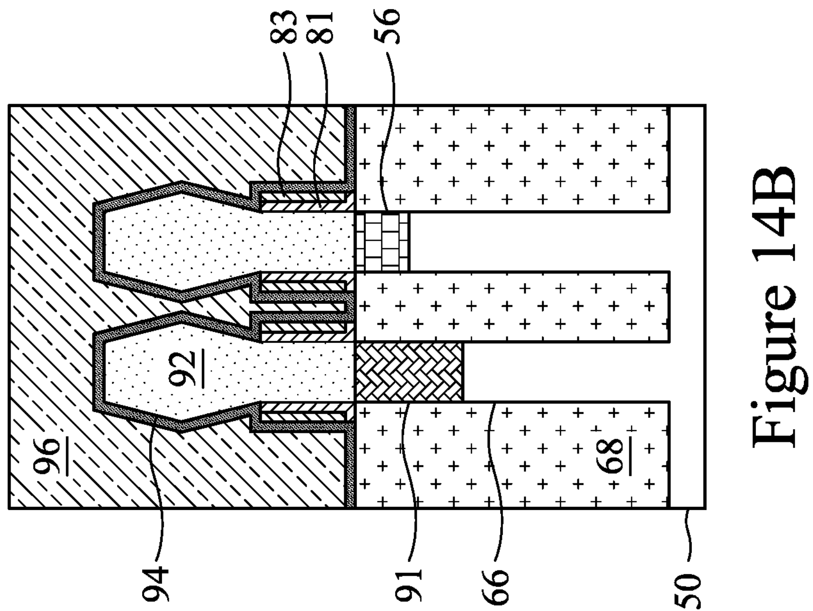
Figure 14A:
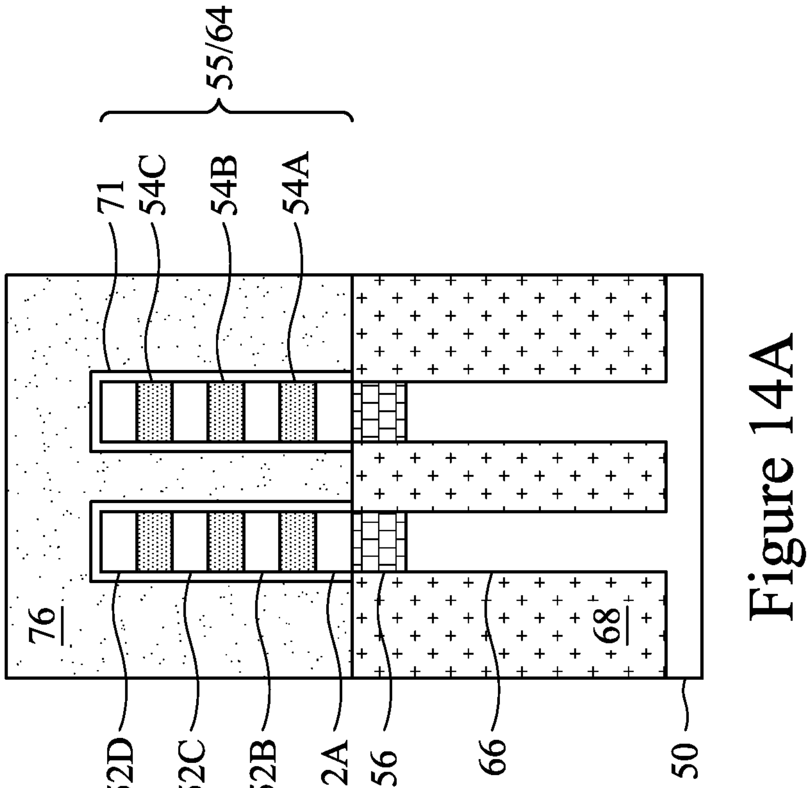
Figure 14C:
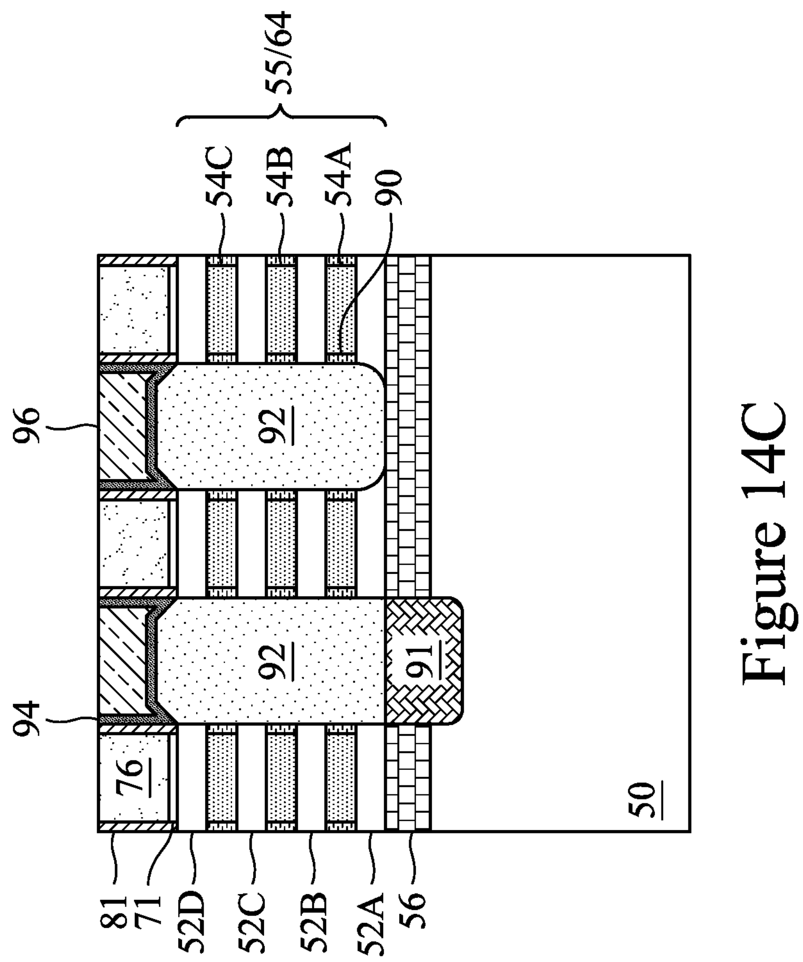

In FIGS. 14A through 14C, a planarization process, such as a CMP, may be performed to level the top surface of the first ILD 96 with the top surfaces of the dummy gates 76. The planarization process may also remove the masks 78 on the dummy gates 76, and portions of the first spacers 81 along sidewalls of the masks 78. After the planarization process, top surfaces of the dummy gates 76, the first spacers 81, the first ILD 96, and the CESL 94 may be level with one another, within process variations. Accordingly, the top surfaces of the dummy gates 76 are exposed through the first ILD 96.

Figure 15B:
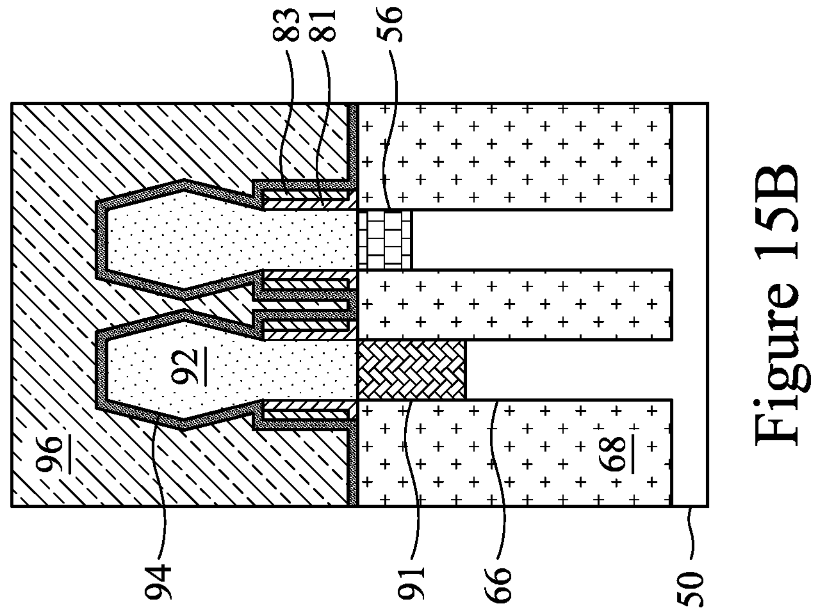
Figure 15A:
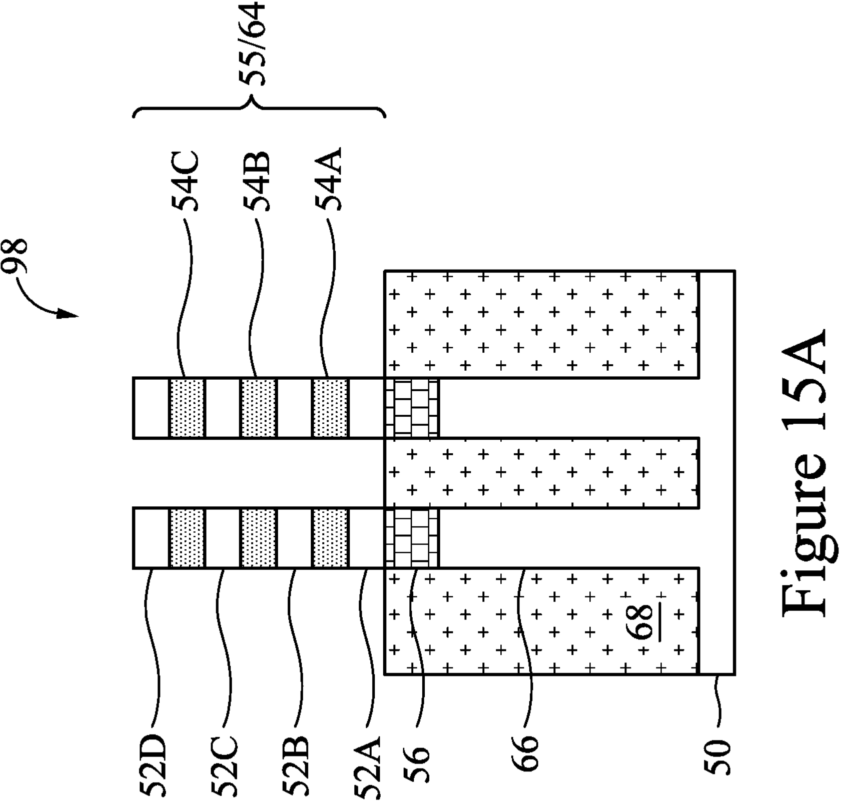
Figure 15C:
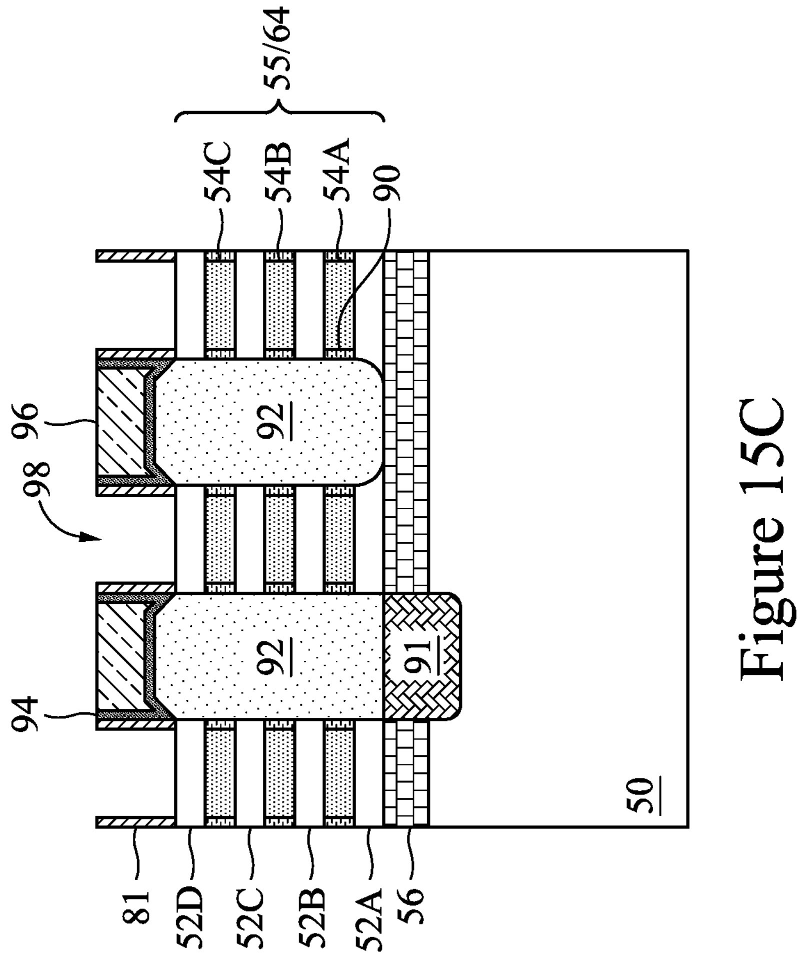

In FIGS. 15A through 15C, the dummy gates 76 are removed in one or more etching steps, forming recesses 98. Portions of the dummy gate dielectrics 71 in the recesses 98 are also be removed. In some embodiments, the dummy gates 76 and the dummy gate dielectrics 71 are removed by an anisotropic dry etch process. For example, the etching process may include a dry etch process using reaction gas(es) that selectively etch the dummy gates 76 at a faster rate than the first ILD 96, the CESL 94, or the first spacers 81. Each of the recesses 98 exposes and/or overlies portions of nanostructures 55, which act as channel regions in subsequently completed nano-FETs. Portions of the nanostructures 55 which act as the channel regions are disposed between neighboring pairs of the epitaxial source/drain regions 92. During the removal, the dummy gate dielectrics 71 may be used as etch stop layers when the dummy gates 76 are etched. The dummy gate dielectrics 71 may then be removed after the removal of the dummy gates 76.

Figure 16B:
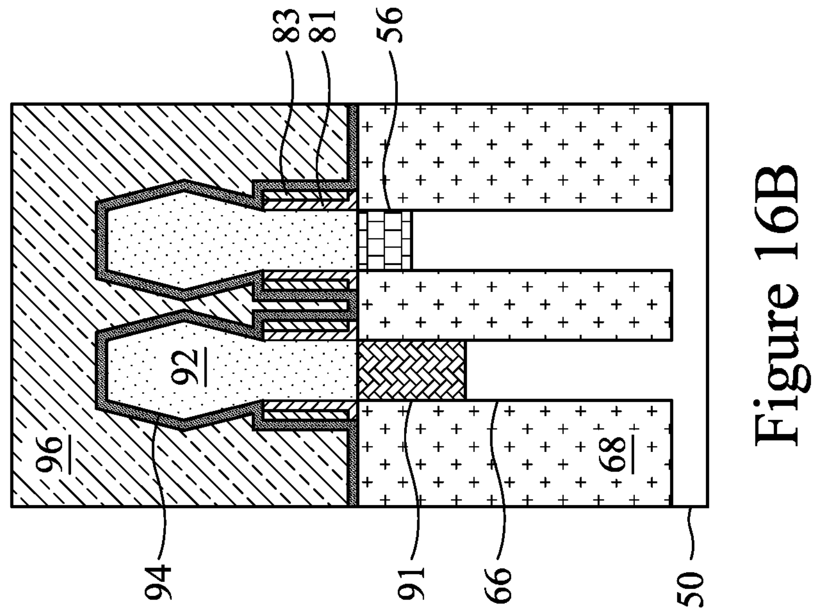
Figure 16A:
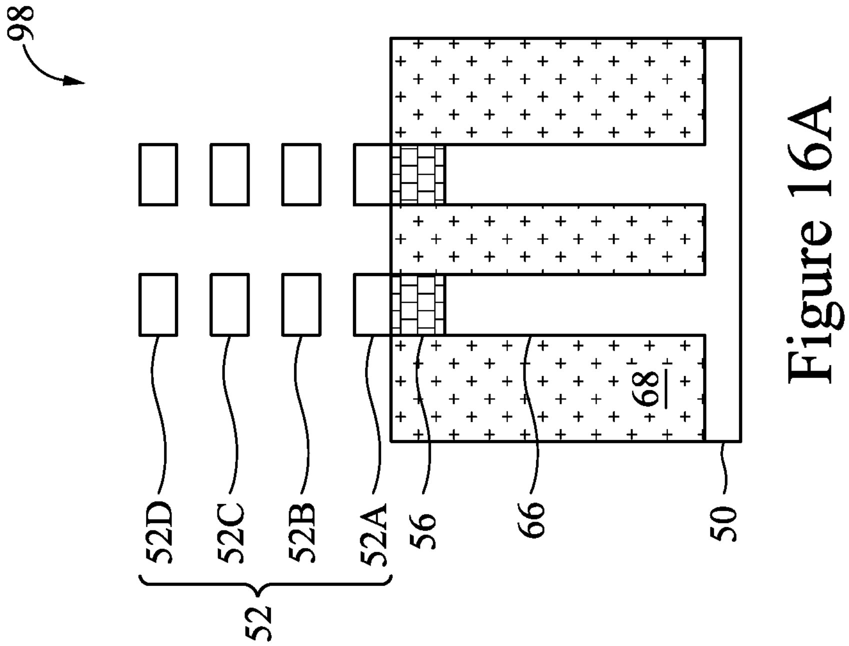
Figure 16C:
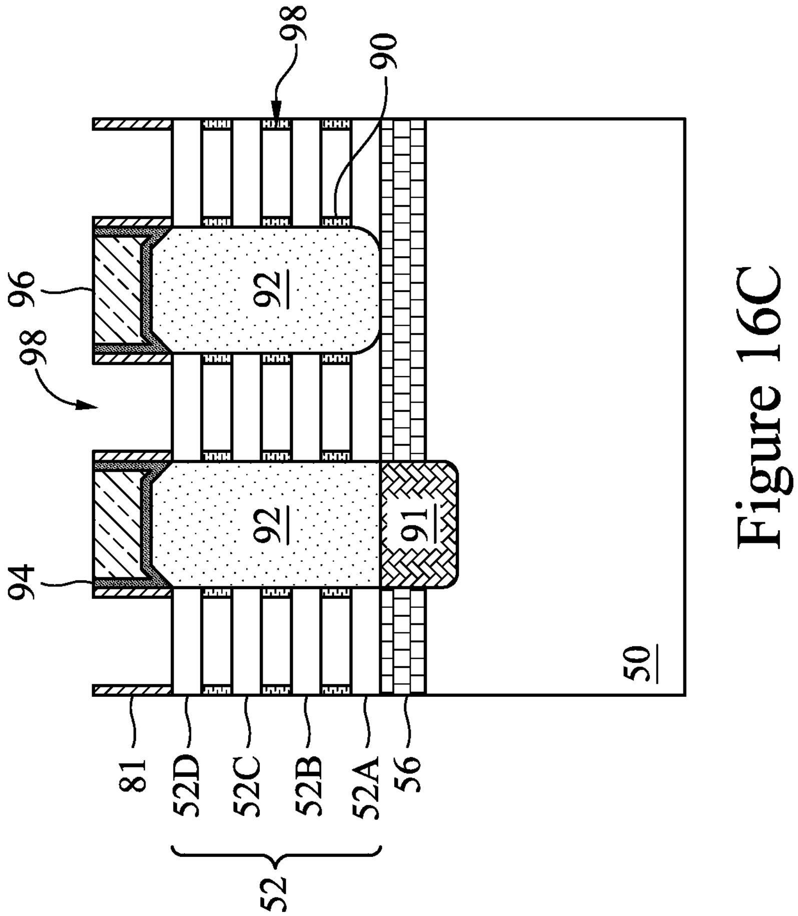

In FIGS. 16A through 16C, the second nanostructures 54 are removed extending the recesses 98. The second nanostructures 54 may be removed by performing an isotropic etching process, such as wet etching or the like, using etchants which are selective to the materials of the second nanostructures 54, while the first nanostructures 52, the substrate 50, the STI regions 68, the first ILD 96, the CESL 94, the first spacers 81, and the first inner spacers 90 remain relatively un-etched as compared to the second nanostructures 54. In embodiments in which the first nanostructures 52 include, e.g., Si or SiC, and the second nanostructures 54A-54C include, e.g., SiGe, tetramethylammonium hydroxide (TMAH), ammonium hydroxide ($NH_4OH$), or the like may be used to remove the second nanostructures 54.

Figure 17B:
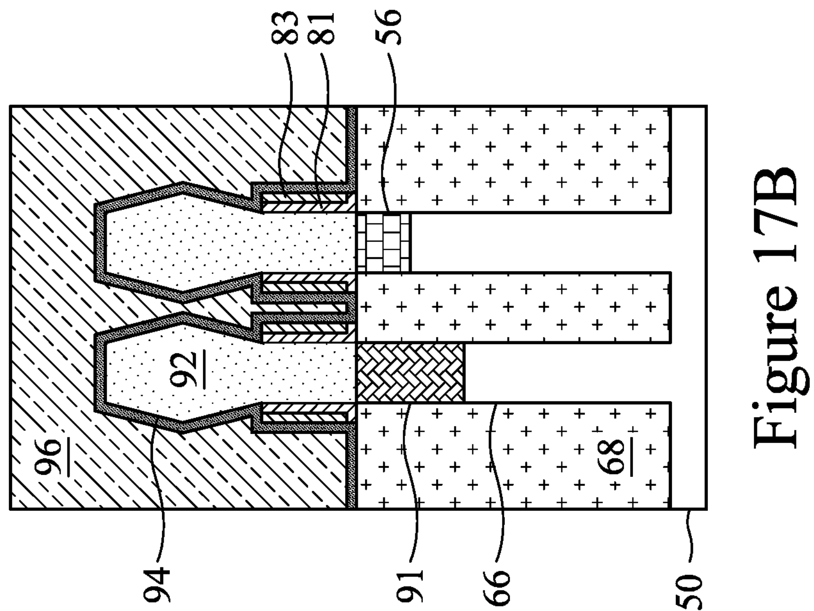
Figure 17A:
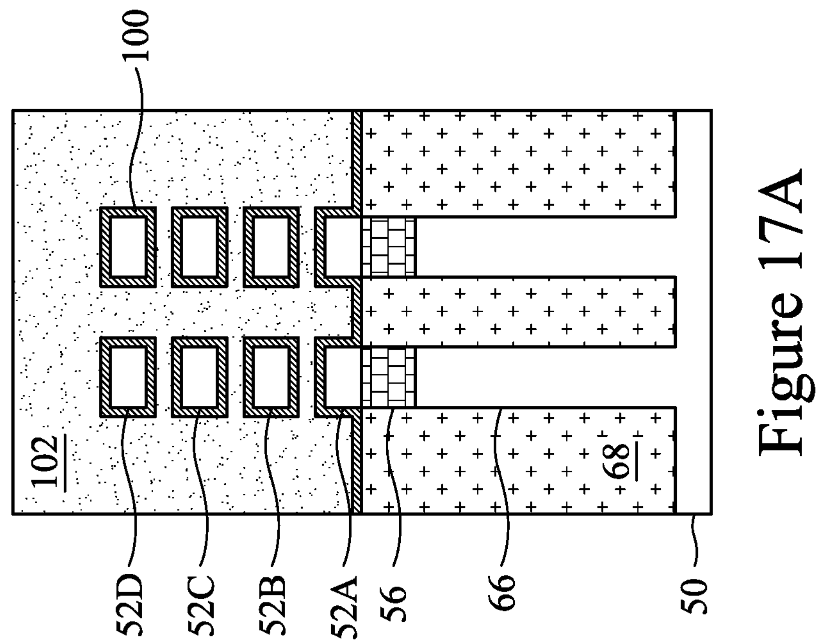
Figure 17C:
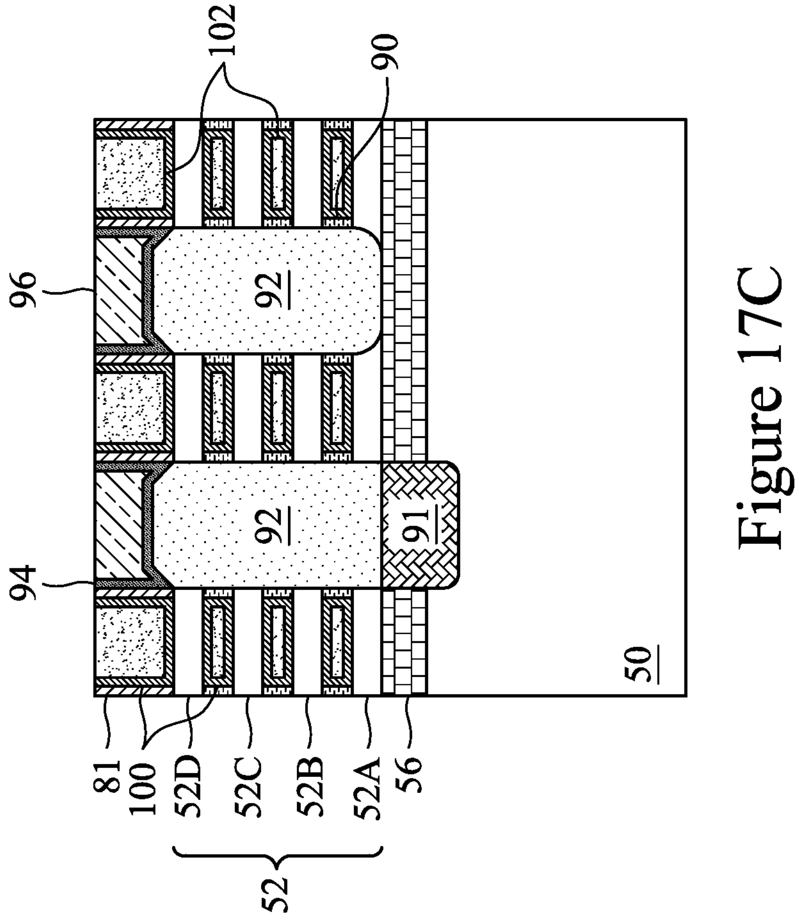

In FIGS. 17A through 17C, gate dielectric layers 100 and gate electrodes 102 are formed for replacement gates. The gate dielectric layers 100 are deposited conformally in the recesses 98. The gate dielectric layers 100 may be formed on top surfaces, sidewalls, and bottom surfaces of the first nanostructures 52. The gate dielectric layers 100 may also be deposited on top surfaces of the first ILD 96, the CESL 94, the first spacers 81, and the STI regions 68.

In accordance with some embodiments, the gate dielectric layers 100 comprise one or more dielectric layers, such as an oxide, a metal oxide, the like, or combinations thereof. For example, in some embodiments, the gate dielectric layers 100 may comprise a silicon oxide layer and a metal oxide layer over the silicon oxide layer. In some embodiments, the gate dielectric layers 100 include a high-k dielectric material, and in these embodiments, the gate dielectric layers 100 may have a k-value greater than about 7.0, and may include a metal oxide or a silicate of hafnium, aluminum, zirconium, lanthanum, manganese, barium, titanium, lead, and combinations thereof. The structure of the gate dielectric layers 100 may be the same or different in the n-type region 50N and the p-type region 50P. The formation methods of the gate dielectric layers 100 may include molecular-beam deposition (MBD), ALD, PECVD, or the like.

The gate electrodes 102 are deposited over the gate dielectric layers 100, and fill remaining portions of the recesses 98. The gate electrodes 102 may include a metal-containing material such as titanium nitride, titanium oxide, tantalum nitride, tantalum carbide, cobalt, ruthenium, aluminum, tungsten, combinations thereof, or multi-layers thereof. For example, although single-layer gate electrodes 102 are illustrated in FIGS. 17A and 17C, the gate electrodes 102 may comprise any number of liner layers, any number of work function tuning layers, and a fill material. Any combination of the layers which make up the gate electrodes 102 may be deposited between adjacent ones of the first nanostructures 52.

The formation of the gate dielectric layers 100 in the n-type region 50N and the p-type region 50P may occur simultaneously such that the gate dielectric layers 100 in each region are formed from the same materials, and the formation of the gate electrodes 102 may occur simultaneously such that the gate electrodes 102 in each region are formed from the same materials. In some embodiments, the gate dielectric layers 100 in each region may be formed by distinct processes, such that the gate dielectric layers 100 may be different materials and/or have a different number of layers, and/or the gate electrodes 102 in each region may be formed by distinct processes, such that the gate electrodes 102 may be different materials and/or have a different number of layers. Various masking steps may be used to mask and expose appropriate regions when using distinct processes.

After the filling of the recesses 98, a planarization process, such as a CMP, may be performed to remove the excess portions of the gate dielectric layers 100 and the material of the gate electrodes 102, which excess portions are over the top surfaces of the first ILD 96, the first spacers 81, and the CESL 94. The remaining portions of material of the gate electrodes 102 and the gate dielectric layers 100 thus form replacement gate structures of the resulting nano-FETs. The gate electrodes 102 and the gate dielectric layers 100 may be collectively referred to as "gate structures."

Figure 18B:
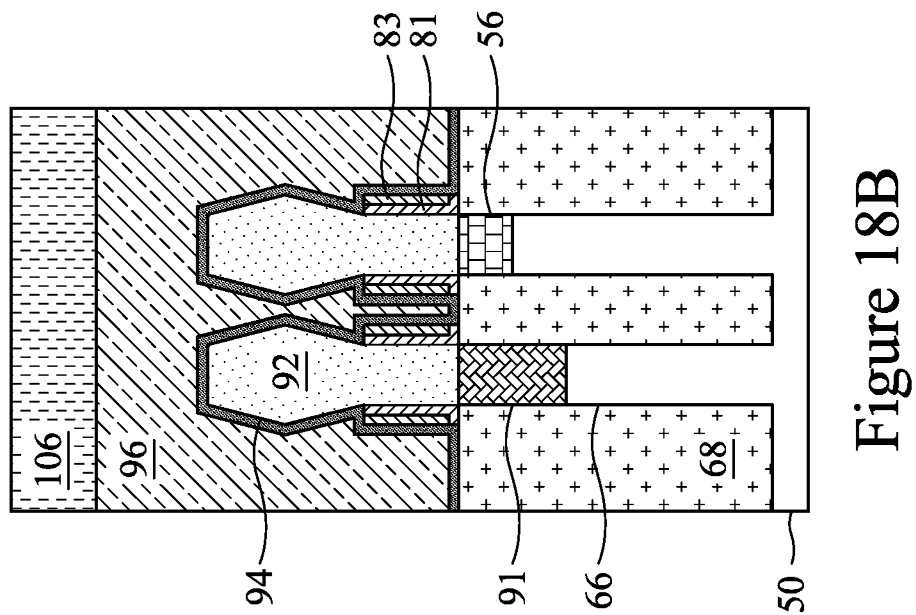
Figure 18A:
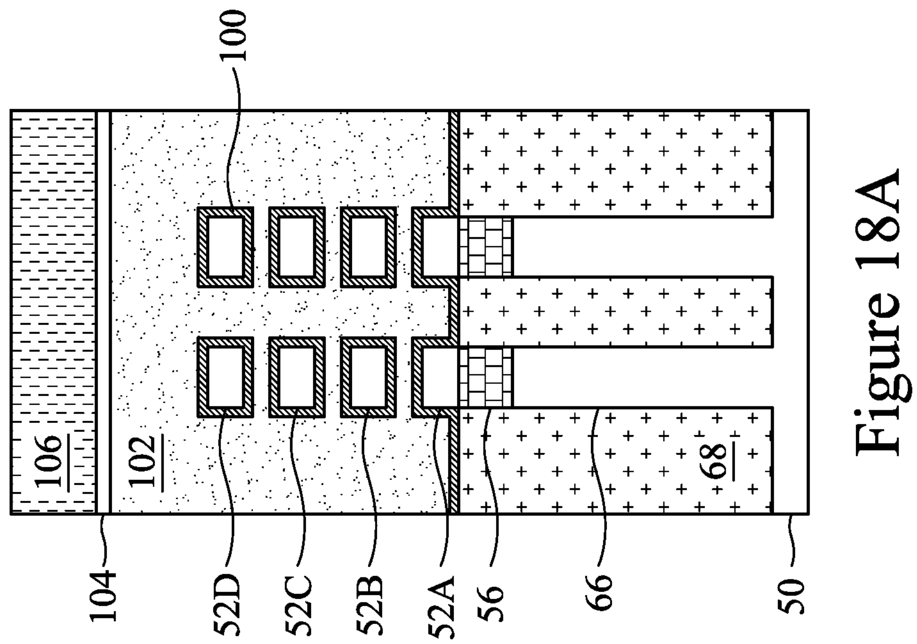
Figure 18C:
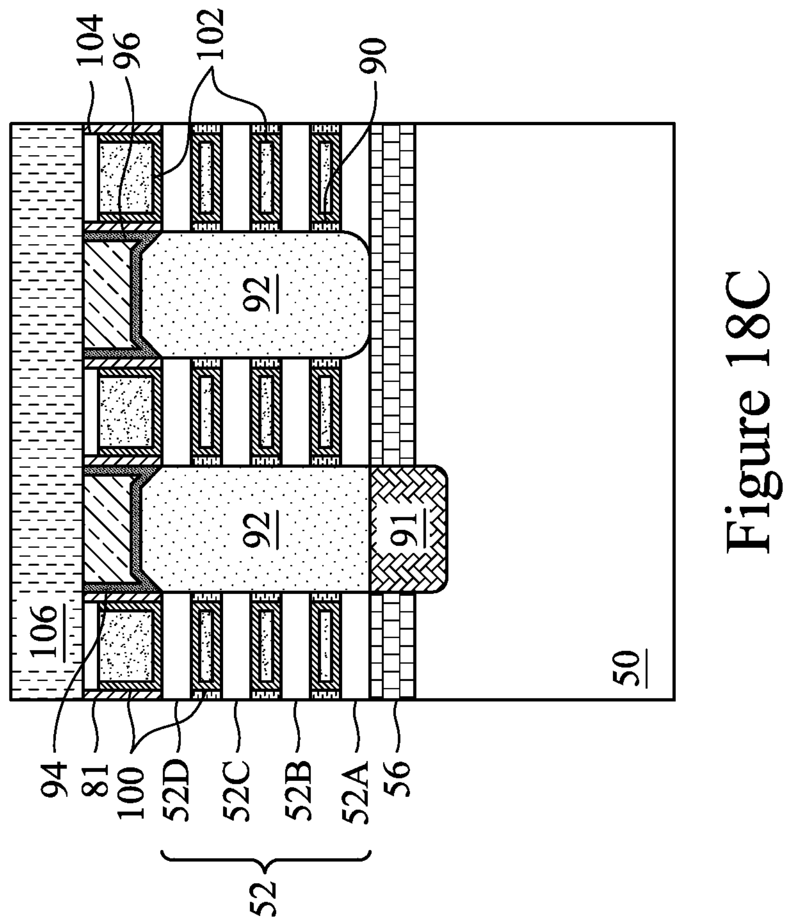

In FIGS. 18A through 18C, the gate structures (including the gate dielectric layers 100 and the corresponding overlying gate electrodes 102) are recessed, so that recesses are formed directly over each of the gate structures and between opposing portions of the first spacers 81. Gate caps 104 comprising one or more layers of dielectric material, such as silicon nitride, silicon oxynitride, or the like, are filled in the recesses, followed by a planarization process to remove excess portions of the dielectric material extending over the first ILD 96, the CESL 94, and the first spacers 81. Subsequently formed gate contacts (such as the gate contacts 114, discussed below with respect to FIGS. 20A and 20C) penetrate through the gate caps 104 to contact the top surface of the recessed gate electrodes 102.

As further illustrated by FIGS. 18A through 18C, a second ILD 106 is deposited over the first ILD 96, the CESL 94, and over the gate caps 104. In some embodiments, the second ILD 106 is a flowable film formed by FCVD. In some embodiments, the second ILD 106 is formed of a dielectric material such as PSG, BSG, BPSG, USG, or the like, and may be deposited by any suitable method, such as CVD, PECVD, or the like.

Figure 19B:
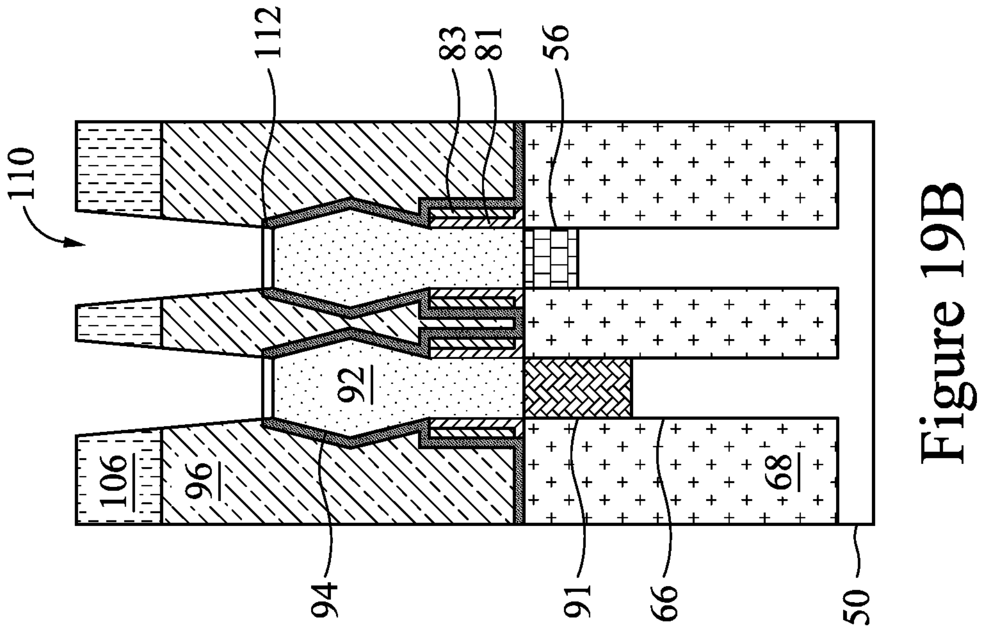
Figure 19A:
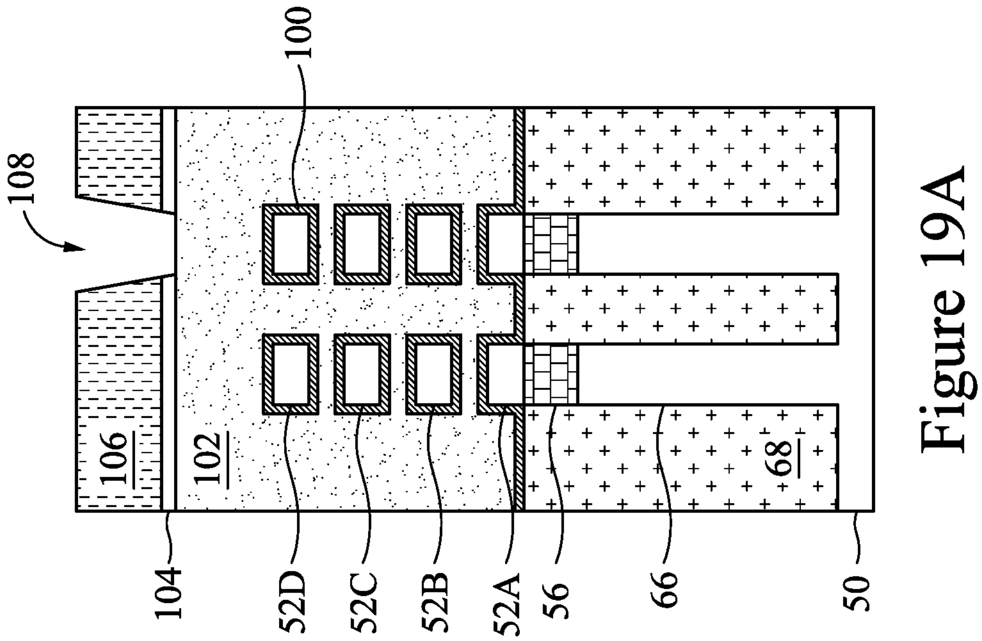
Figure 19C:
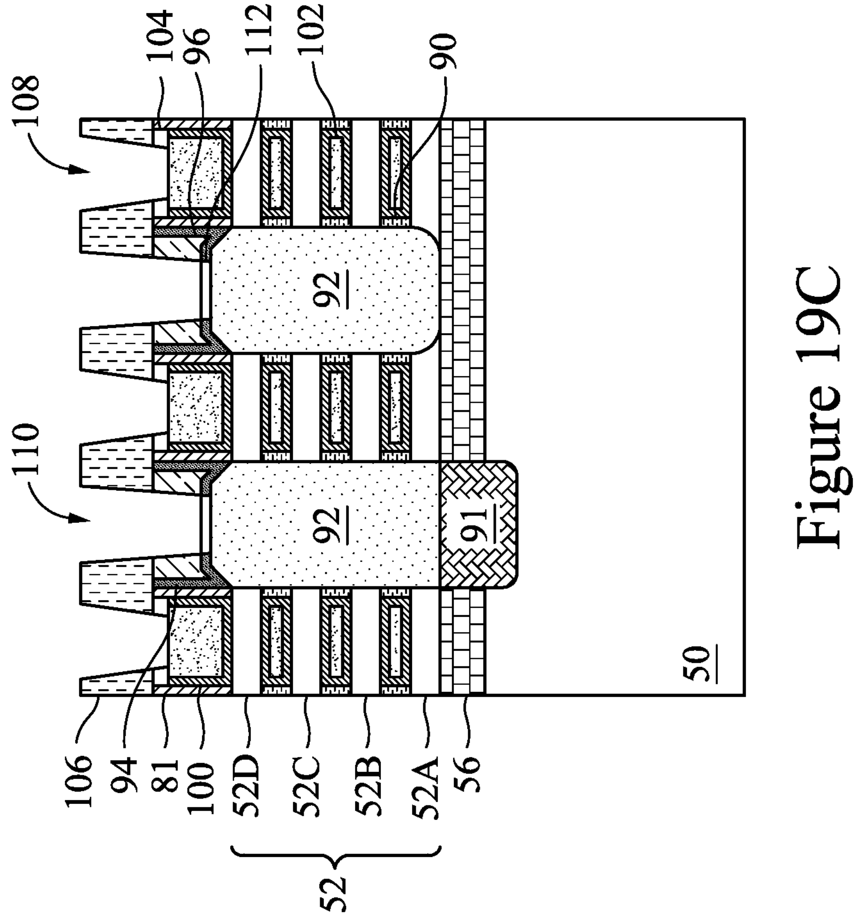

In FIGS. 19A through 19C, the second ILD 106 and the gate caps 104 are etched to form third recesses 108 exposing the gate structures and the second ILD 106, the first ILD 96, and the CESL 94 are etched to form fourth recesses 110 exposing the epitaxial source/drain regions 92. The third recesses 108 and the fourth recesses 110 may be formed by etching using an anisotropic etching process, such as RIE, NBE, or the like. The third recesses 108 and the fourth recesses 110 may be formed simultaneously or separately. In some embodiments, the third recesses 108 and the fourth recesses 110 may be etched through the second ILD 106 and the first ILD 96 using a first etching process; may be etched through the gate caps 104 using a second etching process; and may be etched through the CESL 94 using a third etching process. A mask, such as a photoresist, may be formed and patterned over the second ILD 106 to mask portions of the second ILD 106 from the first etching process and the second etching process. In some embodiments, the etching process may over-etch, and therefore, the third recesses 108 and the fourth recesses 110 may extend into the gate structures and/or the epitaxial source/drain regions 92. Bottom surfaces of the third recesses 108 and the fourth recesses 110 may be level with (e.g., at a same level, or having a same distance from the substrate 50), or lower than (e.g., closer to the substrate 50) top surfaces of the gate structures and/or the epitaxial source/drain regions 92. Although FIG. 19C illustrates the third recesses 108 and the fourth recesses 110 as exposing the gate structures and the epitaxial source/drain regions 92 in a same cross-section, in some embodiments, the gate structures and the epitaxial source/drain regions 92 may be exposed in different cross-sections, thereby reducing the risk of shorting subsequently formed contacts.

After the fourth recesses 110 are formed, first silicide regions 112 are formed over the epitaxial source/drain regions 92. In some embodiments, the first silicide regions 112 are formed by first depositing a metal (not separately illustrated) capable of reacting with the semiconductor materials of the underlying epitaxial source/drain regions 92 (e.g., silicon, silicon germanium, germanium, or the like) to form silicide or germanide regions. The metal may include nickel, cobalt, titanium, tantalum, platinum, tungsten, other noble metals, other refractory metals, rare earth metals or their alloys. The metal may be deposited over the exposed portions of the epitaxial source/drain regions 92, then a thermal anneal process may be performed to form the first silicide regions 112. The unreacted portions of the deposited metal are then removed by, e.g., an etching process. Although the first silicide regions 112 are referred to as silicide regions, the first silicide regions 112 may also be germanide regions, or silicon germanide regions (e.g., regions comprising silicon and germanium), or the like. In an embodiment, the first silicide regions 112 comprise TiSi, and have thicknesses ranging from about 2 nm to about 10 nm.

Figure 20B:
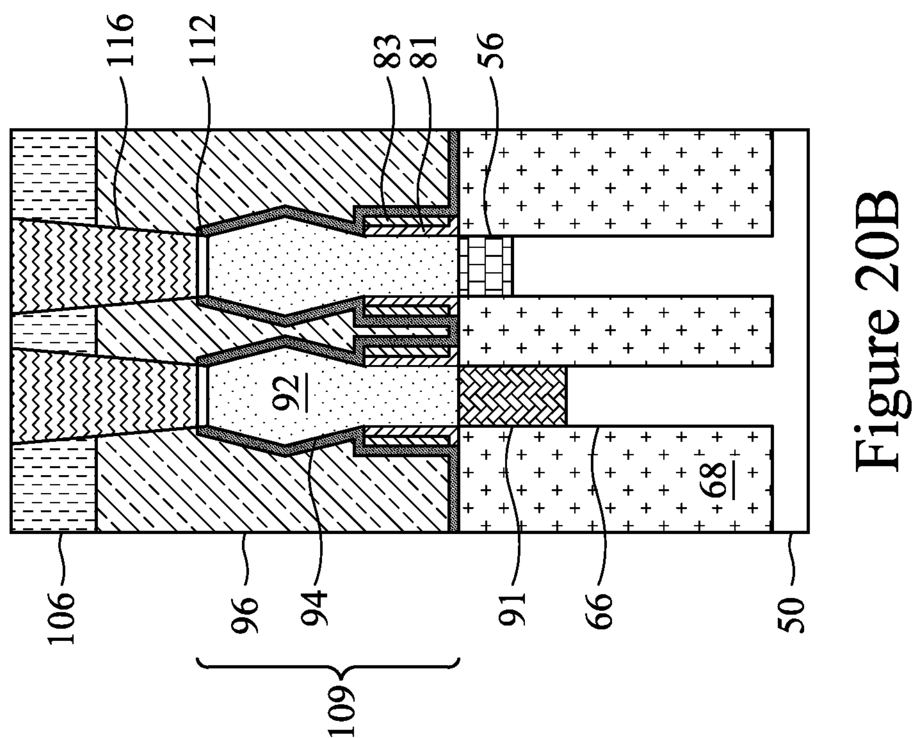
Figure 20A:
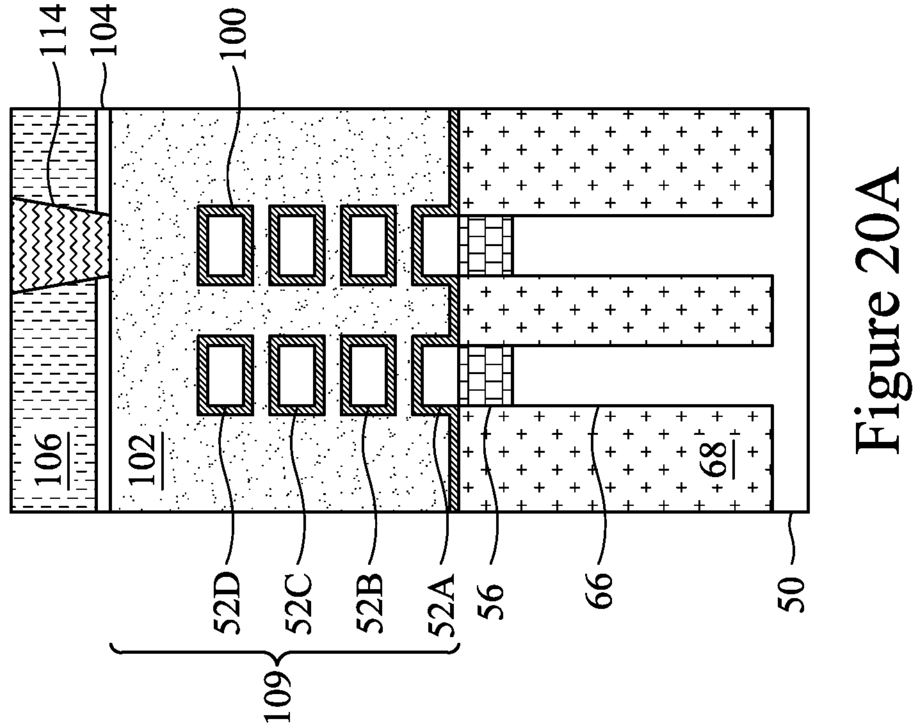
Figure 20C:
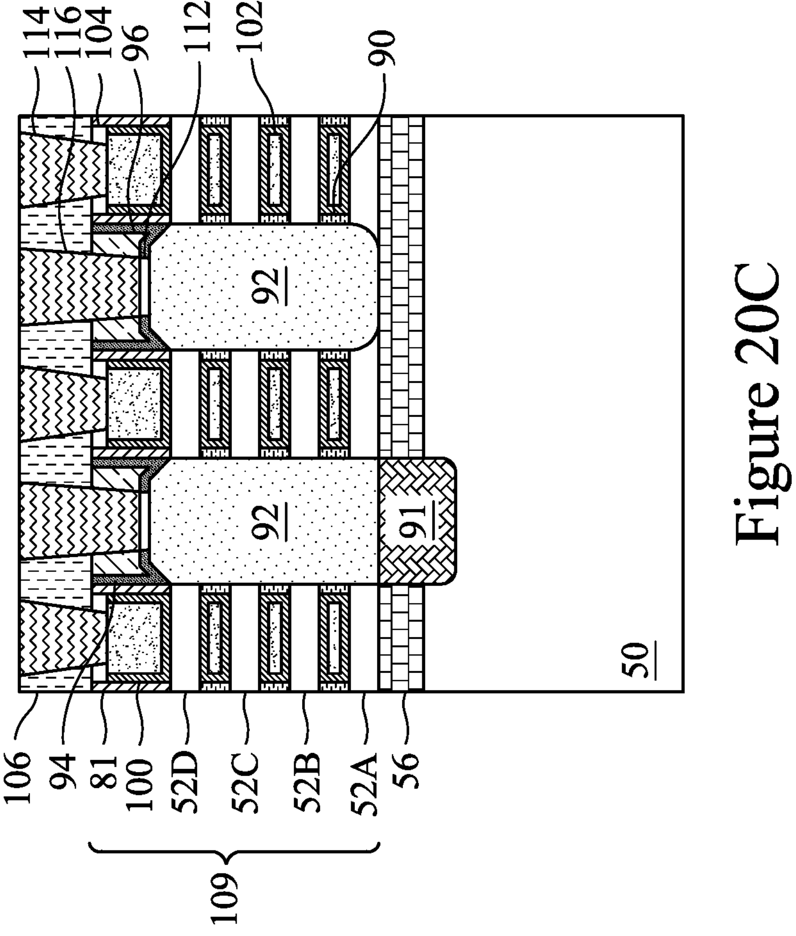

In FIGS. 20A through 20C, gate contacts 114 and source/drain contacts 116 (also referred to as contact plugs) are formed in the third recesses 108 and the fourth recesses 110, respectively. The gate contacts 114 and the source/drain contacts 116 may each comprise one or more layers, such as barrier layers, diffusion layers, and fill materials. For example, in some embodiments, the gate contacts 114 and the source/drain contacts 116 each include a barrier layer and a conductive material. The gate contacts 114 and the source/drain contacts 116 are each electrically coupled to the underlying conductive feature (e.g., the gate electrodes 102 or the first silicide regions 112 over the epitaxial source/drain regions 92 in the illustrated embodiment). The gate contacts 114 are electrically coupled to the gate electrodes 102, and the source/drain contacts 116 are electrically coupled to the first silicide regions 112 over the epitaxial source/drain regions 92. The barrier layer may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess portions of the gate contacts 114 and the source/drain contacts 116, which excess portions are over top surfaces of the second ILD 106.

The epitaxial source/drain regions 92, the first nanostructures 52, and the gate structures (including the gate dielectric layers 100 and the gate electrodes 102) may collectively be referred to as transistor structures 109. A first interconnect structure (such as the front-side interconnect structure 120, discussed below with respect to FIGS. 21A through 21C) may be formed over front-sides of the transistor structures 109 and a second interconnect structure (such as the backside interconnect structure 155, discussed below with respect to FIG. 26) may be formed over backsides of the transistor structures 109. Although the transistor structures 109 are described as including nano-FETs, other embodiments may include transistor structures 109 with different types of transistors (e.g., planar FETs, FinFETs, thin film transistors (TFTs), or the like).

Although FIGS. 20A through 20C illustrate a source/drain contact 116 extending to each of the epitaxial source/drain regions 92, the source/drain contacts 116 may be omitted from certain ones of the epitaxial source/drain regions 92. For example, as explained in greater detail below, conductive features (e.g., backside vias or power rails) may be subsequently attached through backsides of one or more of the epitaxial source/drain regions 92. For these particular epitaxial source/drain regions 92, the source/drain contacts 116 may be omitted or may be dummy contacts that are not electrically coupled to any overlying conductive lines (such as the conductive features 122, discussed below with respect to FIGS. 21A through 21C).

Figures 24A, 24B:
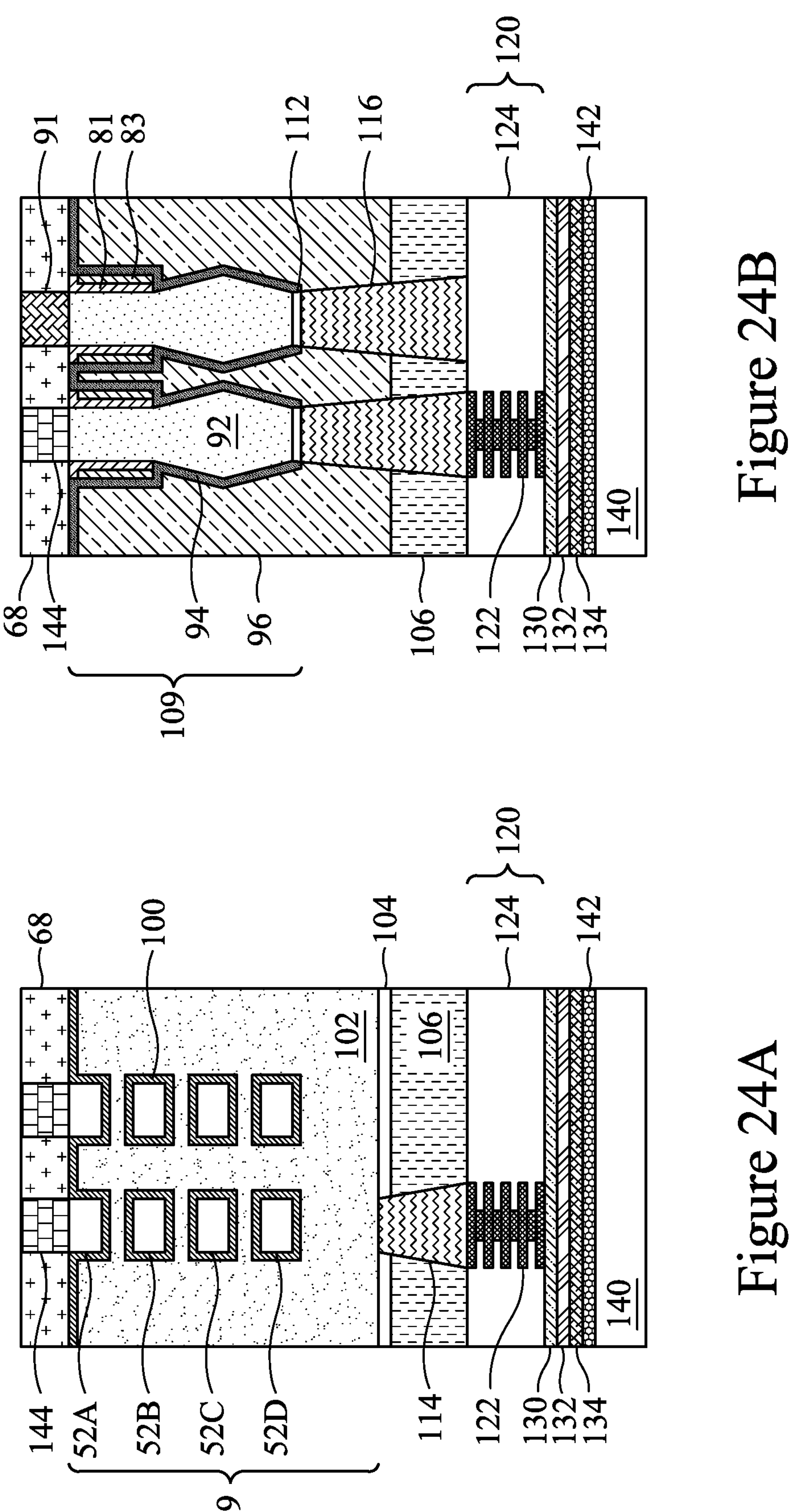
Figure 24C:
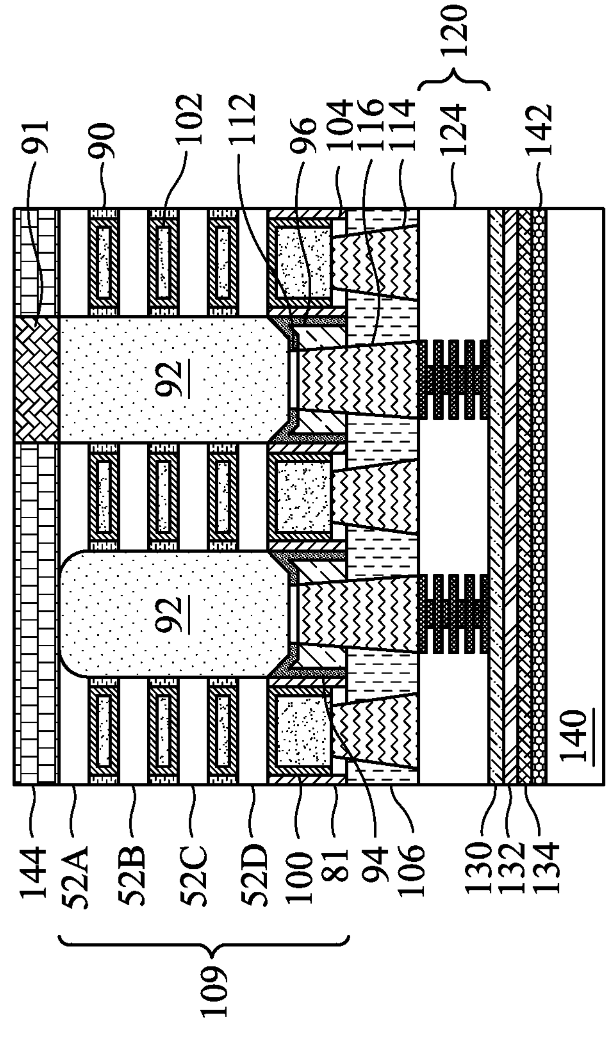
Figure 25B:
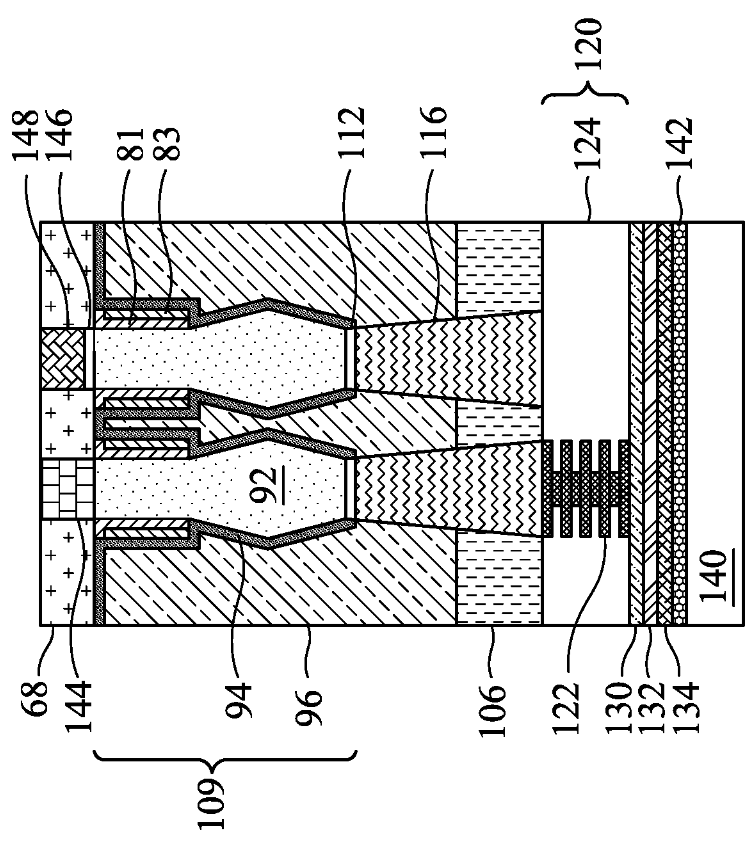
Figure 25A:
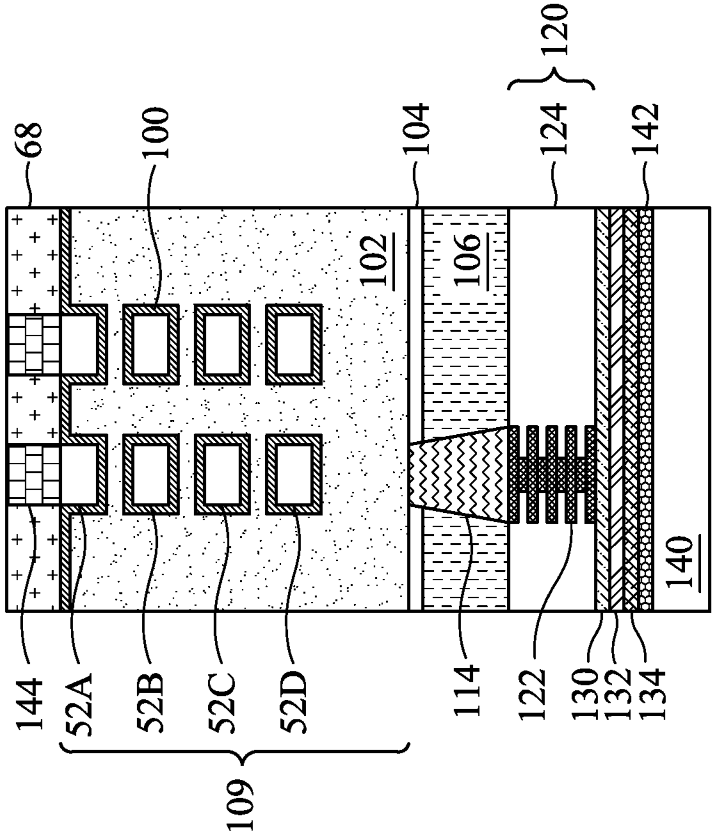
Figure 25C:
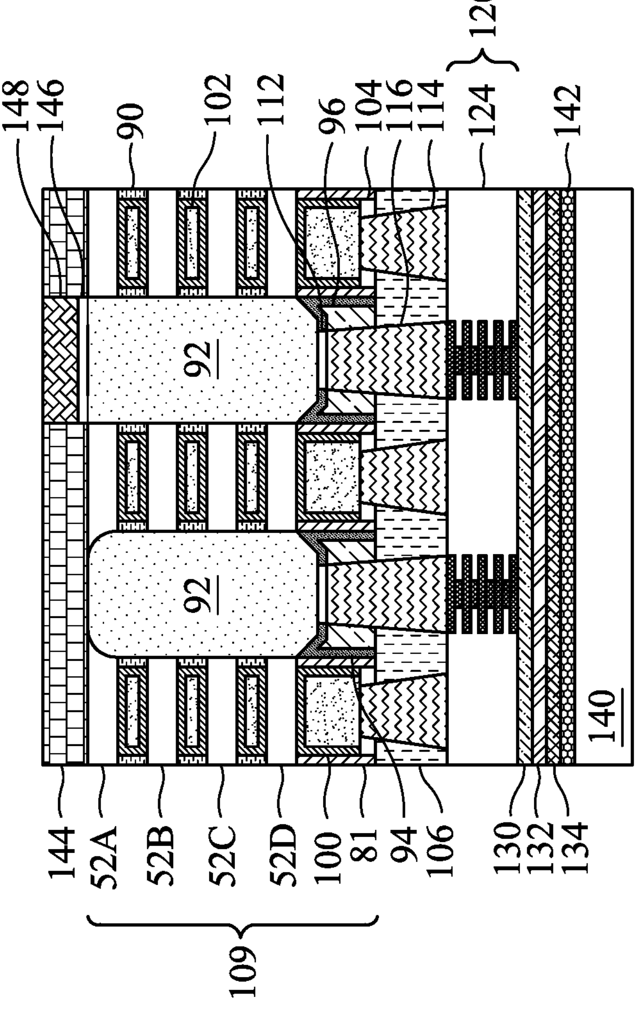
Figure 26:
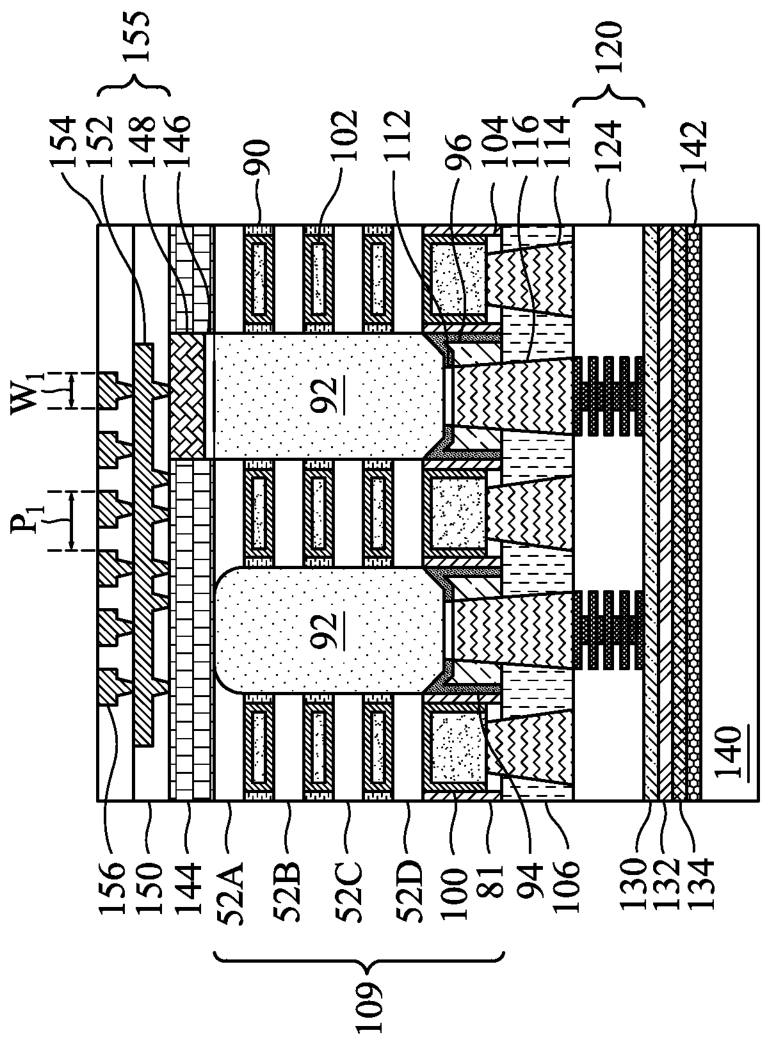

FIGS. 21A through 26 illustrate intermediate steps of forming front-side interconnect structures and backside interconnect structures on the transistor structures 109. The front-side interconnect structures and the backside interconnect structures may each comprise conductive features that are electrically coupled to the nano-FETs formed on the substrate 50. In FIGS. 21A through 25C, figures ending in "A" illustrate a cross-sectional view along line A-A' of FIG. 1, figures ending in "B" illustrate a cross-sectional view along line B-B' of FIG. 1, and figures ending in "C" illustrate a cross-sectional view along line C-C' of FIG. 1. FIG. 26 illustrates a cross-sectional view along line C-C' of FIG. 1. The process steps described in FIGS. 21A through 26 may be applied to both the n-type region 50N and the p-type region 50P. As noted above, a back-side conductive feature (e.g., a backside via or a power rail) may be coupled to one or more of the epitaxial source/drain regions 92. As such, the source/drain contacts 116 may be optionally omitted from the epitaxial source/drain regions 92.

Figure 21B:
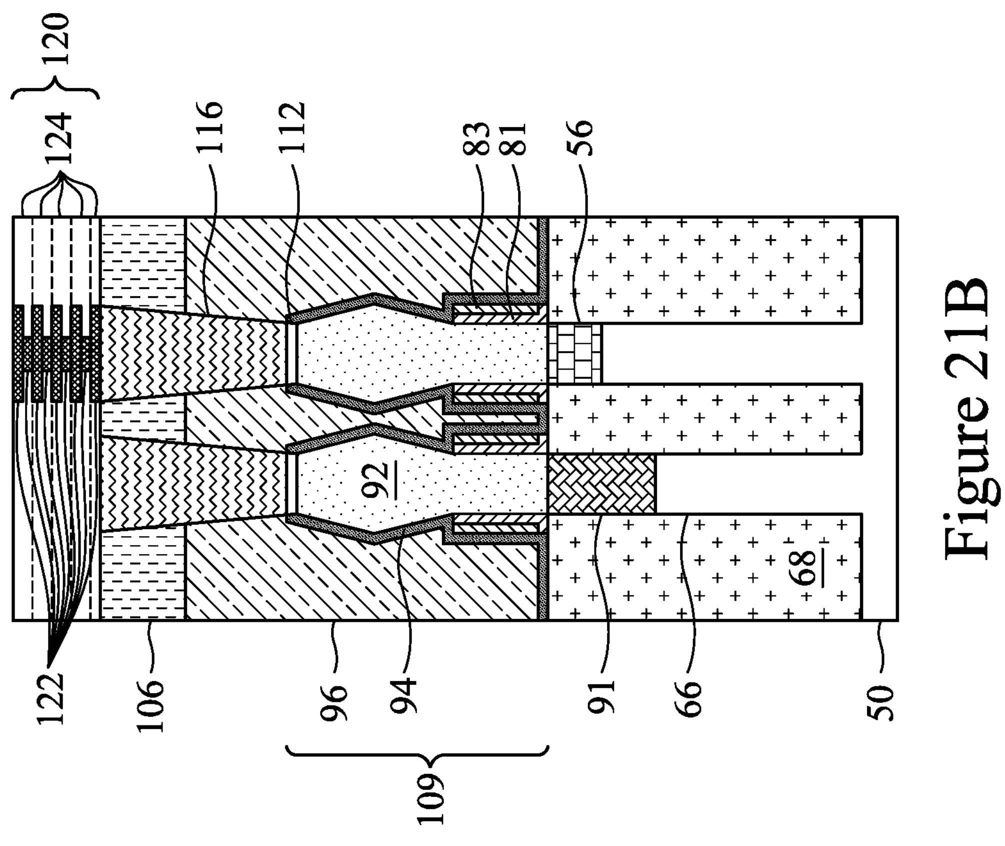
Figure 21A:
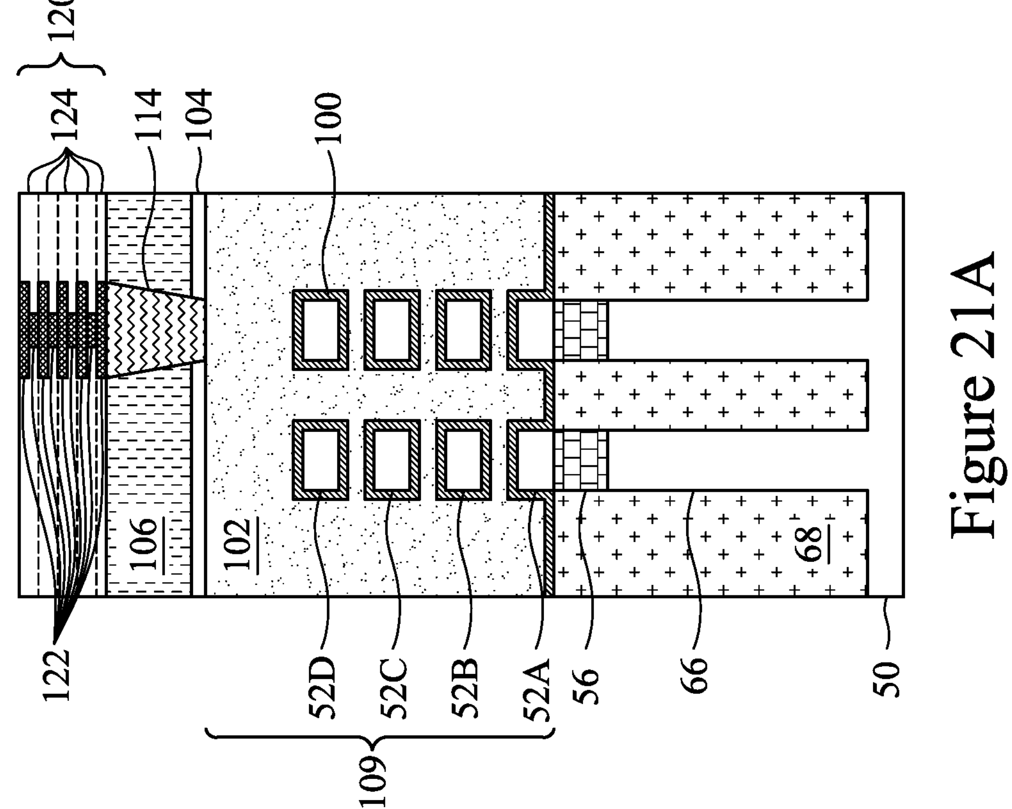
Figure 21C:
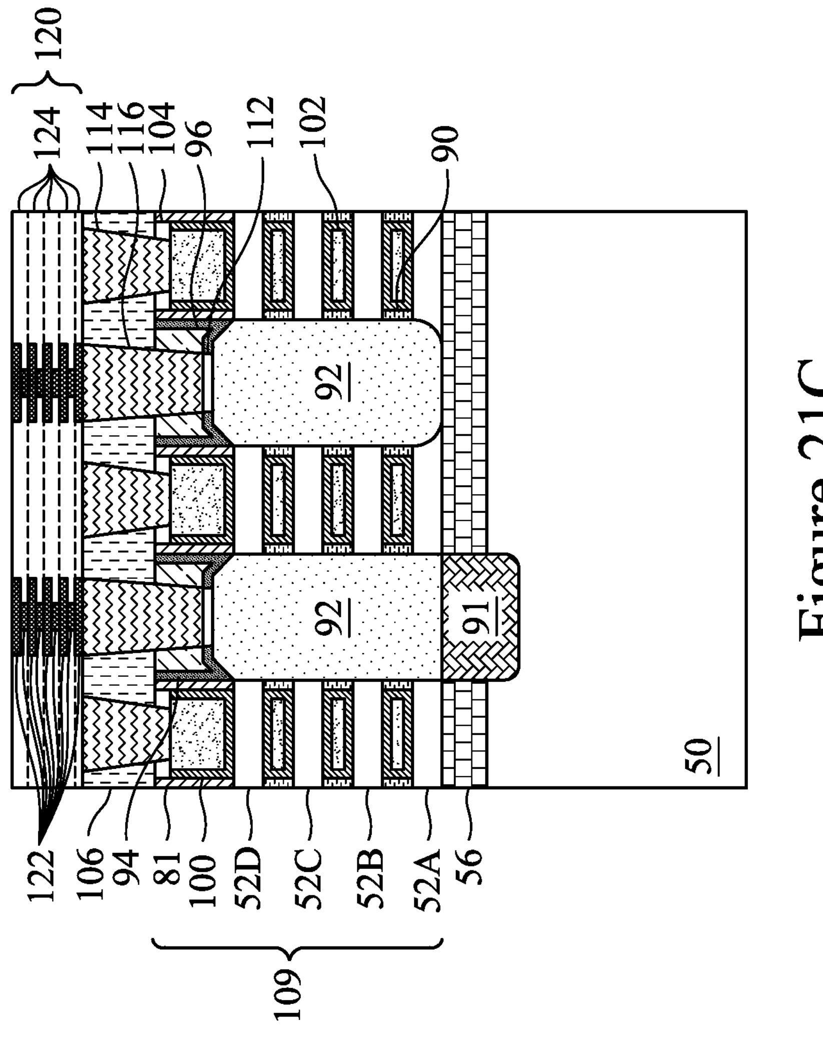

In FIGS. 21A through 21C, a front-side interconnect structure 120 is formed on the second ILD 106. The front-side interconnect structure 120 may be referred to as a front-side interconnect structure because it is formed on a front-side of the transistor structures 109 (e.g., a side of the transistor structures opposite the substrate 50 on which the transistor structures 109 are formed).

The front-side interconnect structure 120 may comprise one or more layers of conductive features 122 formed in one or more stacked dielectric layers 124. Each of the stacked dielectric layers 124 may comprise a dielectric material, such as a low-k dielectric material, an extra low-k (ELK) dielectric material, or the like. The dielectric layers 124 may be deposited using an appropriate process, such as, CVD, ALD, PVD, PECVD, or the like.

The conductive features 122 may comprise conductive lines and conductive vias interconnecting the layers of conductive lines. The conductive vias may extend through respective ones of the dielectric layers 124 to provide vertical connections between layers of the conductive lines. The conductive features 122 may be formed through any acceptable process, such as, a damascene process, a dual damascene process, or the like.

In some embodiments, the conductive features 122 may be formed using a damascene process in which a respective dielectric layer 124 is patterned utilizing a combination of photolithography and etching techniques to form trenches corresponding to the desired pattern of the conductive features 122. An optional diffusion barrier and/or optional adhesion layer may be deposited and the trenches may then be filled with a conductive material. Suitable materials for the barrier layer include titanium, titanium nitride, titanium oxide, tantalum, tantalum nitride, titanium oxide, combinations thereof, or the like, and suitable materials for the conductive material include copper, silver, gold, tungsten, aluminum, combinations thereof, or the like. In an embodiment, the conductive features 122 may be formed by depositing a seed layer of copper or a copper alloy, and filling the trenches by electroplating. A CMP process or the like may be used to remove excess conductive material from a surface of the respective dielectric layer 124 and to planarize surfaces of the dielectric layer 124 and the conductive features 122 for subsequent processing.

FIGS. 21A through 21C illustrate five layers of the conductive features 122 and the dielectric layers 124 in the front-side interconnect structure 120. However, it should be appreciated that the front-side interconnect structure 120 may comprise any number of conductive features 122 disposed in any number of dielectric layers 124. The front-side interconnect structure 120 may be electrically coupled to the gate contacts 118 and the source/drain contacts 116 to form functional circuits. In some embodiments, the functional circuits formed by the front-side interconnect structure 120 may comprise logic circuits, memory circuits, image sensor circuits, or the like.

Figure 22B:
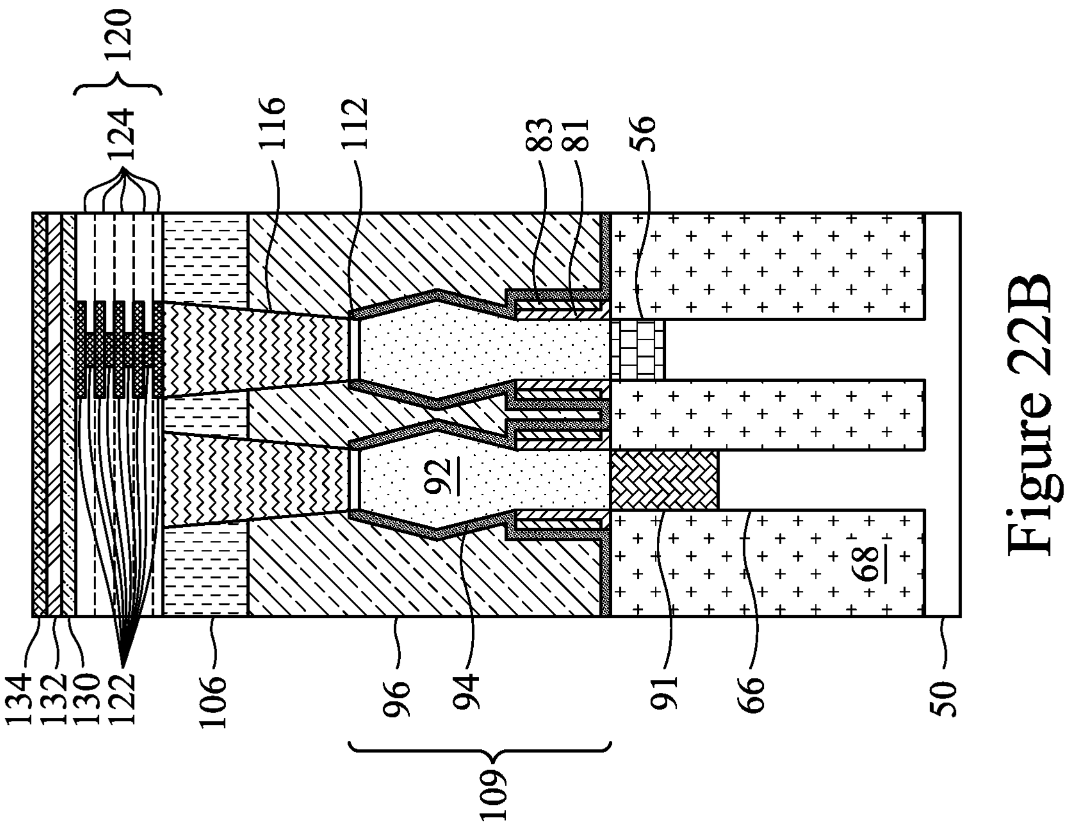
Figure 22A:
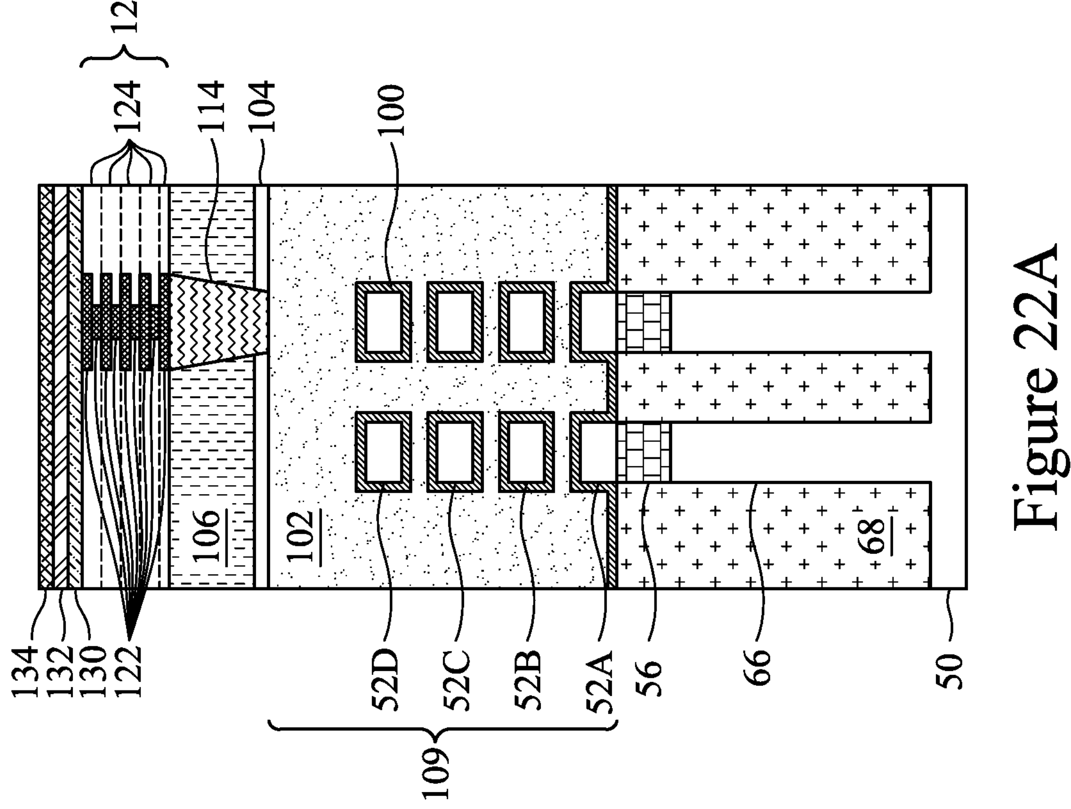
Figure 22C:
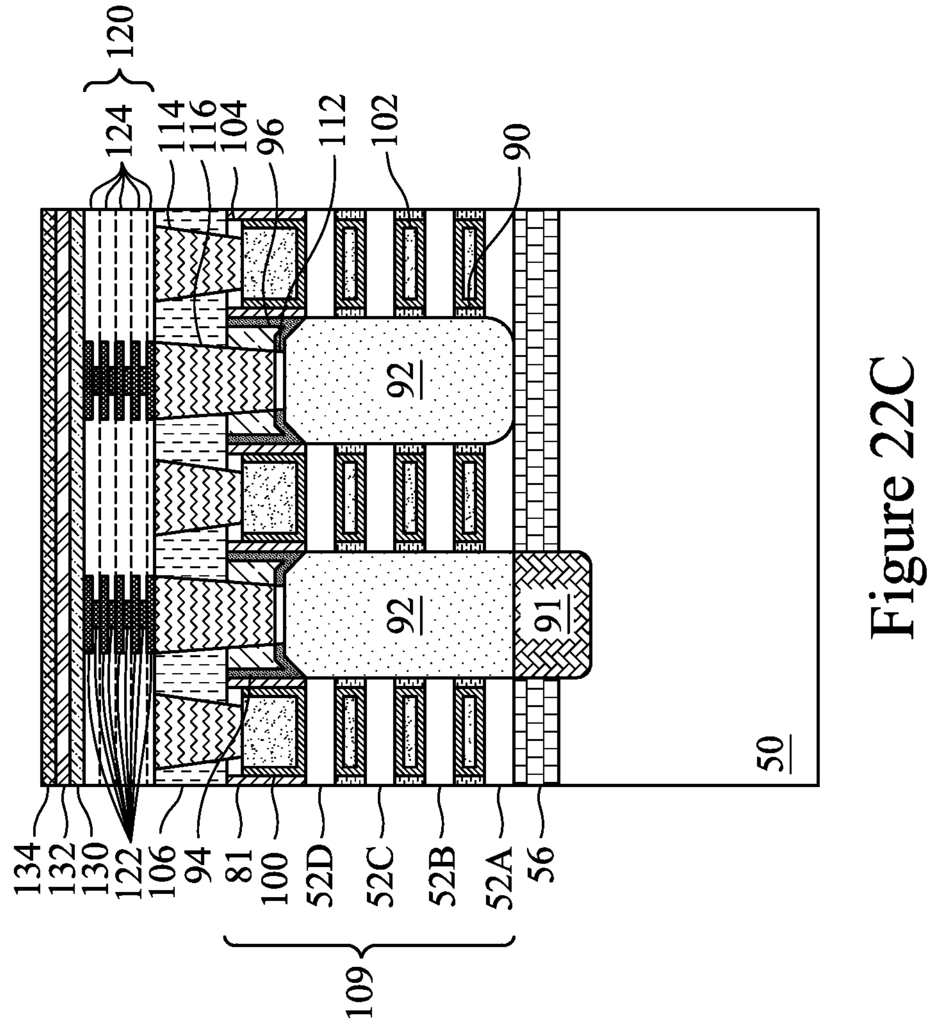

In FIGS. 22A through 22C, a first dielectric layer 130, a second dielectric layer 132, and a third dielectric layer 134 are formed over the front-side interconnect structure 120. Each of the first dielectric layer 130, the second dielectric layer 132, and the third dielectric layer 134 may comprise a dielectric material. The first dielectric layer 130, the second dielectric layer 132, and the third dielectric layer 134 may be deposited by CVD, ALD, PVD, or the like. Dielectric materials may include PSG, BSG, BPSG, USG, silicon nitride, silicon oxide, a high-density plasma (HDP) oxide, silicon oxynitride, or the like. In some embodiments, the first dielectric layer 130 may comprise USG, the second dielectric layer 132 may comprise silicon nitride, and the third dielectric layer 134 may comprise a HDP oxide.

Figures 23A, 23B:
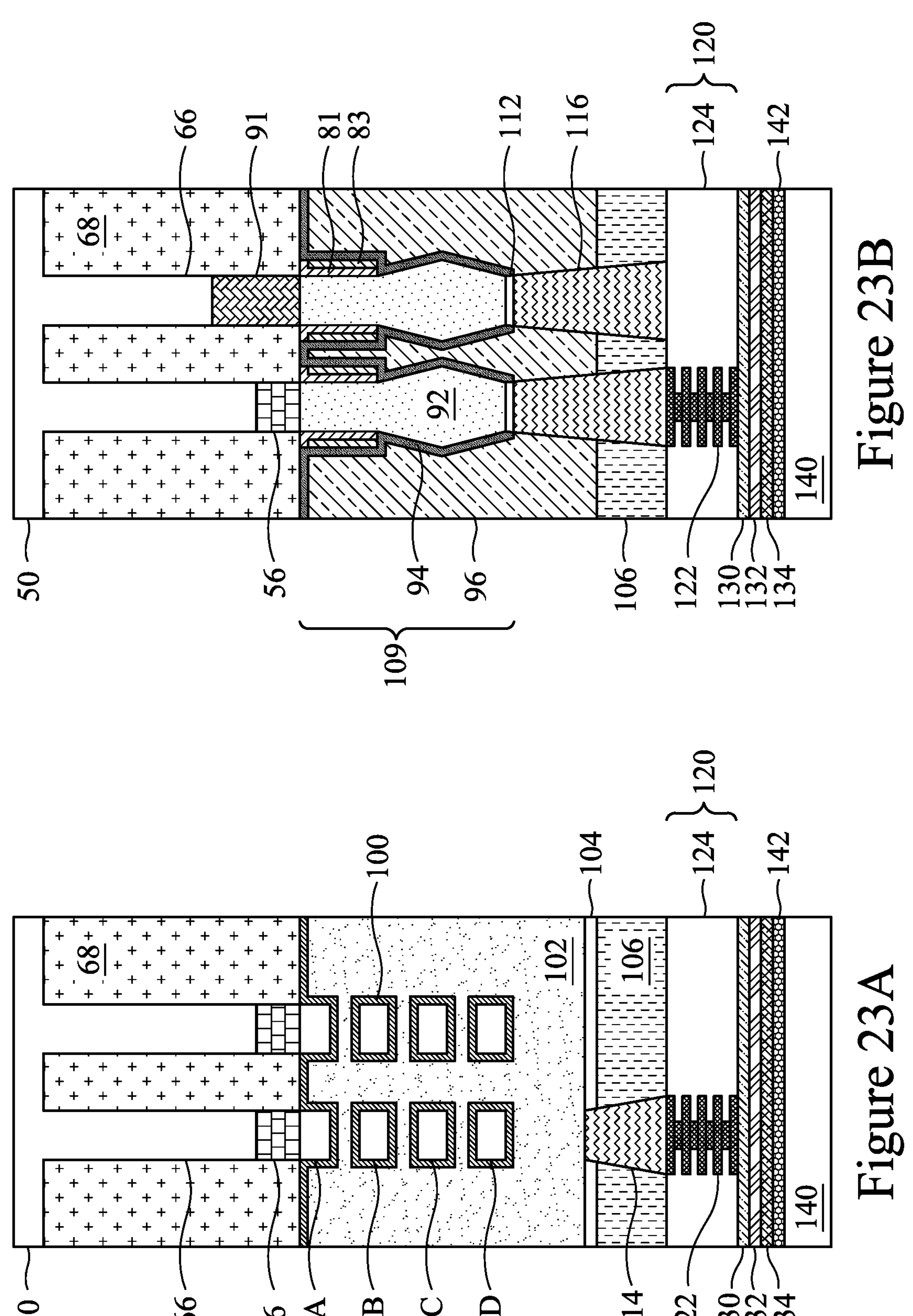
Figure 23C:
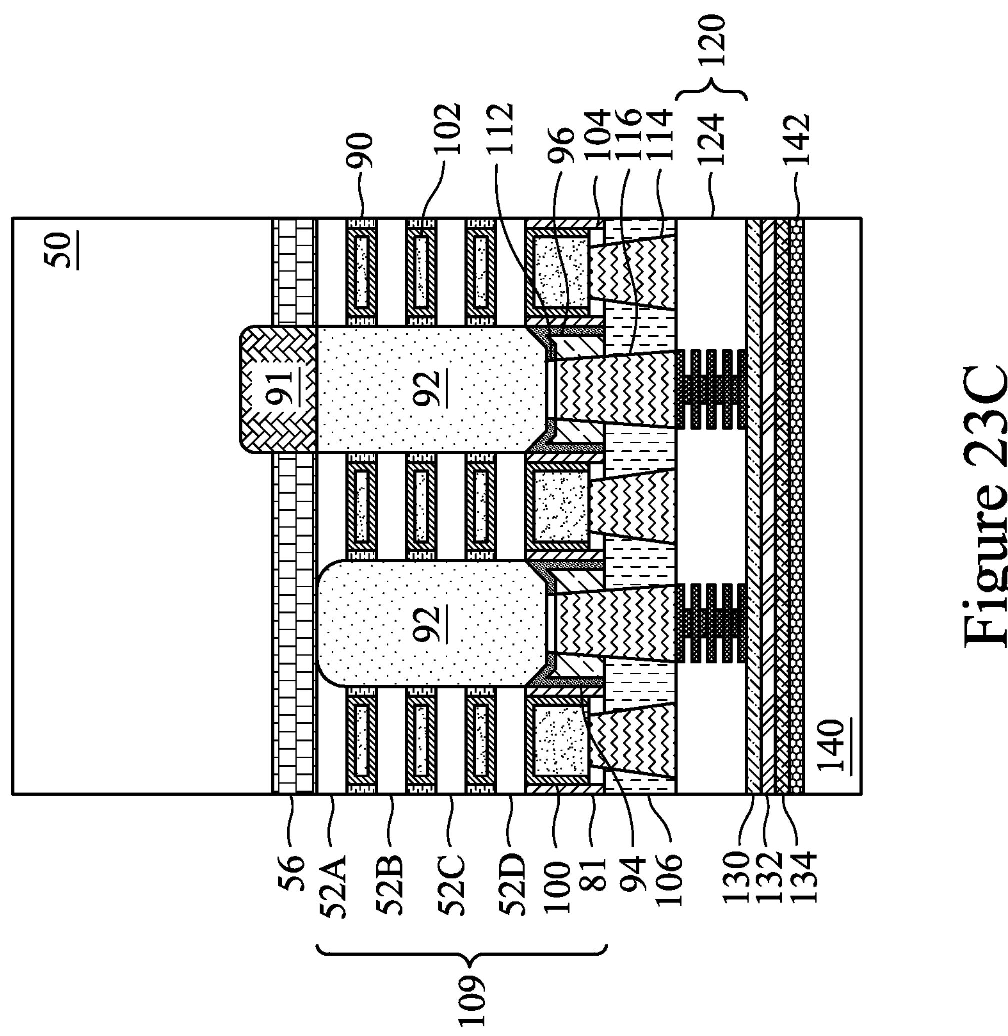

In FIGS. 23A through 23C, a carrier substrate 140 is bonded to the third dielectric layer 134 by a dielectric layer 142. The carrier substrate 140 may be a glass carrier substrate, a ceramic carrier substrate, a wafer (e.g., a silicon wafer), or the like. The carrier substrate 140 may provide structural support during subsequent processing steps and in the completed device. The dielectric layer 142 may be an oxide layer that is formed on a surface of the carrier substrate 140 prior to bonding using, for example, CVD, ALD, PVD, thermal oxidation, or the like. Other suitable materials may be used for the dielectric layer 142.

In various embodiments, the carrier substrate 140 may be bonded to the third dielectric layer 134 using a suitable technique, such as dielectric-to-dielectric bonding, or the like. The dielectric-to-dielectric bonding process may include applying a surface treatment to one or more of the third dielectric layer 134 and the dielectric layer 142. The surface treatment may include a plasma treatment. The plasma treatment may be performed in a vacuum environment. After the plasma treatment, the surface treatment may further include a cleaning process (e.g., a rinse with deionized water or the like) that may be applied to one or more of the third dielectric layer 134 and the dielectric layer 142. The carrier substrate 140 is then aligned with the third dielectric layer 134 and the two are pressed against each other to initiate a pre-bonding of the carrier substrate 140 to the third dielectric layer 134. The pre-bonding may be performed at room temperature (e.g., between about 21° C. and about 25° C.). After the pre-bonding, an annealing process may be applied by, for example, heating the third dielectric layer 134 and the carrier substrate 140 to a temperature of about 170° C.

Further in FIGS. 23A through 23C, after the carrier substrate 140 is bonded to the third dielectric layer 134, the device may be flipped such that a backside of the transistor structures 109 faces upwards. The backside of the transistor structures 109 may refer to a side opposite to the front-side of the transistor structures 109.

In FIGS. 24A through 24C, a thinning process may be applied to the backside of the substrate 50. The thinning process may comprise a planarization process (e.g., a mechanical grinding, a CMP, or the like), an etch-back process, a combination thereof, or the like. The thinning process may remove the substrate 50 and expose surfaces of the etch stop layer 56, the STI regions 68, and the first epitaxial materials 91 opposite the front-side interconnect structure 120. Following the thinning process, backside surfaces of the etch stop layer 56, the STI regions 68, and the first epitaxial materials 91 may be level with one another.

Further in FIGS. 24A through 24C, the etch stop layer 56 is removed and replaced by dielectric layers 144. The etch stop layer 56 may be removed using a suitable etch process, which may be an isotropic etch process, such as a wet etch. The etch process used to remove the etch stop layer 56 may have a high etch selectivity to the etch stop layer 56 as compared with the STI regions 68, the first nanostructures 52A, the first epitaxial materials 91, and the epitaxial source/drain regions 92, such that the etch stop layer 56 is removed without removing or damaging the STI regions 68, the first nanostructures 52A, the first epitaxial materials 91, and the epitaxial source/drain regions 92.

The dielectric layers 144 may be deposited over and in contact with surfaces of the STI regions 68, the first nanostructures 52A, the first epitaxial materials 91, and the epitaxial source/drain regions 92. The dielectric layers 144 may be formed of materials and in a manner the same as or similar to the first ILD 96, described above with respect to FIGS. 13A through 13C. A planarization process, such as a CMP, may be performed to remove excess portions of the dielectric layers 144, which excess portions are over top surfaces of the STI regions 68 and the first epitaxial materials 91. In some embodiments, a liner, which may be formed of materials and in a manner the same as or similar to the CESL 94, described above with respect to FIGS. 13A through 13C, may be deposited before forming the dielectric layers 144. In some embodiments, the etch stop layer 56 may be formed of a dielectric material. In such embodiments, the etch stop layer 56 may not be removed and may remain rather than being replaced by the dielectric layers 144.

In FIGS. 25A through 25C, the first epitaxial materials 91 are removed and replaced with second silicide regions 146 and backside vias 148. The first epitaxial materials 91 may be removed by a suitable etching process, which may be an isotropic etching process, such as a wet etching process. The etching process may have a high etch selectivity to materials of the first epitaxial materials 91. As such, the first epitaxial materials 91 may be removed without significantly removing materials of the STI regions 68, the dielectric layers 144, or the epitaxial source/drain regions 92. Recesses formed by removing the first epitaxial materials 91 may expose sidewalls of the STI regions 68 and the dielectric layers 144 and backside surfaces of the epitaxial source/drain regions 92.

Second silicide regions 146 may then be formed in the recesses on backsides of the epitaxial source/drain regions 92. The second silicide regions 146 may be similar to the first silicide regions 112, described above with respect to FIGS. 19A through 19C. For example, the second silicide regions 146 may be formed of a like material and using a like process as the first silicide regions 112.

Further in FIGS. 25A through 25C, backside vias 148 are formed in the recesses over the second silicide regions 146. The backside vias 148 may extend through the dielectric layers 144 and the STI regions 68, and may be electrically coupled to the epitaxial source/drain regions 92 through the second silicide regions 146. The backside vias 148 may be similar to the source/drain contacts 116, described above with respect to FIGS. 20A through 20C. For example, the backside vias 148 may be formed of a like material and using a like process as the source/drain contacts 116. The backside vias 148 may include copper, a copper alloy, silver, gold, tungsten, cobalt, aluminum, nickel, ruthenium, or the like. A planarization process, such as a CMP, may be performed to remove excess portions of the backside vias 148, which excess portions are over top surfaces of the STI regions 68 and the dielectric layers 144.

In FIG. 26, a backside interconnect structure 155 is formed over the STI regions 68, the dielectric layers 144, and the backside vias 148. The backside interconnect structure 155 may include a first dielectric layer 150, first conductive features 152, a second dielectric layer 154, and second conductive features 156. The first dielectric layer 150 may be formed of materials and in a manner the same as or similar to the dielectric layers 124, described above with respect to FIGS. 21A through 21C.

The first conductive features 152 are formed in the first dielectric layer 150. Forming the first conductive features 152 may include patterning recesses in the first dielectric layer 150 using a combination of photolithography and etching processes, for example. A pattern of the recesses in the first dielectric layer 150 may correspond to a pattern of the first conductive features 152. The first conductive features 152 are then formed by depositing a conductive material in the recesses. In some embodiments, the first conductive features 152 comprise a metal layer, which may be a single layer or a composite layer comprising a plurality of sub-layers formed of different materials. In some embodiments, the first conductive features 152 comprise copper, aluminum, cobalt, tungsten, titanium, tantalum, ruthenium, or the like. An optional diffusion barrier and/or optional adhesion layer may be deposited prior to filling the recesses with the conductive material. Suitable materials for the barrier layer/adhesion layer include titanium, titanium nitride, titanium oxide, tantalum, tantalum nitride, titanium oxide, or the like. The first conductive features 152 may be formed using, for example, CVD, ALD, PVD, plating or the like. The first conductive features 152 are electrically coupled to the epitaxial source/drain regions 92 through the backside vias 148 and the second silicide regions 146. A planarization process (e.g., a CMP, a grinding, an etch-back, or the like) may be performed to remove excess portions of the first conductive features 152 formed over the first dielectric layer 150.

In some embodiments, the first conductive features 152 are backside power rails, which are conductive lines that electrically couple the epitaxial source/drain regions 92 to a reference voltage, a supply voltage, or the like. By placing power rails on a backside of the resulting semiconductor die rather than on a front-side of the semiconductor die, advantages may be achieved. For example, a gate density of the nano-FETs and/or interconnect density of the front-side interconnect structure 120 may be increased. Further, the backside of the semiconductor die may accommodate wider power rails, reducing resistance and increasing efficiency of power delivery to the nano-FETs. For example, a width of the first conductive features 152 may be at least twice a width of first level conductive lines (e.g., the conductive features 122) of the front-side interconnect structure 120.

Remaining portions of a backside interconnect structure 155 are formed over the first dielectric layer 150 and the first conductive features 152. The backside interconnect structure 155 may comprise the first dielectric layer 150 and the first conductive features 152. The remaining portions of the backside interconnect structure 155 may comprise materials and be formed using processes the same as or similar to those used for the front-side interconnect structure 120, discussed above with respect to FIGS. 21A through 21C. In particular, the backside interconnect structure 155 may comprise stacked layers of second conductive features 156 formed in second dielectric layers 154 (only a single layer of the second conductive features 156 and the second dielectric layers 154 is illustrated in FIGS. 21A through 21C). The second conductive features 156 may include routing lines (e.g., for routing to and from subsequently formed contact pads and external connectors). The second conductive features 156 may further be patterned to include one or more embedded passive devices such as, resistors, capacitors, inductors, or the like. The embedded passive devices may be integrated with the first conductive features 152 (e.g., the power rail) to provide circuits (e.g., power circuits) on the backside of the nano-FETs.

In some embodiments, the backside interconnect structure 155 may include from one to three metal layers. For example, in some embodiments, the second conductive features 156 formed in the second dielectric layers 154 may be omitted and, in some embodiments, additional layers of the second conductive features 156 formed in the second dielectric layers 154 may be formed. In the embodiment illustrated in FIG. 26, the second conductive features 156 are in a top metal layer of the backside interconnect structure. The second conductive features 156 may have widths $W_1$ ranging from about 20 nm to about 100 nm, and pitches $P_1$ ranging from about 500 nm to about 2 μm. As will be discussed in greater detail below with respect to FIG. 32, the second conductive features 156 may have critical dimensions less than critical dimensions of conductive features of a capacitor structure which are bonded to the second conductive features 156. This aids in aligning the conductive features of the capacitor structure with the second conductive features 156, which improves device performance and reduces device defects.

Figure 27:
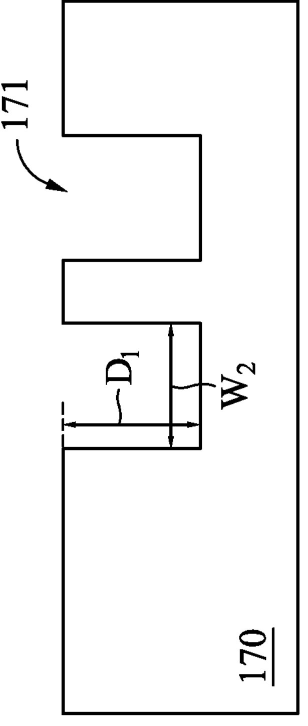

FIGS. 27 through 30D illustrate intermediate steps of forming a capacitor on a carrier substrate. In FIG. 27, a substrate 170 is provided. The substrate 170 may be a carrier substrate, such as a glass carrier substrate, a ceramic carrier substrate, or the like. The substrate 170 may be a wafer, such that multiple capacitors can be formed on the substrate 170 simultaneously.

Recesses 171 may be formed in the substrate 170. The recesses 171 may be formed using anisotropic etching processes, such as RIE, NBE, or the like. The etching processes may include forming a patterned etching mask (not separately illustrated), such as a patterned photoresist, and then etching the substrate 170 using the patterned photoresist as a mask. The patterned etching mask is then removed. Timed etching processes may be used to stop the etching after the recesses 171 reach desired depths. The recesses 171 may have widths $W_2$ ranging from about 50 nm to about 500 nm and depths Di ranging from about 1 μm to about 8 μm.

Figure 28:
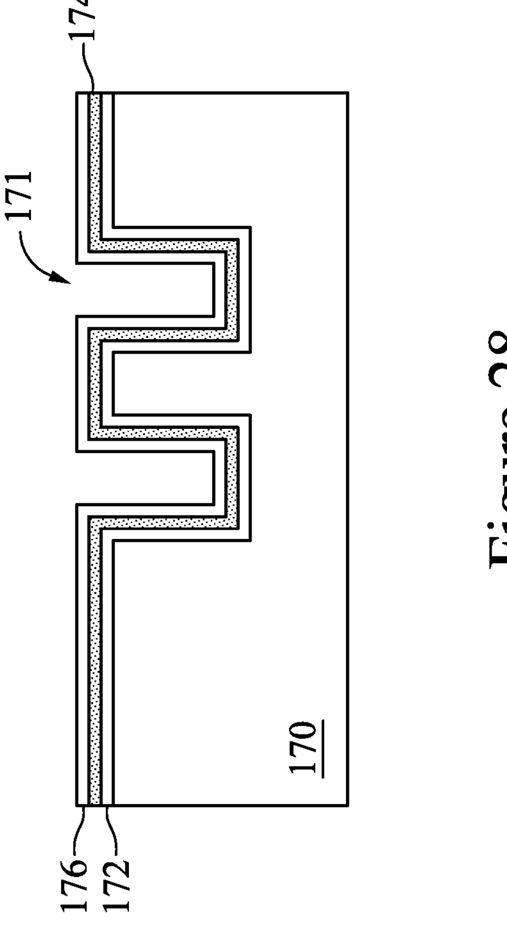

In FIG. 28, a first conductive layer 172, a first dielectric layer 174, and a second conductive layer 176 are deposited over the substrate 170 and in the recesses 171. The first conductive layer 172 and the second conductive layer 176 may comprise tungsten, titanium nitride, silicon, tantalum nitride, combinations or multiple layers thereof, or the like. The first dielectric layer 174 may comprise hafnium oxide, silicon oxide, zirconium oxide, titanium oxide, combinations or multiple layers thereof, or the like. The first conductive layer 172 may have a thickness ranging from about 40 nm to about 80 nm; the first dielectric layer 174 may have a thickness ranging from about 5 nm to about 15 nm; and the second conductive layer 176 may have a thickness ranging from about 40 nm to about 80 nm. The first conductive layer 172, the first dielectric layer 174, and the second conductive layer 176 may be formed using CVD, ALD, PVD, or the like.

Figure 29:
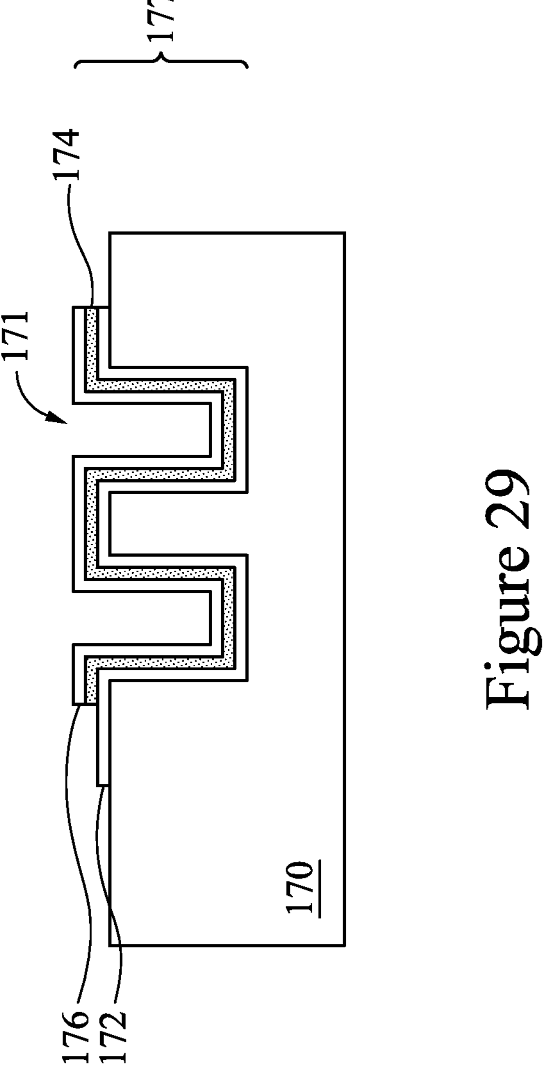

In FIG. 29, the first conductive layer 172, the first dielectric layer 174, and the second conductive layer 176 are etched to trim the first conductive layer 172, the first dielectric layer 174, and the second conductive layer 176 and to expose a surface of the first conductive layer 172. The first conductive layer 172, the first dielectric layer 174, and the second conductive layer 176 may be etched using anisotropic etching processes, such as RIE, NBE, or the like. The etching processes may include forming one or more patterned etching masks (not separately illustrated), such as patterned photoresists, and then etching the first conductive layer 172, the first dielectric layer 174, and the second conductive layer 176 using the patterned photoresists as masks. The patterned etching masks are then removed. Because the first conductive layer 172, the first dielectric layer 174, and the second conductive layer 176 are formed of different materials, etchants used to remove exposed portions of these layers may be different. In some embodiments, the first dielectric layer 174 acts as an etch stop layer while etching the second conductive layer 176, the first conductive layer 172 acts as an etch stop layer while etching the first dielectric layer 174, and the substrate 170 acts as an etch stop layer while etching the first conductive layer 172. A first patterned photoresist may be used to etch the second conductive layer 176 and the first dielectric layer 174, and a second patterned photoresist may be used to etch the first conductive layer 172. The first conductive layer 172, the first dielectric layer 174, the second conductive layer 176 may function as a capacitor 177 and may be collectively referred to as a "capacitor."

Figure 30A:
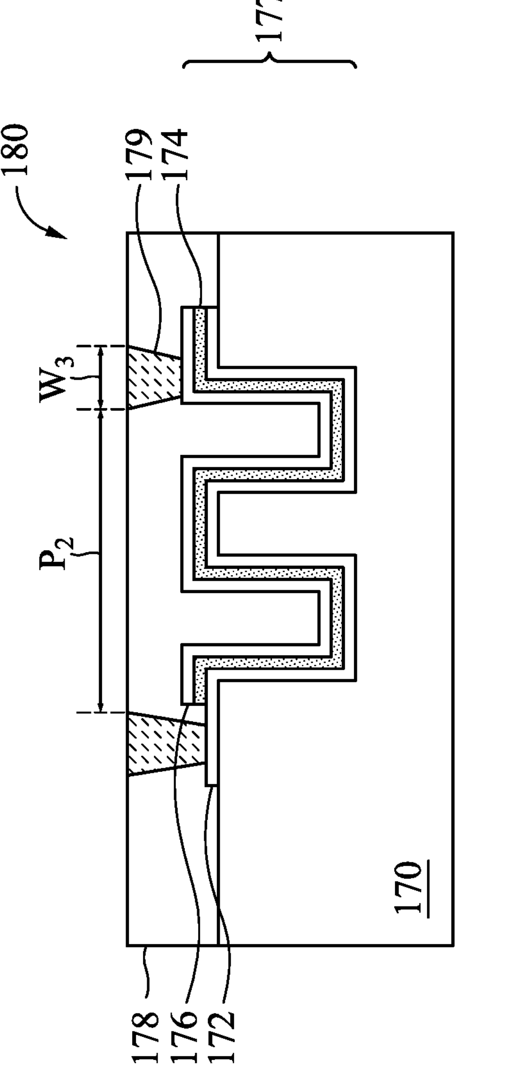
Figure 30B:
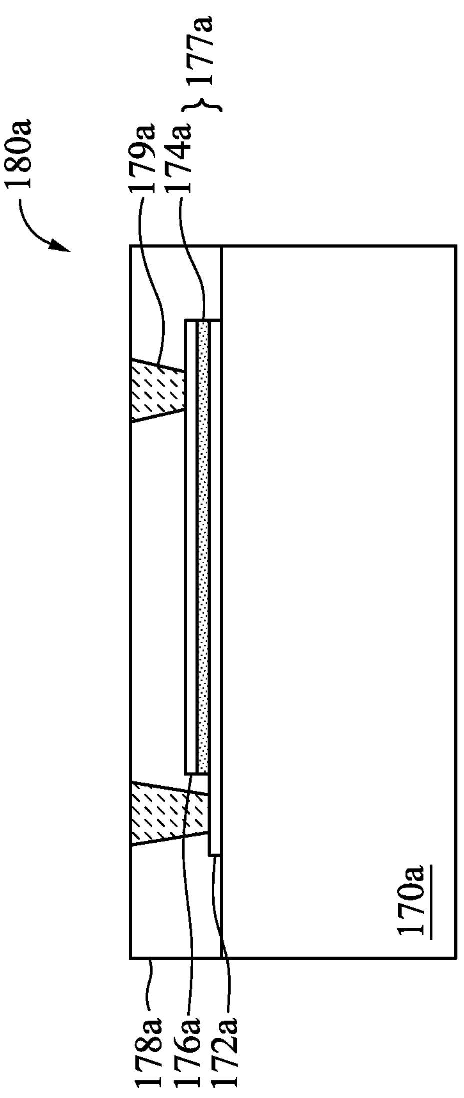
Figure 30C:
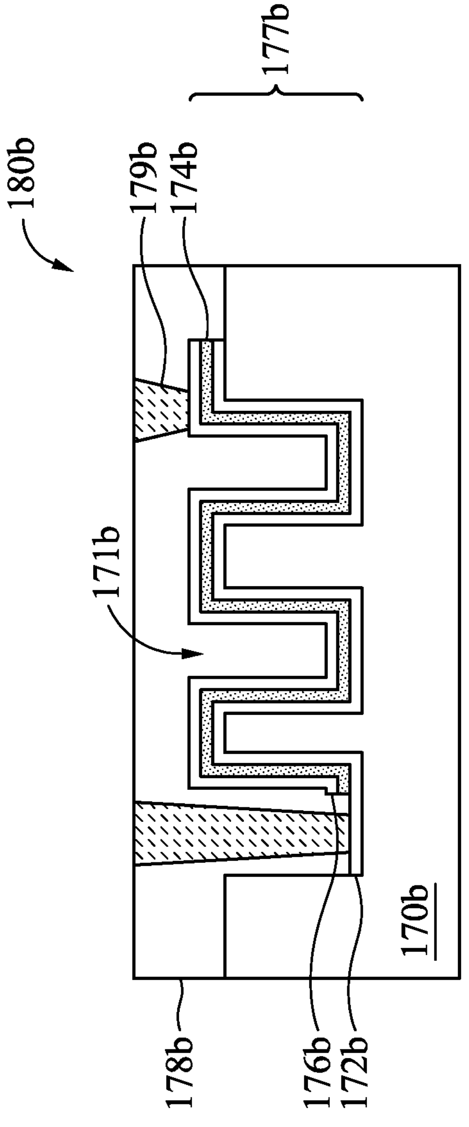
Figure 30D:
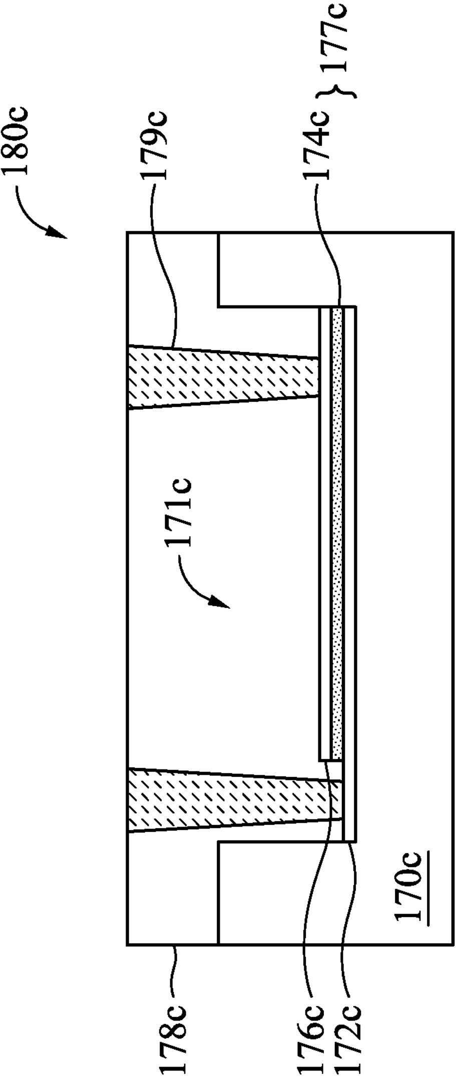

In FIG. 30A, a dielectric layer 178 and capacitor contacts 179 are formed over the structure of FIG. 29 to form a capacitor structure 180. The substrate 170, the first conductive layer 172, the first dielectric layer 174, the second conductive layer 176, the dielectric layer 178, and the capacitor contacts 179 may collectively be referred to as the capacitor structure 180. FIGS. 30B through 30D illustrate capacitor structures according to several alternative embodiments. The dielectric layer 178 may be formed of a dielectric material, and may be deposited by any suitable method, such as CVD, PECVD, or FCVD. Dielectric materials may include silicon nitride, silicon oxide, silicon oxynitride, PSG, BSG, BPSG, USG, or the like. Other insulation materials formed by any acceptable process may be used.

The dielectric layer 178 may be etched to form recesses (not separately illustrated) exposing the first conductive layer 172 and the second conductive layer 176. The recesses may be formed by etching using an anisotropic etching process, such as RIE, NBE, or the like. The recesses exposing the first conductive layer 172 and the second conductive layer 176 may be formed simultaneously or separately. A mask, such as a photoresist, may be formed and patterned over the dielectric layer 178 to mask portions of the dielectric layer 178 from the etching process.

The capacitor contacts 179 are then formed in the recesses exposing the first conductive layer 172 and the second conductive layer 176. The capacitor contacts 179 may comprise one or more layers, such as barrier layers, diffusion layers, and fill materials. For example, in some embodiments, the capacitor contacts 179 include a barrier layer and a conductive material (not separately illustrated). The capacitor contacts 179 are electrically coupled to and in physical contact with the underlying conductive layers (e.g., the first conductive layer 172 and the second conductive layer 176). The barrier layer may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess portions of the capacitor contacts 179, which excess portions are over top surfaces of the dielectric layer 178. The capacitor contacts 179 may have widths $W_3$ ranging from about 100 nm to about 300 nm, and pitches $P_2$ ranging from about 3 μm to about 5 μm. The capacitor contacts 179 may have critical dimensions greater than critical dimensions of the second conductive features 156 to which the capacitor contacts 179 will be subsequently bonded (discussed below with respect to FIG. 31). For example, a ratio of the widths $W_3$ of the capacitor contacts 179 to the widths $W_1$ of the second conductive features 156 may range from about 5 to about 10. This aids in aligning the capacitor contacts 179 with the second conductive features 156, which reduces device defects and improves device performance.

Forming the capacitor 177 in the recesses 171 increases the area and capacitance of the capacitor 177, without increasing the area of the substrate 170 occupied by the capacitor 177 (e.g., increases the density of the capacitors 177). For example, the capacitor 177 may have a capacitance density of greater than about 100 $nF/mm^2$, which results in devices with greater speed and improved performance. Moreover, the capacitor 177 may be formed in the substrate 170, which is conventionally bonded to a semiconductor device, then removed. Forming the capacitor 177 in the substrate 170 utilizes the substrate 170, rather than wasting the substrate 170. Thus waste is reduced, a larger capacitor 177 is achieved, and additional steps are minimized.

In the embodiment illustrated in FIG. 30B, the processes used to form the recesses 171 are omitted and a capacitor 177*a* (including a first conductive layer 172*a*, a first dielectric layer 174*a*, and a second conductive layer 176*a*) is formed on a planar top surface of a substrate 170*a*. A dielectric layer 178*a* and capacitor contacts 179*a* are formed over the substrate 170*a*. The processes described with respect to FIG. 27 may be omitted, and the processes described in FIGS. 28 through 30A may be performed to form a capacitor structure 180*a*. The capacitor structure 180*a* may be formed in fewer steps than the capacitor structure 180 and with a thinner substrate 170*a* than the capacitor structure 180. Forming the capacitor structure 180*a* in fewer steps may reduce device defects. The substrate 170*a*, the first conductive layer 172*a*, the first dielectric layer 174*a*, the second conductive layer 176*a*, the dielectric layer 178*a*, and the capacitor contacts 179*a* may be the same as or similar to components of the capacitor structure 180, described above.

In the embodiment illustrated FIG. 30C, three recesses 171*b* are formed in a substrate 170*b* and a capacitor 177*b* (including a first conductive layer 172*b*, a first dielectric layer 174*b*, and a second conductive layer 176*b*) is formed in the recesses 171*b*. A dielectric layer 178*b* is formed over the substrate 170*b* and the capacitor 177*b* and filling the recesses 171*b*. Capacitor contacts 179*b* are formed extending through the dielectric layer 178*b* to contact the capacitor 177*b*, with one of the capacitor contacts 179*b* extending into one of the recesses 171*b*. In some embodiments, both of the capacitor contacts 179*b* may extend into the recesses 171*b*. Processes similar to or the same as those described with respect to FIG. 27 may be used to form the recesses 171*b*, followed by processes similar to or the same as those described with respect to FIGS. 28 through 30A, which form a capacitor structure 180*b*. Increasing the number of recesses 171*b* in which the capacitor 177*b* is formed may further increase the capacitance density, increase speed, and increase device performance. Any number of recesses 171*b* may be provided. The substrate 170*b*, the first conductive layer 172*b*, the first dielectric layer 174*b*, the second conductive layer 176*b*, the dielectric layer 178*b*, and the capacitor contacts 179*b* may be the same as or similar to components of the capacitor structure 180, described above.

In the embodiment illustrated in FIG. 30D, a capacitor 177*c* (including a first conductive layer 172*c*, a first dielectric layer 174*c*, and a second conductive layer 176*c*) is formed in a recess 171*c* formed in a substrate 170*c*. A dielectric layer 178*c* is formed over the substrate 170*c* and the capacitor 177*c* and filling the recess 171*c*. Capacitor contacts 179*c* are formed extending through the dielectric layer 178*c* to contact the capacitor 177*c*, with both of the capacitor contacts 179*c* extending into the recess 171*c*. Processes similar to or the same as those described with respect to FIG. 27 may be used to form the recess 171*c*, followed by processes similar to or the same as those described with respect to FIGS. 28 through 30A, which form a capacitor structure 180*c*. Forming the capacitor structure 180*c* with the capacitor 177*c* disposed in the recess 171*c* may increase a distance between the capacitor and a transistor structure to which the capacitor structure 180*c* is subsequently bonded. The substrate 170*c*, the first conductive layer 172*c*, the first dielectric layer 174*c*, the second conductive layer 176*c*, the dielectric layer 178*c*, and the capacitor contacts 179*c* may be the same as or similar to components of the capacitor structure 180, described above.

Figure 31:
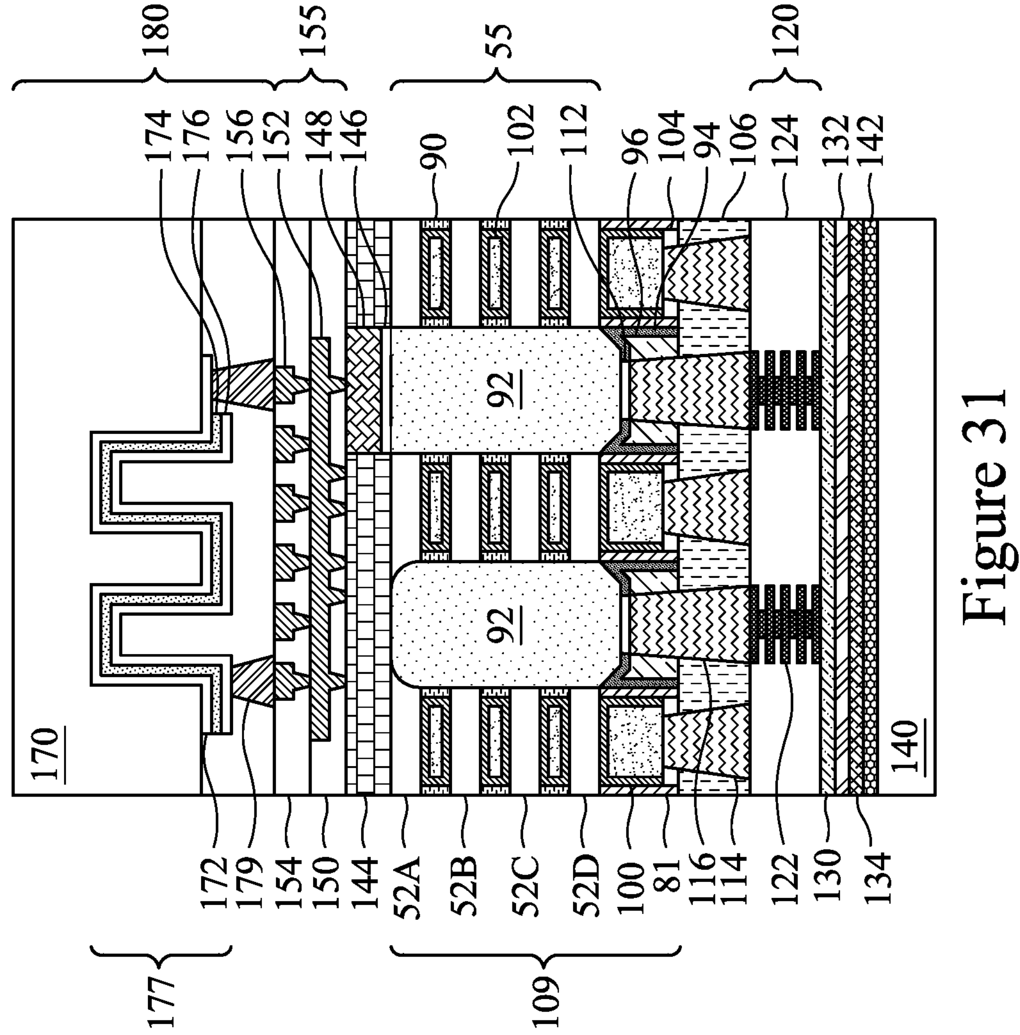

In FIG. 31, the capacitor structure 180 is bonded to the backside interconnect structure 155 over the transistor structures 109. In some embodiments, the capacitor structure 180 may be bonded to the backside interconnect structure 155 by hybrid bonding. For example, the dielectric layer 178 of the capacitor structure 180 may be directly bonded to the second dielectric layer 154 of the backside interconnect structure 155, and the capacitor contacts 179 of the capacitor structure 180 may be directly bonded to the second conductive features 156 of the backside interconnect structure 155. In an embodiment, the bond between the dielectric layer 178 and the second dielectric layer 154 may be an oxide-to-oxide bond, or the like. The hybrid bonding process directly bonds the capacitor contacts 179 of the capacitor structure 180 to the second conductive features 156 of the backside interconnect structure 155 through direct metal-to-metal bonding. Thus, electrical connection between the capacitor structure 180 and the transistor structures 109 through the backside interconnect structure is provided by the physical connection of the capacitor contacts 179 to the second conductive features 156.

As an example, the hybrid bonding process may start by applying a surface treatment to the dielectric layer 178 of the capacitor structure 180 and/or the second dielectric layer 154 of the backside interconnect structure 155. The surface treatment may include a plasma treatment. The plasma treatment may be performed in a vacuum environment. After the plasma treatment, the surface treatment may further include a cleaning process (e.g., a rinse with deionized water or the like) that may be applied to the dielectric layer 178 and/or the second dielectric layer 154. The hybrid bonding process may then proceed to aligning the capacitor contacts 179 to the second conductive features 156. In some embodiments, centerlines of the capacitor contacts 179 may be misaligned from centerlines of the second conductive features. For example, centerlines of the capacitor contacts 179 may be misaligned from centerlines of the second conductive features by a distance ranging from about 50 nm to about 100 nm. Forming the second conductive features 156 with critical dimensions less than critical dimensions of the capacitor contacts 179 helps ensure good contact between the capacitor contacts 179 and the conductive features 156, even when centerlines of the capacitor contacts 179 are misaligned from centerlines of the second conductive features, which reduces device defects and improves device performance. Next, the hybrid bonding includes a pre-bonding step, during which the capacitor contacts 179 are brought into physical contact with the second conductive features 156. The pre-bonding may be performed at room temperature (e.g., between about 21° C. and about 25° C.). The hybrid bonding process continues with performing an anneal at a temperature ranging from about 150° C. to about 400° C. for a duration ranging from about 0.5 hours to about 3 hours. The anneal causes the metal of the capacitor contacts 179 (e.g., copper) and the metal of the second conductive features 156 (e.g., copper) to inter-diffuse with each other, forming the direct metal-to-metal bonding. The anneal may further form covalent bonds between the dielectric layer 178 and the second dielectric layer 154. In some embodiments, other bonding parameters and/or methods (e.g., solder bonding) may be used.

Conventional semiconductor devices may include capacitors within front-side interconnect structures, similar to the front-side interconnect structure 120. Forming the capacitor 177 over on the substrate 170 in the capacitor structure 180 and bonding the capacitor structure 180 to the backside interconnect structure 155 allows for larger capacitors to be used. Further, the backside interconnect structure 155 may have greater line widths than the front-side interconnect structure 120 (e.g., the first conductive features 152 and the second conductive features 156 may have greater line widths than the conductive features 122), which improves the connection between the capacitor structure 180 and the transistor structures 109 relative to capacitors formed in the front-side interconnect structure 120. A carrier substrate may typically be attached to the backside interconnect structure 155 and subsequently removed. The capacitor structure 180 may be used as a carrier substrate, but may not be removed, such that waste is reduced less additional process steps are required.

Figure 32:
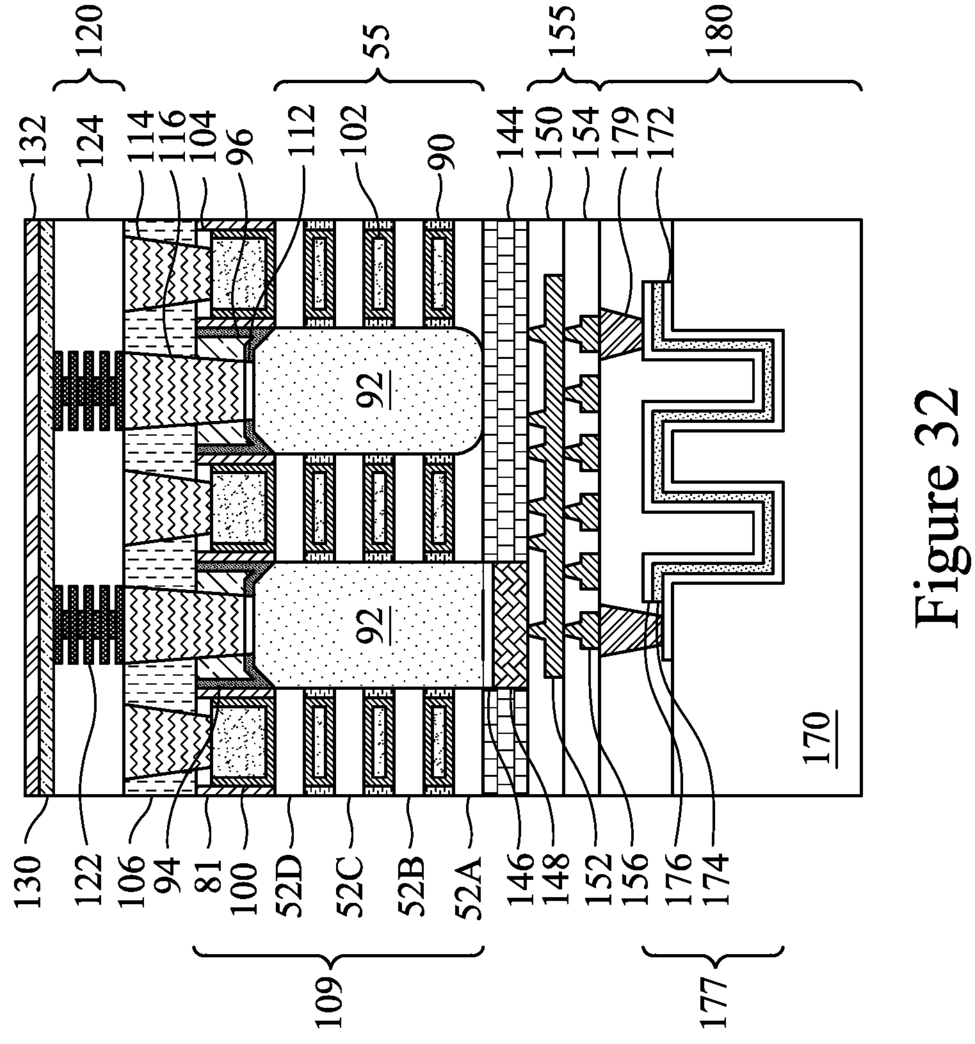

In FIG. 32, a carrier substrate de-bonding is performed to detach (or "de-bond") the carrier substrate 140 from the second dielectric layer 132 over the front-side interconnect structure 120. In some embodiments, the de-bonding includes projecting a light, such as a laser light or an ultraviolet (UV) light on the third dielectric layer 134 and/or the dielectric layer 142 so that the third dielectric layer 134 and/or the dielectric layer 142 decompose under the heat of the light and the carrier substrate 140 can be removed. Further in FIG. 32, after the carrier substrate 140 is removed, the device may be flipped such that a front-side of the transistor structures 109 faces upwards.

Figure 33:
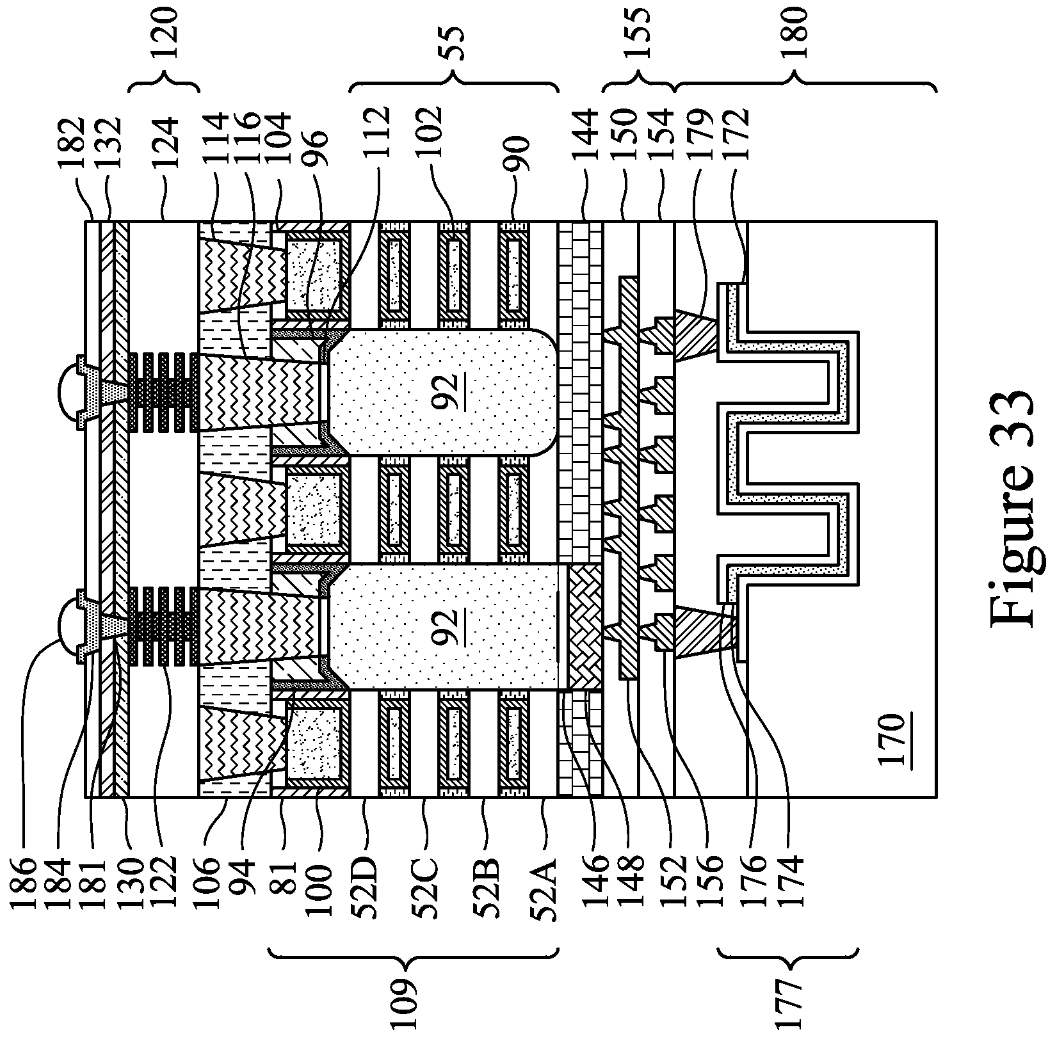

In FIG. 33, conductive vias 181 are formed in the first dielectric layer 130 and the second dielectric layer 132 and a passivation layer 182, UBMs 184, and external connectors 186 are formed over the second dielectric layer 132 and the conductive vias 181. The conductive vias 181 may be the same as or similar to the conductive features 122, described above with respect to FIGS. 21A through 21C. The conductive vias 181 may extend through the first dielectric layer 130 and the second dielectric layer 132 to provide vertical connections between the conductive features 122 and the UBMs 184. The first dielectric layer 130 and the second dielectric layer 132 may be formed through any acceptable process, such as, a damascene process, a dual damascene process, or the like. In some embodiments, the conductive vias 181 may be formed using a damascene process in which the first dielectric layer 130 and the second dielectric layer 132 are patterned utilizing a combination of photolithography and etching techniques to form trenches corresponding to the desired pattern of the conductive vias 181. An optional diffusion barrier and/or optional adhesion layer may be deposited and the trenches may then be filled with a conductive material. Suitable materials for the barrier layer include titanium, titanium nitride, titanium oxide, tantalum, tantalum nitride, titanium oxide, combinations thereof, or the like, and suitable materials for the conductive material include copper, silver, gold, tungsten, aluminum, combinations thereof, or the like. In an embodiment, the conductive vias 181 may be formed by depositing a seed layer of copper or a copper alloy, and filling the trenches by electroplating. A CMP process or the like may be used to remove excess conductive material from a surface of the second dielectric layer 132 and to planarize surfaces of the second dielectric layer 132 and the conductive vias 181 for subsequent processing.

The passivation layer 182 may then be formed over the second dielectric layer 132 and the conductive vias 181. The passivation layer 182 may comprise polymers such as PBO, polyimide, BCB, or the like. Alternatively, the passivation layer 182 may include non-organic dielectric materials such as silicon oxide, silicon nitride, silicon carbide, silicon oxynitride, or the like. The passivation layer 182 may be deposited by, for example, CVD, PVD, ALD, or the like.

The UBMs 184 are formed through the passivation layer 182 to the conductive vias 181 and the external connectors 186 are formed on the UBMs 184. The UBMs 184 may comprise one or more layers of copper, nickel, gold, or the like, which are formed by a plating process, or the like. The external connectors 186 (e.g., solder balls) are formed on the UBMs 184. The formation of the external connectors 186 may include placing solder balls on exposed portions of the UBMs 184 and reflowing the solder balls. In some embodiments, the formation of the external connectors 186 includes performing a plating step to form solder regions over the UBMs 184 and then reflowing the solder regions. The UBMs 184 and the external connectors 186 may be used to provide input/output connections to other electrical components, such as, other device dies, redistribution structures, printed circuit boards (PCBs), motherboards, or the like. The UBMs 184 and the external connectors 186 may also be referred to as backside input/output pads that may provide signal, supply voltage, and/or ground connections to the nano-FETs described above.

Embodiments may achieve advantages. For example, the capacitor 177 may be formed in the substrate 170, which is bonded to the backside interconnect structure 155, rather than being formed in the front-side interconnect structure 120. This allows for a larger capacitor with a greater capacitance density to be used, which improves device speed and performance. The substrate 170 may be a carrier substrate, which is typically bonded to a transistor structure and subsequently removed. Forming the capacitor 177 in the substrate 170 allows the capacitor 177 to be formed with minimal additional process steps, and reduces waste.

In accordance with an embodiment, a semiconductor device includes a first transistor structure; a front-side interconnect structure on a front-side of the first transistor structure, the front-side interconnect structure including a front-side conductive line; a backside interconnect structure on a backside of the first transistor structure, the backside interconnect structure including a backside conductive line, the backside conductive line having a line width greater than a line width of the front-side conductive line; and a first capacitor structure coupled to the backside interconnect structure. In an embodiment, the first capacitor structure is coupled to the backside interconnect structure by dielectric-to-dielectric and metal-to-metal bonds. In an embodiment, a first conductive contact of the backside interconnect structure is physically and electrically coupled to a second conductive contact of the first capacitor structure, the first conductive contact has a first width, and the second conductive contact has a second width greater than the first width. In an embodiment, the first capacitor structure includes a substrate and a capacitor over the substrate. In an embodiment, the capacitor extends below a top surface of the substrate. In an embodiment, the capacitor further includes a dielectric layer over the substrate and the capacitor; and a first conductive contact physically and electrically coupled to the capacitor, the first conductive contact extending below a top surface of the substrate. In an embodiment, the capacitor further includes a second conductive contact physically and electrically coupled to the capacitor, the second conductive contact extending below the top surface of the substrate.

In accordance with another embodiment, a device includes a gate structure over a semiconductor channel region; a first source/drain region adjacent the gate structure and the semiconductor channel region; a gate contact coupled to a surface of the gate structure facing a first direction; a first source/drain contact coupled to a surface of the first source/drain region facing a second direction opposite the first direction; a first interconnect structure coupled to the first source/drain contact opposite the first source/drain region in the second direction; and a capacitor structure coupled to the first interconnect structure opposite the first source/drain contact in the second direction, the capacitor structure being coupled to the first interconnect structure by dielectric-to-dielectric bonds and metal-to-metal bonds. In an embodiment, the device further includes a second interconnect structure coupled to the gate contact opposite the gate structure in the first direction; and an external connector coupled to the second interconnect structure, the capacitor structure including a capacitor over a substrate, the substrate being opposite the capacitor in the second direction. In an embodiment, the capacitor structure includes a capacitor extending along a planar surface of a substrate. In an embodiment, the capacitor structure includes a substrate including a first recess; a capacitor extending along a top surface of the substrate and into the first recess; and a dielectric layer over the substrate and filling the first recess. In an embodiment, the capacitor structure includes a first contact extending through the dielectric layer into the first recess to the capacitor. In an embodiment, the capacitor structure includes a substrate including a first recess; a capacitor extending along a surface of the first recess, a top surface of the substrate being free from the capacitor; and a dielectric layer over the substrate and filling the first recess. In an embodiment, a first contact of the first interconnect structure is coupled to a second contact of the capacitor structure by the metal-to-metal bonds, the first contact has a first width, the second contact has a second width, and a ratio of the second width to the first width is from 3 to 5.

In accordance with yet another embodiment, a method includes forming a first transistor on a first substrate; forming a front-side interconnect structure over the first transistor; thinning the first substrate; forming a backside interconnect structure over the first transistor opposite the front-side interconnect structure, the backside interconnect structure including a backside via electrically coupled to a first source/drain region of the first transistor; providing a capacitor structure; and forming hybrid bonds between the capacitor structure and the backside interconnect structure. In an embodiment, providing the capacitor structure includes providing a second substrate; forming a first recess in the second substrate; depositing three capacitor layers over the second substrate and in the first recess; trimming the three capacitor layers to remove the three capacitor layers from outside the first recess; depositing a dielectric layer over the three capacitor layers and the second substrate, the dielectric layer filling the first recess; and forming a capacitor contact extending through the dielectric layer to the capacitor structure. In an embodiment, providing the capacitor structure includes providing a second substrate; forming a first recess in the second substrate; depositing three capacitor layers over the second substrate and in the first recess; trimming the three capacitor layers, the three capacitor layers extending along a bottom surface and a sidewall of the first recess and along a top surface of the second substrate after the trimming; depositing a dielectric layer over the three capacitor layers and the second substrate, the dielectric layer filling the first recess; and forming a capacitor contact extending through the dielectric layer to the capacitor structure. In an embodiment, forming the capacitor contact includes etching the dielectric layer to form a second recess exposing a first surface of the three capacitor layers in the first recess; and forming the capacitor contact in the second recess. In an embodiment, the method further includes forming a second capacitor contact, forming the second capacitor contact including etching the dielectric layer to form a third recess exposing a second surface of the three capacitor layers outside the first recess; and forming the second capacitor contact in the third recess. In an embodiment, thinning the first substrate exposes a first epitaxial material over the first source/drain region opposite the front-side interconnect structure, the method further including replacing the first epitaxial material with the backside via.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:

a first transistor structure comprising a gate structure surrounding a first nanostructure in a first cross-sectional view, a portion of the gate structure being disposed between the first nanostructure and a second nanostructure in a second cross-sectional view that is perpendicular to the first cross-sectional view, and a source/drain region adjoining the first nanostructure and the second nanostructure;

a front-side interconnect structure on a front-side of the first transistor structure, the front-side interconnect structure comprising a front-side conductive line;

a backside interconnect structure on a backside of the first transistor structure, the backside interconnect structure comprising a backside conductive line, the backside conductive line having a line width greater than a line width of the front-side conductive line; and a first capacitor structure coupled to the backside interconnect structure, wherein the first capacitor structure is disposed on the backside of the first transistor structure, and wherein the backside of the first transistor structure and the portion of the gate structure of the first transistor structure are on opposing sides of the second nanostructure of the first transistor structure.

2. The semiconductor device of claim 1, wherein the first capacitor structure is coupled to the backside interconnect structure by dielectric-to-dielectric and metal-to-metal bonds.

3. The semiconductor device of claim 1, wherein a first conductive contact of the backside interconnect structure is physically and electrically coupled to a second conductive contact of the first capacitor structure, wherein the first conductive contact has a first width, and wherein the second conductive contact has a second width greater than the first width.

4. The semiconductor device of claim 1, wherein the first capacitor structure comprises a substrate and a capacitor over the substrate, wherein the second nanostructure is disposed between the gate structure and the substrate.

5. The semiconductor device of claim 4, wherein the capacitor extends below a top surface of the substrate.

6. The semiconductor device of claim 4, wherein the capacitor further comprises:

a dielectric layer over the substrate and the capacitor; and a first conductive contact physically and electrically coupled to the capacitor, the first conductive contact extending below a top surface of the substrate.

7. The semiconductor device of claim 6, wherein the capacitor further comprises a second conductive contact physically and electrically coupled to the capacitor, the second conductive contact extending below the top surface of the substrate.

8. A device comprising:

a gate structure along at least three sides of a semiconductor channel region in a first cross-sectional view;

a first source/drain region adjacent the gate structure and the semiconductor channel region in a second cross-sectional view that is perpendicular to the first cross-sectional view;

a gate contact coupled to a surface of the gate structure, the gate contact extending from the surface of the gate structure along a first direction away from the semiconductor channel region;

a first source/drain contact coupled to a surface of the first source/drain region, the first source/drain contact extending from the surface of the first source/drain region along a second direction away from the semiconductor channel region, the second direction being opposite the first direction;

a first interconnect structure coupled to the first source/drain contact opposite the first source/drain region in the second direction; and a capacitor structure coupled to the first interconnect structure opposite the first source/drain contact in the second direction, wherein the capacitor structure is coupled to the first interconnect structure by dielectric-to-dielectric bonds and metal-to-metal bonds.

9. The device of claim 8, further comprising:

a second interconnect structure coupled to the gate contact opposite the gate structure in the first direction; and an external connector coupled to the second interconnect structure, wherein the capacitor structure comprises a capacitor over a substrate, the substrate being opposite the capacitor in the second direction.

10. The device of claim 8, wherein the capacitor structure comprises a capacitor extending along a planar surface of a substrate.

11. The device of claim 8, wherein the capacitor structure comprises:

a substrate comprising a first recess;

a capacitor extending along a top surface of the substrate and into the first recess; and a dielectric layer over the substrate and filling the first recess.

12. The device of claim 11, wherein the capacitor structure comprises a first contact extending through the dielectric layer into the first recess to the capacitor.

13. The device of claim 8, wherein the capacitor structure comprises:

a substrate comprising a first recess;

a capacitor extending along a surface of the first recess, wherein a top surface of the substrate is free from the capacitor; and a dielectric layer over the substrate and filling the first recess.

14. The device of claim 8, wherein a first contact of the first interconnect structure is coupled to a second contact of the capacitor structure by the metal-to-metal bonds, wherein the first contact has a first width, wherein the second contact has a second width, and wherein a ratio of the second width to the first width is from 3 to 5.

15. A device comprising:

a device layer comprising a transistor, wherein the transistor comprises:

a stack of nanostructures;

a gate structure surrounding the stack of nanostructures in a first cross-sectional view; and a source/drain region adjoining the stack of nanostructures in a second cross-sectional view that is perpendicular to the first cross-sectional view;

a front-side interconnect structure on a front-side of the device layer, wherein the front-side interconnect structure includes a front-side source/drain contact electrically coupled to the source/drain region of the transistor, wherein the front-side source/drain contact extends along the gate structure of the transistor;

a backside interconnect structure on a backside of the device layer, the backside interconnect structure comprising:

a backside conductive line that is electrically coupled to the source/drain region of the transistor by a backside source/drain contact, wherein the front-side source/drain contact and the backside source/drain contact are on opposing sides of the source/drain region;

a first insulating layer; and a first bond pad in the first insulating layer;

a first capacitor structure bonded to the backside interconnect structure, the first capacitor structure comprising:

a capacitor;

a second insulating layer contacting the first insulating layer; and a second bond pad contacting the first bond pad.

16. The device of claim 15, wherein the second bond pad is wider than the first bond pad in a cross-sectional view.

17. The device of claim 15, wherein the second bond pad contacts the first insulating layer.

18. The device of claim 15, wherein the first capacitor structure further comprises a substrate, wherein the capacitor extends at least partially into the substrate.

19. The device of claim 18, wherein the capacitor further extends along a lateral surface of the substrate.

20. The device of claim 15, wherein the second bond pad extends continuously from the first insulating layer to an electrode of the capacitor, wherein the second bond pad continuously decreases in width from the first insulating layer to the electrode of the capacitor in a cross-sectional view.

* * * * *